United States Patent
Yoo et al.

(10) Patent No.: US 12,207,515 B2
(45) Date of Patent: Jan. 21, 2025

(54) DISPLAY APPARATUS AND MULTI-SCREEN DISPLAY APPARATUS INCLUDING THE SAME

(71) Applicant: LG Display Co., Ltd., Seoul (KR)

(72) Inventors: DongHee Yoo, Paju-si (KR); JongHyun Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 456 days.

(21) Appl. No.: 17/551,549

(22) Filed: Dec. 15, 2021

(65) Prior Publication Data
US 2022/0208951 A1 Jun. 30, 2022

(30) Foreign Application Priority Data
Dec. 31, 2020 (KR) .................. 10-2020-0189729

(51) Int. Cl.
*H10K 59/18* (2023.01)
*H10K 50/844* (2023.01)
*H10K 59/121* (2023.01)
*H10K 59/131* (2023.01)

(52) U.S. Cl.
CPC ........... *H10K 59/18* (2023.02); *H10K 50/844* (2023.02); *H10K 59/121* (2023.02); *H10K 59/131* (2023.02)

(58) Field of Classification Search
CPC ............... H10K 59/18; H10K 59/121; H10K 59/1315; H10K 59/12; H10K 50/844; G09F 9/3023
See application file for complete search history.

(56) References Cited

U.S. PATENT DOCUMENTS

| | | | |
|---|---|---|---|
| 11,774,761 B2* | 10/2023 | Choi ................... | H10K 50/805 345/8 |
| 2017/0288003 A1* | 10/2017 | Kim ...................... | H01L 27/124 |
| 2020/0091256 A1* | 3/2020 | Kim ...................... | H10K 77/111 |
| 2020/0403189 A1* | 12/2020 | Lee ....................... | H10K 71/80 |
| 2020/0411596 A1* | 12/2020 | Guo ...................... | G06F 3/0443 |
| 2021/0013286 A1* | 1/2021 | Yoon ..................... | H10K 59/131 |

(Continued)

FOREIGN PATENT DOCUMENTS

| | | |
|---|---|---|
| KR | 10-2016-0093179 A | 8/2016 |
| KR | 10-2017-0054654 A | 5/2017 |

(Continued)

*Primary Examiner* — Mamadou L Diallo
(74) *Attorney, Agent, or Firm* — Seed IP Law Group LLP

(57) ABSTRACT

A display apparatus may include a display area including a plurality of pixels arranged over a first substrate along a first direction and a second direction crossing the first direction, a circuit layer disposed in the display area and configured to include a plurality of pixel driving lines coupled to the plurality of pixels, a planarization layer covering the circuit layer, a light emitting device layer disposed over the planarization layer, a first encapsulation layer wholly or fully covering the light emitting device layer and directly contacting an uppermost surface of the circuit layer, a second encapsulation layer wholly or fully covering the first encapsulation layer and directly contacting the uppermost surface of the circuit layer, and a third encapsulation layer wholly or fully covering the second encapsulation layer and directly contacting the uppermost surface of the circuit layer.

20 Claims, 15 Drawing Sheets

(56) References Cited

U.S. PATENT DOCUMENTS

| | | | | |
|---|---|---|---|---|
| 2022/0069045 A1* | 3/2022 | Ebisuno | ............... | H10K 59/124 |
| 2022/0093712 A1* | 3/2022 | Kim | ................... | H10K 59/1213 |
| 2022/0158139 A1* | 5/2022 | Kim | .................... | H10K 50/844 |
| 2022/0173196 A1* | 6/2022 | Jeon | .................... | H01L 27/1218 |
| 2023/0269973 A1* | 8/2023 | Jeon | .................... | H10K 59/122 |
| | | | | 257/88 |
| 2023/0371302 A1* | 11/2023 | Choi | .................... | G06F 3/0412 |

FOREIGN PATENT DOCUMENTS

| | | |
|---|---|---|
| KR | 10-2018-0002099 A | 1/2018 |
| KR | 20180113960 A | 10/2018 |
| KR | 20200062635 A | 6/2020 |

* cited by examiner

DISPLAY APPARATUS AND MULTI-SCREEN DISPLAY APPARATUS INCLUDING THE SAME

CROSS-REFERENCE TO RELATED APPLICATIONS

This application claims the benefit of the Korean Patent Application No. 10-2020-0189729 filed on Dec. 31, 2020, which is hereby incorporated by reference as if fully set forth herein.

BACKGROUND

Technical Field

The present disclosure relates to a display apparatus and multi-screen display apparatus including the same.

Description of the Related Art

Recently, with the advancement of multimedia, the importance of display apparatuses is increasing. Therefore, display apparatuses such as liquid crystal display (LCD) apparatuses, organic light emitting display apparatuses, and light emitting diode display apparatuses are being commercialized.

Display apparatuses have good characteristics such as thinness, lightness, and low power consumption, and thus, are being widely used as a display screen for televisions (TVs), notebook computers, and monitors as well as portable electronic devices such as electronic notebooks, e-books, portable multimedia players (PMPs), navigation devices, ultra-mobile personal computers (PCs), mobile phones, smartphones, smartwatches, tablet personal computers (PCs), watch phones, and mobile communication terminals.

Display apparatuses may include a display panel which includes a plurality of pixels including a thin film transistor (TFT) coupled to a data line and a gate line, a data driving circuit for supplying a data voltage to the data line, and a gate driving circuit for supplying a scan signal to the gate line. The display panel may include a display area which includes the plurality of pixels for displaying an image and a bezel area which surrounds the display area.

A display apparatus of the related art may need a bezel (or a mechanism) for covering a bezel area disposed at a border (or a periphery portion) of a display panel, and due to this, a width of the bezel may increase.

Recently, multi-display apparatuses have been commercialized where a large screen is implemented by arranging a plurality of display apparatuses as a lattice type.

However, in a multi-display apparatus of the related art, a boundary portion such as a seam is formed between adjacent display apparatuses due to a bezel area or a bezel of each of a plurality of display apparatuses. The boundary portion causes a sense of disconnection (or discontinuity) of an image when one image is being displayed on a total screen of the multi-display apparatus, and due to this, the immersion of a viewer watching the image is reduced.

BRIEF SUMMARY

Accordingly, the present disclosure is directed to providing a display apparatus and a multi-screen display apparatus including the same that substantially obviate one or more problems due to limitations and disadvantages of the related art.

An aspect of the present disclosure is directed to providing a display apparatus and a multi-screen display apparatus including the same, which have a width of a zero bezel.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, a display apparatus comprise a display area including a plurality of pixels arranged over a first substrate along a first direction and a second direction crossing the first direction, a circuit layer disposed in the display area and configured to include a plurality of pixel driving lines coupled to the plurality of pixels, a planarization layer covering the circuit layer, a light emitting device layer disposed over the planarization layer, a first encapsulation layer wholly or fully covering the light emitting device layer and directly contacting an uppermost surface of the circuit layer, a second encapsulation layer wholly or fully covering the first encapsulation layer and directly contacting the uppermost surface of the circuit layer, and a third encapsulation layer wholly or fully covering the second encapsulation layer and directly contacting the uppermost surface of the circuit layer.

In another aspect of the present disclosure, a multi-screen display apparatus comprises a plurality of display devices disposed along at least one direction of a first direction and a second direction crossing the first direction, each of the plurality of display devices comprises a display apparatus, the display apparatus comprise a display area including a plurality of pixels arranged over a first substrate along the first direction and the second direction crossing the first direction, a circuit layer disposed in the display area and configured to include a plurality of pixel driving lines coupled to the plurality of pixels, a planarization layer covering the circuit layer, a light emitting device layer disposed over the planarization layer, a first encapsulation layer wholly covering the light emitting device layer and directly contacting an uppermost surface of the circuit layer, a second encapsulation layer wholly covering the first encapsulation layer and directly contacting the uppermost surface of the circuit layer, and a third encapsulation layer wholly covering the second encapsulation layer and directly contacting the uppermost surface of the circuit layer.

Some embodiments of the present disclosure may provide a display apparatus, having no bezel width or an air bezel structure, and a multi-screen display apparatus including the display apparatus.

According to some embodiments of the present disclosure, because the display apparatus includes a secondary pad electrically coupled to a first pad, a substantial length (or a size) of each of first pads may extend through the secondary pad, and thus, a contact area between the first pad and a routing line may increase in the air bezel structure, thereby preventing a contact defect between the first pad and the routing line.

Some embodiments of the present disclosure may provide a display apparatus and a multi-screen display apparatus including the same, which may display an image without a sense of discontinuity in displaying one image on a whole screen.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

DETAILED DESCRIPTION

Figure 1:
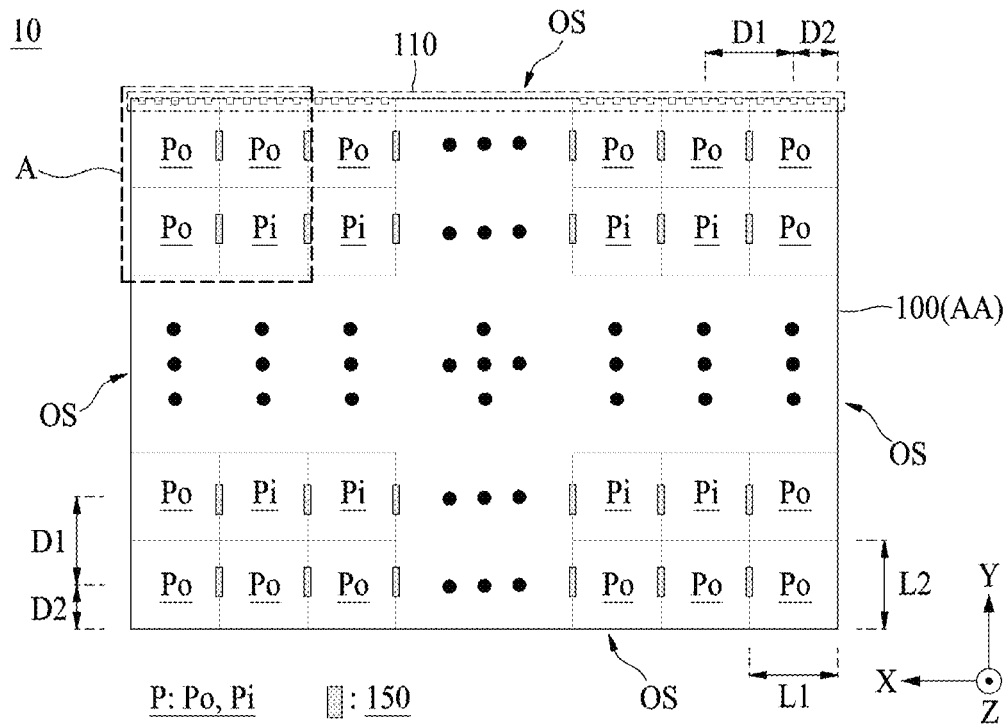
FIG. 1 is a plan view illustrating a display apparatus according to an embodiment of the present disclosure.

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the embodiments of the present disclosure are not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case which is not continuous may be included unless a more limiting term, such as "just," "immediate(ly)," or "direct(ly)" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "coupled to" another element or layer, it may be directly on or directly coupled to the other element or layer, or intervening elements or layers may be present. Also, it should be understood that when one element is disposed on or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

The term "surround" as used herein includes at least partially surrounding as well as entirely surrounding one or more of the associated elements. Similarly, the term "cover" as used herein includes at least partially covering as well as entirely covering one or more of the associated elements. The meaning in which the term "surround" is used herein may be further specified based on the associated drawings and embodiments. In the present disclosure, the terms "surround," "at least partially surround," "completely surround" or the like is used. In accordance with the definition of "surround" as set forth above, when only the term "surround" is used in an embodiment, it may mean either at least partially surrounding, overlaying or entirely surrounding one or more of the associated elements. The same applies for the term "cover."

Features of various embodiments of the present disclosure may be partially or overall coupled to or combined with each other, and may be variously inter-operated with each other and driven technically as those skilled in the art may sufficiently understand. The embodiments of the present disclosure may be carried out independently from each other, or may be carried out together with in co-dependent relationship.

Hereinafter, embodiments of the present disclosure will be described in detail with reference to the accompanying drawings. In adding reference numerals to elements of each of the drawings, although the same elements are illustrated in other drawings, like reference numerals may refer to like elements. Also, for convenience of description, a scale of each of elements illustrated in the accompanying drawings differs from a real scale, and thus, is not limited to a scale illustrated in the drawings.

FIG. 1 is a plan view illustrating a display apparatus according to an embodiment of the present disclosure.

Referring to FIG. 1, the display apparatus (or a display panel) 10 according to an embodiment of the present disclosure may include a first substrate 100 including a display area AA, a plurality of pixels P in the display area AA of the first substrate 100, and a first pad part 110.

The first substrate 100 may be referred to as a display substrate, a base substrate, or a pixel array substrate. The first substrate 100 may include a glass material or a plastic material. For example, the first substrate 100 may be a glass substrate, or may be a thin glass substrate or a plastic substrate, which is bendable or flexible.

The display area AA of the first substrate 100 may be an area which displays an image and may be referred to as an active portion, an active area, a display portion, or a display part. A size of the display area AA may be the same as or substantially the same as the first substrate 100 (or the display apparatus or the display panel). For example, a size of the display area AA may be the same as a total size of the first surface of the first substrate 100. Therefore, the display area AA may be implemented (or disposed) on the whole front surface of the first substrate 100, and thus, the first substrate 100 may not include an opaque non-display area which is provided along a periphery portion (or an edge portion) of the first surface to surround all of the display area AA. Accordingly, a whole front surface of the display apparatus may implement the display area AA.

An end portion (or an outermost portion) of the display area AA may overlap or may be substantially aligned with the outer surface OS of the first substrate 100. For example, with respect to a thickness direction Z of the display apparatus, a lateral surface (or an end line) of the display area AA may be substantially aligned with a vertical extension line vertically extending from the outer surface OS of the first substrate 100. The lateral surface of the display area AA may not be surrounded by a separate mechanism and may only be abutting ambient air. For example, all lateral surfaces of the display area AA may be provided in a structure which directly contacts air without being surrounded by a separate mechanism. Therefore, the outer surface OS of the first substrate 100 corresponding to the end portion of the display area AA may be surrounded by only air (or abutting ambient air), and thus, the display apparatus according to an embodiment of the present disclosure may have an air-bezel structure or a non-bezel structure (or no bezel) where the end portion (or lateral surface) of the display area AA is surrounded by air. There is not an opaque non-display area at the outermost edge of the substrate; the display area extends complete to the substrate edge.

The plurality of pixels P may be arranged (or disposed) at the display area AA of the first substrate 100 to have the first interval D1 along a first direction X and a second direction Y. For example, the first direction X may traverse (or intersect or cross) to the second direction Y. The first direction X may be a widthwise direction, a horizontal direction, or a first length direction (for example, a widthwise length direction) of the first substrate 100 or the display apparatus. The second direction Y may be a lengthwise direction, a vertical direction, or a second length direction (for example, a lengthwise length direction) of the first substrate 100 or the display apparatus.

Each of the plurality of pixels P may be implemented on a plurality of pixel areas defined on the display area AA of the first substrate 100. Each of the plurality of pixels P may have a first length L1 parallel to the first direction X and a second length L2 parallel to the second direction Y. The first length L1 may be the same as the second length L2 or the first interval D1. The first length L1 and the second length L2 may be the same as the first interval D1. Therefore, the plurality of pixels (or pixel areas) P may all have the same size. For example, the first length L1 can be referred to as a first width, a widthwise length, or a widthwise width. The second length L2 can be referred to as a second width, a lengthwise length, or a lengthwise width.

Two pixels P adjacent to each other along the first direction X and the second direction Y may have the same first interval D1 within an error range of a manufacturing process. The first interval D1 may be a pitch (or a pixel pitch) between two adjacent pixels P. For example, the first length L1 or the second length L2 of the pixel P may be referred to as the pixel pitch. For example, the first interval (or the pixel pitch) D1 may be a distance (or a length) between center portions of two adjacent pixels P. For example, the first interval (or the pixel pitch) D1 may be a shortest distance (or a shortest length) between center portions of two adjacent pixels P.

Each of the plurality of pixels P according to an embodiment may be include a circuit layer including a pixel circuit implemented in the pixel area of the first substrate 100, and a light emitting device layer disposed at the circuit layer and coupled to the pixel circuit. The pixel circuit outputs a data current corresponding to the data signal in response to the data signal and the scan signal supplied from the pixel driving lines disposed in the pixel area. The light emitting device layer may include a light emitting layer that emits light by the data current supplied from the pixel circuit. The pixel driving lines, the pixel circuit, and the light emitting device layer will be described below.

The plurality of pixels P may be divided (or classified) into outermost pixels Po and internal pixels (or inner pixels) Pi.

The outermost pixels Po may be pixels disposed closest to the outer surface OS of the first substrate 100 among the plurality of pixels P. Each of the pixels Po is therefore considered an outermost pixel since within their respective row and/or column of pixels, they are the outmost of the pixels.

A second interval D2 between a center portion of each of the outermost pixels Po and the outer surface OS of the first substrate 100 may be half or less of the first interval D1. For example, the second interval D2 may be a distance (or a length) between a center portion of the outermost pixel area PAo and the outer surface OS of the first substrate 100. For example, the second interval D2 may be a shortest distance (or a shortest length) between a center portion of the outermost pixel area PAo and the outer surface OS of the first substrate 100.

When the second interval D2 is greater than half of the first interval D1, the first substrate 100 may have a greater size than the display area AA by a difference area between half of the first interval D1 and the second interval D2, and thus, an area between the end of the outermost pixel Po and the outer surface OS of the first substrate 100 may be configured as a non-display area surrounding all of the display area AA. For example, when the second interval D2 is greater than half of the first interval D1, the first substrate 100 may necessarily include a bezel area based on a non-display area surrounding all of the display area AA. On the other hand, when the second interval D2 is half or less of the first interval D1, the end of each of the outermost pixels Po may be aligned (or disposed) with the outer surface OS of the first substrate 100, or the end portion of the display area AA may be aligned (or disposed) with the outer surface OS of the first substrate 100, and thus, the display area AA may be implemented (or disposed) on the whole front surface of the first substrate 100.

The internal pixels Pi may be pixels other than the outermost pixels Po among the plurality of pixels P, or may be pixels surrounding by the outermost pixels Po among the plurality of pixels P. The internal pixels (or second pixels) Pi may be implemented to have a configuration or a structure, which differs from the outermost pixels (or first pixels) Po.

The first pad part 110 may be a first pad part or a front pad part. The first pad part 110 may include a plurality of pads to receive a data signal, a gate control signal, a pixel driving power, a reference voltage, a pixel common voltage, or the like from the driving circuit part.

The first pad part 110 may be included within the outmost pixels Po disposed at a first periphery portion of the first surface of the first substrate 100 parallel to the first direction X. That is, the outermost pixels Po disposed at the first periphery portion of the first substrate 100 may include at least one of the plurality of pads. Therefore, the plurality of pads may be disposed or included within the display area AA, and thus, a non-display area (or a bezel area) based on the first pad part 110 may not be formed or may not be on the first substrate 100. Therefore, the outermost pixel (or first pixels) Po may include the first pad part 110, and thus, may be implemented to have a configuration or a structure, which differs from the internal pixel (or second pixels) Pi including no the first pad part 110.

For example, when the first pad part 110 is not provided within the outermost pixels Po and is disposed between the outermost pixels Po and the outer surface OS of the first substrate 100, the first substrate 100 may include a non-display area (or a non-display portion) corresponding to an area where the first pad part 110 is provided, and due to the non-display area, the second interval D2 between the outermost pixels Po and the outer surface OS of the first substrate 100 may be greater than half of the first interval D1, all of the first substrate 100 may not be implemented as the display area AA, and a separate bezel (or a separate structure) for covering the non-display area may be needed. On the other hand, the first pad part 110 according to an embodiment of the present disclosure may be implemented to be included within the outermost pixels Po, and thus, a non-display area (or a bezel area) based on the first pad part 110 may not be formed or may not be between the outermost pixels Po and the outer surface OS of the first substrate 100. Therefore, the display apparatus according to an embodiment of the present disclosure may have an air-bezel structure where a whole first substrate 100 including the first pad part 110 is implemented as the display area AA, and thus, all outer surfaces (or outer surfaces of the display panel) OS of the first substrate 100 aligned with an end of the display area AA are surrounded by air.

The first pad part 110 according to an embodiment may include first pixel driving power pads, The first pad part 110 according to an embodiment may include first pixel driving power pads, first data pads, first reference voltage pads, first gate pads, and first pixel common voltage pads, but embodiments of the present disclosure are not limited thereto.

The display apparatus according to an embodiment may further include a gate driving circuit 150 which is disposed in the display area AA.

The gate driving circuit 150 may be disposed in the display area AA to supply a scan signal (or a gate signal) to the pixels P disposed on the first substrate 100. The gate driving circuit 150 may simultaneously supply the scan signal to pixels P disposed in a horizontal line parallel to the first direction X. For example, the gate driving circuit 150 may supply at least one scan signal to pixels P disposed in one horizontal line through at least one gate line GL.

The gate driving circuit 150 according to an embodiment may be implemented with a shift register including a plurality of stage circuits. That is, the display apparatus according to an embodiment of the present disclosure may include a shift register which is disposed at the display area AA of the first substrate 100 to supply the scan signal to the pixel P.

Each of the plurality of stages circuits may include a plurality of branch circuits which are arranged spaced apart from one another in each horizontal line of the first substrate 100 in a first direction X. Each of the plurality of branch circuits may include at least one thin film transistor (TFT) (or branch TFT) and may be disposed between two adjacent pixels of one or more pixels P (or a pixel area) in one horizontal line in the first direction X. Each of the plurality of stage circuit units may generate a scan signal through driving of the plurality of branch circuits based on a gate control signal supplied through gate control lines disposed spaced apart from one another between a plurality of pixels P in the display area AA and may supply the scan signal to pixels P arranged in a corresponding horizontal line.

Figure 2A:
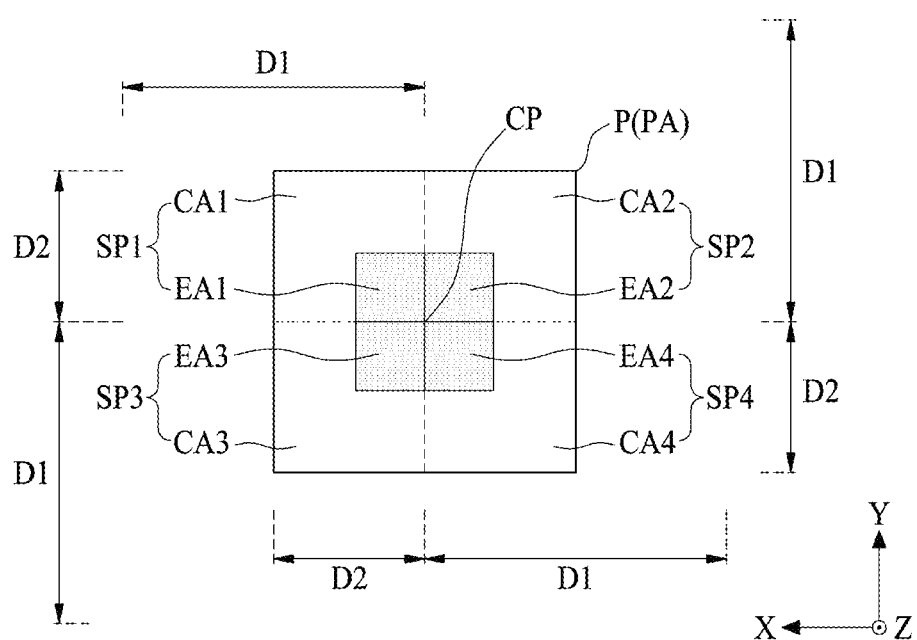
FIG. 2A is a diagram illustrating one pixel according to an embodiment of the present disclosure illustrated in FIG. 1.
Figure 2B:
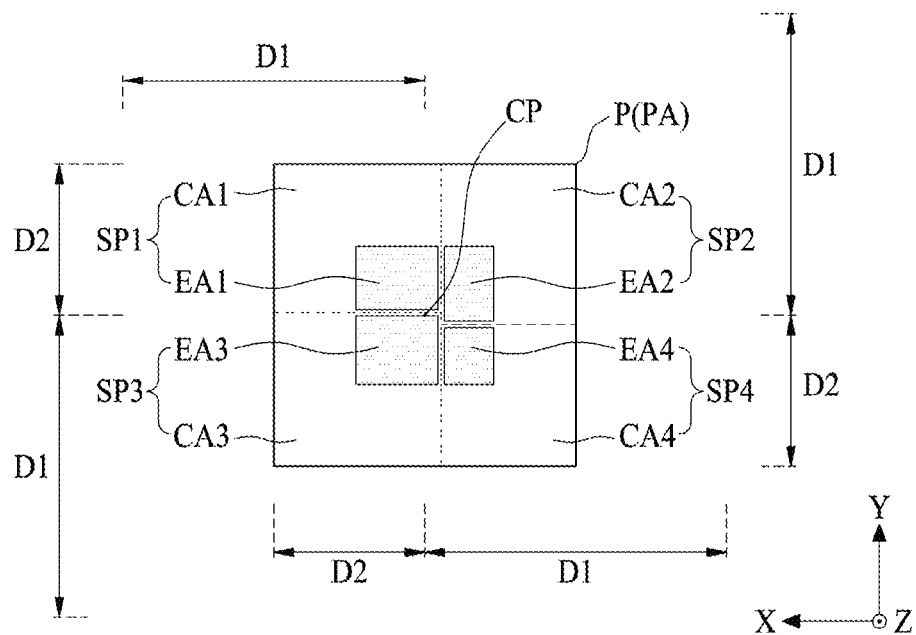
FIG. 2B is a diagram illustrating one pixel according to another embodiment of the present disclosure illustrated in FIG. 1.
Figure 2C:
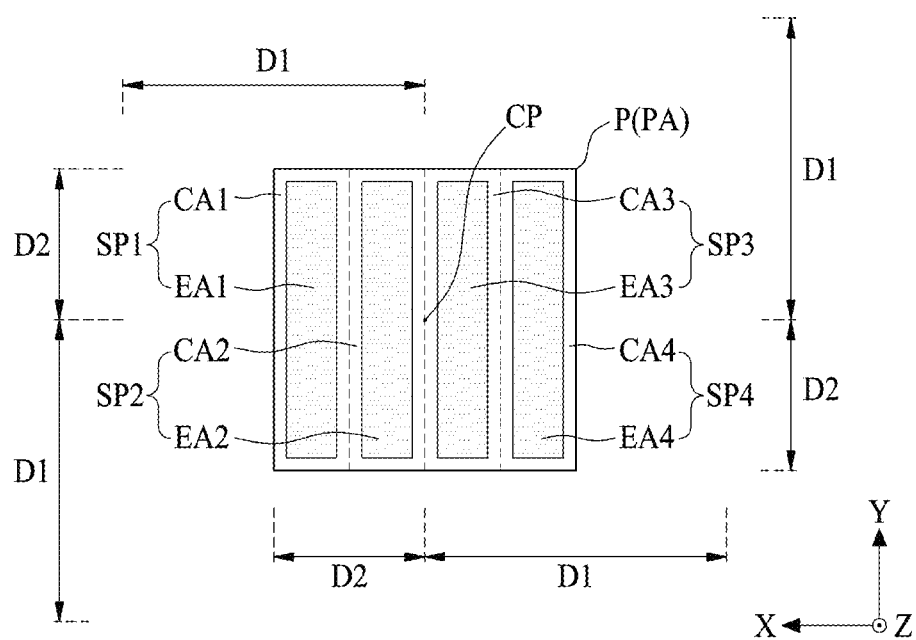
FIG. 2C is a diagram illustrating one pixel according to another embodiment of the present disclosure illustrated in FIG. 1.

FIG. 2A is a diagram illustrating one pixel according to an embodiment of the present disclosure illustrated in FIG. 1, FIG. 2B is a diagram illustrating one pixel according to another embodiment of the present disclosure illustrated in FIG. 1, and FIG. 2C is a diagram illustrating one pixel according to another embodiment of the present disclosure illustrated in FIG. 1.

Referring to FIGS. 1 and 2A, one pixel (or a unit pixel) P according to an embodiment of the present disclosure may include first to fourth subpixels SP1 to SP4.

The first subpixel SP1 may be disposed in a first subpixel area of the pixel area PA, the second subpixel SP2 may be disposed in a second subpixel area of the pixel area PA, the third subpixel SP3 may be disposed in a third subpixel area of the pixel area PA, and the fourth subpixel SP4 may be disposed in a fourth subpixel area of the pixel area PA.

The first to fourth subpixels SP1 to SP4 according to an embodiment may be disposed in a 2×2 form or a quad structure. The first to fourth subpixels SP1 to SP4 may each include a plurality of emission areas EA1 to EA4 and a plurality of circuit areas CA1 to CA4. For example, the emission areas EA1 to EA4 may be referred to as an opening area, an opening portion, or an emission portion.

The emission areas EA1 to EA4 of each of the first to fourth subpixels SP1 to SP4 may have a uniform quad structure to have a square shape having the same size (or same area). The size can be considered in one embodiment an area that is defined in terms of the length and the width of an structure, such as the display area or the substrate. According to an embodiment, each of the emission areas EA1 to EA4 having a uniform quad structure may be disposed close to a center portion CP of the pixel P within a corresponding subpixel area to have a size which is less than each of four equal division regions of the pixel P or may be disposed to be concentrated at the center portion CP of the pixel P. According to another embodiment, each of the emission areas EA1 to EA4 having a uniform quad structure may be disposed at the center portion CP of the corresponding subpixel area to have a size which is less than each of four equal division regions of the pixel P.

Referring to FIGS. 1 and 2B, each of the first to fourth subpixels SP1 to SP4 according to another embodiment may have a non-uniform quad structure having different sizes. For example, each of the emission areas EA1 to EA4 of each of the first to fourth subpixels SP1 to SP4 may have a non-uniform quad structure having different sizes.

A size of each of the first to fourth subpixels SP1 to SP4 having a non-uniform quad structure may be set based on a resolution, emission efficiency, or image quality. According to another embodiment, when the emission areas EA1 to EA4 have a non-uniform quad structure, among the emission areas EA1 to EA4 of the first to fourth subpixels SP1 to SP4, the emission area EA4 of the fourth subpixel SP4 may have a smallest size, and the emission area EA3 of the third subpixel SP3 may have a largest size. For example, each of the emission areas EA1 to EA4 of each of the first to fourth subpixels SP1 to SP4 having a non-uniform quad structure may be disposed to be concentrated around (or near) the center portion CP of the pixel P.

Referring to FIGS. 1 and 2C, each of the first to fourth subpixels SP1 to SP4 according to another embodiment may have a 1×4 form or a uniform stripe structure. For example, the emission areas EA1 to EA4 of the first to fourth subpixels SP1 to SP4 may have a 1×4 form or a uniform stripe structure.

The emission areas EA1 to EA4 of the first to fourth subpixels SP1 to SP4 having the uniform stripe structure may each have a rectangular shape which includes a short side parallel to the first direction X and a long side parallel to the second direction Y.

According to an embodiment, each of the emission areas EA1 to EA4 having the uniform stripe structure may be disposed close to a center portion CP of the pixel P within a corresponding subpixel area to have a size which is less than each of four equal division regions of the pixel P or may be disposed to be concentrated at the center portion of the pixel P.

According to another embodiment, each of the emission areas EA1 to EA4 having the uniform stripe structure may be disposed at center portion CP of the corresponding subpixel area to have a size which is less than each of four equal division regions of the pixel P.

According to another embodiment, each of the emission areas EA1 to EA4 having the uniform stripe structure may be disposed at the whole corresponding subpixel area to have the same size as each of four equal division regions of the pixel P.

Alternatively, each of the emission areas EA1 to EA4 of each of the first to fourth subpixels SP1 to SP4 may have a non-uniform stripe structure having different sizes. According to an embodiment, when the emission areas EA1 to EA4 have a non-uniform stripe structure, among the emission areas EA1 to EA4 of the first to fourth subpixels SP1 to SP4, the emission area EA4 of the fourth subpixel SP4 may have a smallest size, and the emission area EA3 of the third subpixel SP3 may have a largest size, but embodiments of the present disclosure are not limited thereto.

Referring to FIGS. 2A and 2B, the circuit areas CA1 to CA4 of each of the first to fourth subpixels SP1 to SP4 may be disposed around (or near) a corresponding emission area of the emission areas EA1 to EA4. Each of the circuit areas CA1 to CA4 may include a pixel circuit and pixel driving lines for emitting a corresponding subpixel of the first to fourth subpixels SP1 to SP4. For example, the circuit areas CA1 to CA4 may be referred to as a non-emission area, a non-opening area, a non-emission portion, a non-opening portion, or a periphery portion.

Alternatively, in order to increase an aperture ratio of the subpixels SP1 to SP4 corresponding to sizes of the emission areas EA1 to EA4 or decrease the pixel pitch D1 as a resolution of the pixel P is higher, the emission areas EA1 to EA4 of the first to fourth subpixels SP1 to SP4 may extend to the circuit areas CA1 to CA4 to overlap some or all of the circuit areas CA1 to CA4. For example, since the emission areas EA1 to EA4 of the first to fourth subpixels SP1 to SP4 have a top emission structure, each of the emission areas EA1 to EA4 may be arranged to overlap the corresponding circuit areas the circuit areas CA1 to CA4. For example, each of the circuit areas CA1 to CA4 of the first to fourth subpixels SP1 to SP4 may be disposed under (or below) the corresponding emission areas EA1 to EA4. In this case, each of the emission areas EA1 to EA4 may have a size which is equal to or greater than the corresponding circuit areas CA1 to CA4.

In FIGS. 2A to 2C, the first subpixel SP1 may be implemented to emit light of a first color, the second subpixel SP2 may be implemented to emit light of a second color, the third subpixel SP3 may be implemented to emit light of a third color, and the fourth subpixel SP4 may be implemented to emit light of a fourth color. For example, each of the first to fourth colors may be different. As an embodiment, the first color may be red, the second color may be blue, the third color may be white, and the fourth color may be green. As another embodiment, some of the first to fourth colors may be the same. For example, the first color may be red, the second color may be first green, the third color may be second green, and the fourth color may be blue.

Optionally, a white subpixel implemented to emit white light of the first to fourth subpixels SP1 to SP4 having a uniform stripe structure or a non-uniform stripe structure may be omitted.

Figure 3:
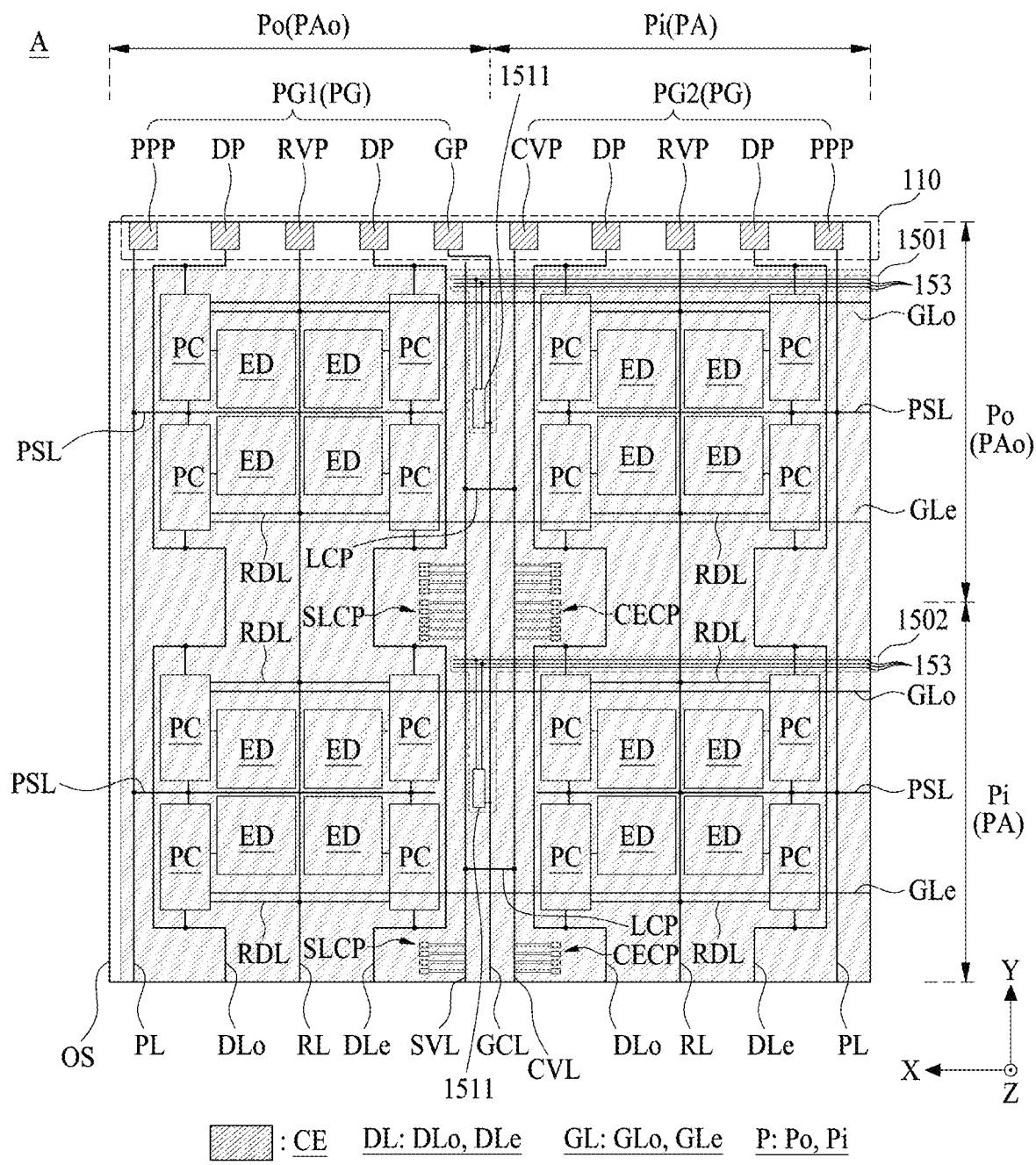
FIG. 3 is an enlarged view of a region 'A' illustrated in FIG. 1.
Figure 4:
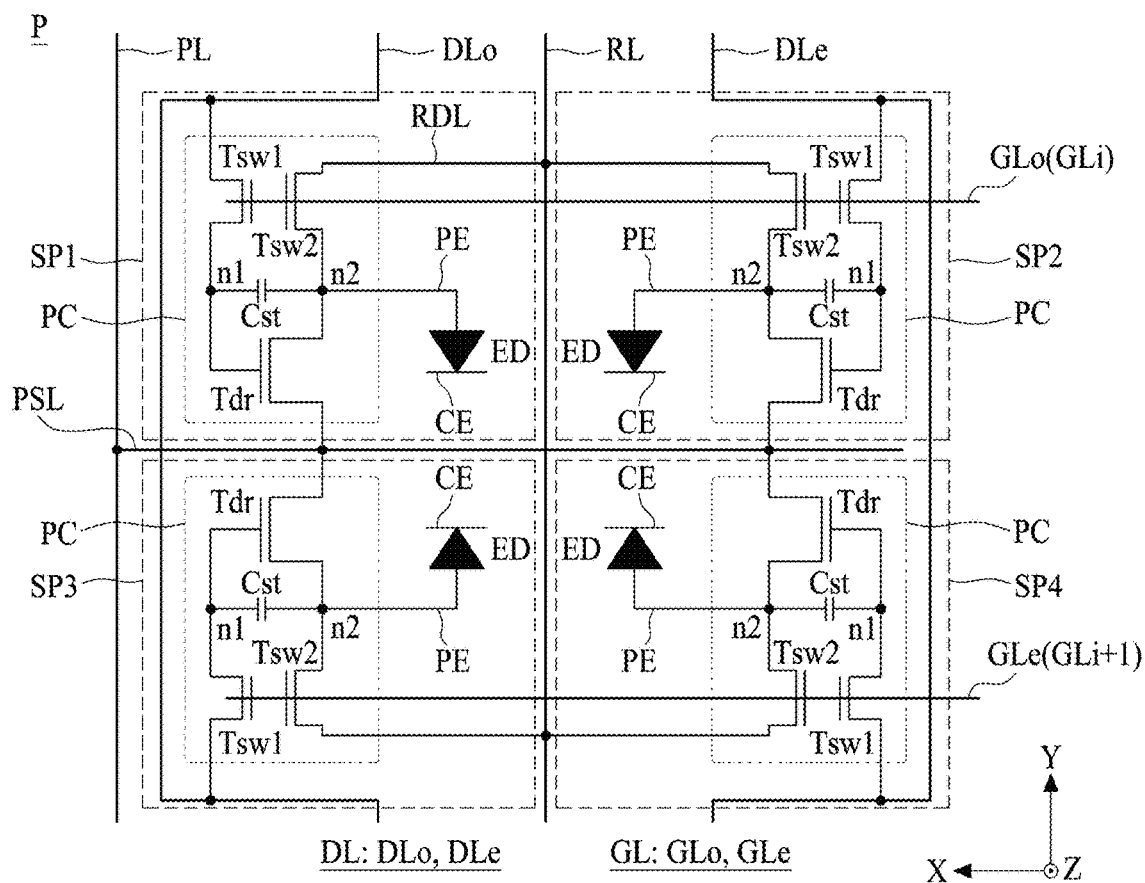
FIG. 4 is an equivalent circuit diagram illustrating one subpixel illustrated in FIGS. 1 and 3.

FIG. 3 is an enlarged view of a region 'A' illustrated in FIG. 1, and FIG. 4 is an equivalent circuit diagram illustrating one subpixel illustrated in FIGS. 1 and 3.

Referring to FIGS. 1, 3, and 4, a first substrate 100 according to an embodiment of the present disclosure may include pixel driving lines DL, GL, PL, CVL, RL, and GCL, a plurality of pixels P, a common electrode CE, a plurality of common electrode connection portions CECP, and a first pad part 110.

The pixel driving lines DL, GL, PL, CVL, RL, and GCL may include a plurality of data lines DL, a plurality of gate lines GL, a plurality of pixel driving power lines PL, a plurality of pixel common voltage lines CVL, a plurality of reference voltage lines RL, and gate control lines GCL.

The plurality of data lines DL may extend long in a second direction Y and may be disposed spaced apart from one another by a predetermined interval in a display area AA of the first substrate 100 along the first direction X. For example, in the plurality of data lines DL, an odd-numbered data line DLo may be disposed at a first periphery portion of each of a plurality of pixel areas PA arranged at the first substrate 100 along the second direction Y, and an even-numbered data line DLe may be disposed at a second periphery portion of each of the plurality of pixel areas PA arranged at the first substrate 100 along the second direction Y, but embodiments of the present disclosure are not limited thereto.

The plurality of gate lines GL may extend long in the first direction X and may be disposed spaced apart from one another by a predetermined interval in the display area AA of the first substrate 100 along the second direction Y. For example, an odd-numbered gate line GLo of the plurality of gate lines GL may be disposed at a third periphery portion of each of the plurality of pixel areas PA arranged on the first substrate 100 along the first direction X. An even-numbered gate line GLe of the plurality of gate lines GL may be disposed at a fourth periphery portion of each of the plurality of pixel areas PA arranged at the first substrate 100 along the first direction X, but embodiments of the present disclosure are not limited thereto.

The plurality of pixel driving power lines PL may extend long in the second direction Y and may be disposed spaced apart from one another by a predetermined interval in the display area AA of the first substrate 100 along the first direction X. For example, in the plurality of pixel driving power lines PL, an odd-numbered pixel driving power line PL may be disposed at a first periphery portion of an odd-numbered pixel area PA with respect to the first direction X, and an even-numbered pixel driving power line PL may be disposed at a second periphery portion of an even-numbered pixel area PA with respect to the first direction X, but embodiments of the present disclosure are not limited thereto.

Two adjacent pixel driving power lines PL of the plurality of pixel driving power lines PL may be coupled to a plurality of power sharing lines PSL disposed in each of pixel areas PA arranged in the second direction Y. For example, the plurality of pixel driving power lines PL may be electrically coupled to one another by the plurality of power sharing lines PSL, and thus, may have a ladder structure or a mesh structure. The plurality of pixel driving power lines PL may have a ladder structure or a mesh structure, and thus, the voltage drop (IR drop) of the pixel driving power caused by a line resistance of each of the plurality of pixel driving power lines PL may be prevented or minimized. Accordingly, the display apparatus according to an embodiment of the present disclosure may prevent or minimize the degradation in image quality caused by a deviation of the pixel driving power supplied to each of the pixels P arranged at the display area AA.

Each of the plurality of power sharing lines PSL may branch from an adjacent pixel driving power line PL in parallel with the first direction X and may be disposed in a middle region of each pixel area PA, but embodiments of the present disclosure are not limited thereto.

The plurality of pixel common voltage lines CVL may extend long in the second direction Y and may be disposed spaced apart from one another by a predetermined interval in the display area AA of the first substrate 100 along the first direction X. For example, each of the plurality of pixel common voltage lines CVL may be disposed at a first periphery portion of an even-numbered pixel area PA with respect to the first direction X.

The plurality of reference voltage lines RL may extend long in the second direction Y and may be disposed spaced apart from one another by a predetermined interval in the display area AA of the first substrate 100 in the first direction X. Each of the plurality of reference voltage lines RL may be disposed in a center region of each of the pixel areas PA arranged in the second direction Y.

Each of the plurality of reference voltage lines RL may be shared by two adjacent subpixels ((SP1, SP2) (SP3, SP4)) in the first direction X in each pixel area PA. To this end, each of the plurality of reference voltage lines RL may include a reference branch line RDL. The reference branch line RDL may branch (or protrude) to the two adjacent subpixels ((SP1, SP2) (SP3, SP4)) in the first direction X in each pixel area PA and may be electrically coupled to the two adjacent subpixels ((SP1, SP2) (SP3, SP4)).

Each of the plurality of gate control lines GCL may extend long in the second direction Y and may be disposed spaced apart from one another by a predetermined interval in the display area AA of the first substrate 100 in the first direction X. For example, each of the plurality of gate control lines GCL may be disposed at between the plurality of pixel areas PA or a boundary region between two adjacent pixel areas PA with respect to the first direction X.

Each of the plurality of pixels P may include at least three subpixels. For example, each of the plurality of pixels P may include first to fourth subpixels SP1 to SP4.

Each of the first to fourth subpixels SP1 to SP4 may include a pixel circuit PC and a light emitting device layer.

The pixel circuit PC according to an embodiment may be disposed in a circuit area of the pixel area PA and may be coupled to a gate line GLo or GLe adjacent thereto, a data line DLo or DLe adjacent thereto, and the pixel driving power line PL. For example, a pixel circuit PC disposed in a first subpixel SP1 may be coupled to an odd-numbered data line DLo and an odd-numbered gate line GLo, a pixel circuit PC disposed in a second subpixel SP2 may be coupled to an even-numbered data line DLe and an odd-numbered gate line GLo, a pixel circuit PC disposed in a third subpixel SP3 may be coupled to an odd-numbered data line DLo and an even-numbered gate line GLe, and a pixel circuit PC disposed in a fourth subpixel SP4 may be coupled to an even-numbered data line DLe and an even-numbered gate line GLe.

The pixel circuit PC of each of the first to fourth subpixels SP1 to SP4 may sample a data signal supplied from a corresponding data line DLo or DLe in response to a scan signal supplied from a corresponding gate line GLo or GLe and may control a current flowing from the pixel driving power line PL to the light emitting device layer based on a sampled data signal.

The pixel circuit PC according to an embodiment may include a first switching thin film transistor Tsw1, a second switching thin film transistor Tsw2, a driving thin film transistor Tdr, and a storage capacitor Cst, but embodiments of the present disclosure are not limited thereto. In the following description, a thin film transistor may be referred to as a TFT.

The first switching TFT Tsw1 may include a gate electrode coupled to a corresponding gate line GL (GLo or GLe) a first source/drain electrode coupled to a corresponding data line DL (DLo or DLe), and a second source/drain electrode coupled to a gate node n1 of the driving TFT Tdr. The first switching TFT Tsw1 may be turned on by a scan signal supplied through corresponding gate line GL (GLo or GLe) and may transfer a data signal, supplied through corresponding data line DL (DLo or DLe), to the gate electrode n1 of the driving TFT Tdr.

The second switching TFT Tsw2 may include a gate electrode coupled to a corresponding gate line GL (GLo or GLe) a first source/drain electrode coupled to a source node n2 of the driving TFT Tdr, and a second source/drain electrode coupled to a corresponding reference voltage line RL. The second switching TFT Tsw2 may be turned on by a scan signal supplied through the corresponding gate line GL (GLo or GLe) and may transfer a reference voltage, supplied through the corresponding reference voltage line RL, to the source node n2 of the driving TFT Tdr. For example, the second switching TFT Tsw2 may be turned on simultaneously with the first switching TFT Tsw1.

The storage capacitor Cst may be formed between the gate node n1 and the source node n2 of the driving TFT Tdr. The storage capacitor Cst according to an embodiment may include a first capacitor electrode coupled to the gate node n1 of the driving TFT Tdr, a second capacitor electrode coupled to the source node n2 of the driving TFT Tdr, and a dielectric layer formed in an overlap region between the first capacitor electrode and the second capacitor electrode. The storage capacitor Cst may be charged with a difference voltage between the gate node n1 and the source node n2 of the driving TFT Tdr, and then, may turn on or off the driving TFT Tdr based on a charged voltage thereof.

The driving TFT Tdr may include a gate electrode (or the gate node n1) coupled to the second source/drain electrode of the first switching TFT Tsw1 and the first capacitor electrode of the storage capacitor Cst in common, a first source/drain electrode (or the source node n2) coupled to the first source/drain electrode of the second switching TFT Tsw2, the second capacitor electrode of the storage capacitor Cst, and a pixel electrode PE of the light emitting device layer in common, and a second source/drain electrode (or a drain node) coupled to a corresponding pixel driving power line PL. The driving TFT Tdr may be turned on based on a voltage of the storage capacitor Cst and may control the amount of current flowing from the pixel driving power line PL to the light emitting device layer.

The pixel circuit PC of each of the first to fourth subpixels SP1 to SP4 according to another embodiment of the present disclosure may be implemented as a pixel driving chip through a semiconductor manufacturing process, disposed in a circuit area CA of a corresponding pixel area PA, and coupled to a corresponding gate line GL (GLo or GLe), a corresponding data line DL (DLo or DLe), and a corresponding pixel driving power line PL. For example, the pixel driving chip may be a minimum-unit microchip or one chipset and may be a semiconductor packaging device which includes two or more transistors and one or more capacitors and has a fine size. Such a pixel driving chip may sample a data signal supplied from the corresponding data line DL (DLo or DLe) in response to a scan signal supplied from the corresponding gate line GL (GLo or GLe) and may control a current flowing from the corresponding pixel driving power line PL to the light emitting device layer based on a sampled data signal.

The light emitting device layer may be disposed in an emission area EA of the pixel area PA and electrically coupled to the pixel circuit PC.

The light emitting device layer according to an embodiment of the present disclosure may include a pixel electrode PE electrically coupled to the pixel circuit PC, a common electrode CE electrically coupled to the pixel common voltage line CVL, and a self-emitting device ED interposed between the pixel electrode PE and the common electrode CE.

Each of the plurality of common electrode connection portions CECP may be disposed between the plurality of pixels P respectively overlapping the plurality of pixel common voltage lines CVL and may electrically couple the common electrode CE to each of the plurality of pixel common voltage lines CVL. With respect to the second direction Y, each of the plurality of common electrode connection portions CECP according to an embodiment of the present disclosure may be electrically coupled to a corresponding pixel common voltage line CVL among the plurality of pixel common voltage lines CVL at a portion between the plurality of pixels P or at a boundary portion between the plurality of pixels P and may be electrically coupled to a portion of the common electrode CE, and thus, may electrically couple the common electrode CE to each of the plurality of pixel common voltage lines CVL.

Each of the plurality of common electrode connection portions CECP may be disposed between at least two pixels among the plurality of pixels P to electrically couple the common electrode CE to each of the plurality of pixel common voltage lines CVL, and thus, may prevent or minimize the voltage drop (IR drop) of the pixel common voltage caused by a surface resistance of the common electrode CE. Accordingly, the display apparatus according to an embodiment of the present disclosure may reduce, prevent or minimize the degradation in image quality caused by a deviation of the pixel common voltage supplied to each of the pixels P arranged in the display area AA.

According to an embodiment of the present disclosure, each of the plurality of common electrode connection portions CECP may be formed along with a pixel electrode PE having at least two-layer structure so as to be electrically coupled to each of the plurality of pixel common voltage lines CVL. Each of the plurality of common electrode connection portions CECP may be coupled to the common electrode CE through a side contact structure having a "("-shaped cross-sectional structure or a "<"-shaped cross-sectional structure. For example, when each of the plurality of common electrode connection portions CECP is formed of first and second metal layers, each of the plurality of common electrode connection portions CECP may include a side contact structure corresponding to an undercut structure or a tapered structure formed on the lateral surface of the first metal layer by an etching speed difference between the first metal layer and the second metal layer. For example, when each of the plurality of common electrode connection portions CECP is formed of first to third metal layers, each of the plurality of common electrode connection portions CECP may include a side contact structure corresponding to an undercut structure or a tapered structure formed at the lateral surface of the first metal layer and/or the second metal layer by an etching speed difference between the first and second metal layers.

The first pad part 110 may be disposed at a first periphery portion of the first surface of the first substrate 100 parallel to the first direction X. The first pad part 110 may be disposed at a third periphery portion of each of outermost pixel areas PAo disposed at the first periphery portion of the first substrate 100. With respect to the second direction Y, an end portion of the first pad part 110 may overlap or may be aligned with an end portion of each of the outermost pixel areas PAo. Therefore, the first pad part 110 may be included (or disposed) in each of the outermost pixel areas PAo disposed at the first periphery portion of the first substrate 100, and thus, a non-display area (or a bezel area) based on the first pad part 110 may not be formed or may not be in the first substrate 100.

The first pad part 110 may include a plurality of first pads (or a first pad electrodes) which are disposed in parallel with one another along the first direction X at the first periphery portion of the first substrate 100. The plurality of first pads may be divided (or classified) into a first data pads DP, a first gate pads GP, a first pixel driving power pads PPP, a first reference voltage pads RVP, and a first pixel common voltage pads CVP.

Each of the first data pads DP may be individually (or a one-to-one relationship) coupled to one side of each of the plurality of data lines DLo and DLe disposed at the first substrate 100.

In the Figures, where a reference number or letter is provided after which another reference number or letter is provided in parenthesis, this has the meaning that the number and/or letter in parenthesis is the general category or group of the item and the first number prior to it is a specific example of that item within the group. For example, the indication in FIG. 3 of PG1(PG) indicates that PG1, the first pad group, is a specific item within the broad pad group, PG. Similarly, in FIG. 5, the notation 150m(150) indicates that each of the circuits 1501, 1502, ... 1511, 1512 etc. is driving circuit within the broad group of driving circuits 150. In addition, the notation 111(110) in FIGS. 13A-13D indicates that item 111 is one specific first pad within the group of first pads 110. Similar meanings apply to similar notations in the Figures and these are provided as examples to illustrate the meaning.

In a somewhat similar fashion, the legend below a particular figure provides a general group and is followed by a colon and then a list of items in that group as shown in the figure. For example, the notation P: Po, Pi below FIG. 1 indicates that P is the general group of a pixel and Po and Pi are specific items within that group of Pixels P. Also, below FIG. 3, the notations DL: DLo and DLe and GL: GLo and GLe indicate that each of these are specific items within the general group of data lines DL and gate lines GL, respectively.

Each of the first gate pads GP may be individually (or a one-to-one relationship) coupled to one side of each of the gate control lines GCL disposed at the first substrate 100.

The first gate pads GP according to an embodiment may be divided (or classified) into a first start signal pad, a plurality of first shift clock pads, a plurality of first carry clock pads, at least one first gate driving power pad, and at least one first gate common power pad.

Each of the first pixel driving power pads PPP may be individually (or a one-to-one relationship) coupled to one side end of each of the plurality of pixel driving power lines PL disposed at the first substrate 100.

Each of the first reference voltage pads RVP may be individually (or a one-to-one relationship) coupled to one side end of each of the plurality of reference voltage lines RL disposed at the first substrate 100.

Each of the first pixel common voltage pads CVP may be individually (or a one-to-one relationship) coupled to one side end of each of the plurality of pixel common voltage lines CVL disposed at the first substrate 100.

The first pad part 110 according to an embodiment may include a plurality of pad groups PG which are arranged in the order of a first pixel driving power pad PPP, a first data pad DP, a first reference voltage pad RVP, a first data pad DP, a first gate pad GP, a first pixel common voltage pad CVP, a first data pad DP, a first reference voltage pad RVP, a first data pad DP, and a first pixel driving power pad PPP along the first direction X. Each of the plurality of pad groups PG may be coupled to two adjacent pixels P disposed along the first direction X. For example, the plurality of pad groups PG may include a first pad group PG1 including a first pixel driving power pad PPP, a first data pad DP, a first reference voltage pad RVP, a first data pad DP, and a first gate pad GP continuously disposed in an odd-numbered pixel area PA along the first direction X, and a second pad group PG2 including a first pixel common voltage pad CVP, a first data pad DP, a first reference voltage pad RVP, a first data pad DP, and a first pixel driving power pad PPP continuously disposed in an even-numbered pixel area PA along the first direction X.

The first substrate 100 according to an embodiment of the present disclosure may further include a plurality of secondary voltage lines SVL and a plurality of secondary line connection portions SLCP. For example, the secondary voltage lines may be referred to as an additional voltage lines or an auxiliary voltage lines, or the like.

Each of the plurality of secondary voltage lines SVL may extend long along the second direction Y and may be disposed adjacent to a corresponding pixel common voltage line CVL of the plurality of pixel common voltage lines CVL. Each of the plurality of secondary voltage lines SVL may be electrically coupled to an adjacent pixel common voltage line CVL without being electrically coupled to the pixel common voltage pad CVP and may be supplied with a pixel common voltage through the adjacent pixel common voltage line CVL. To this end, the first substrate 100 according to an embodiment of the present disclosure may further include a plurality of line connection patterns LCP which electrically couple a pixel common voltage line CVL and a secondary voltage lines SVL adjacent to each other.

Each of the plurality of line connection patterns LCP may be disposed at the first substrate 100 so that the line connection pattern LCP and a pixel common voltage line CVL and a secondary voltage lines SVL adjacent to each other intersect with each other and may electrically couple a pixel common voltage line CVL and a secondary voltage lines SVL adjacent to each other by using a line jumping structure. For example, one side of each of the plurality of line connection patterns LCP may be electrically coupled to a portion of the secondary voltage lines SVL through a first line contact hole formed at an insulation layer over the secondary voltage lines SVL, and the other side of each of the plurality of line connection patterns LCP may be electrically coupled to a portion of the pixel common voltage line CVL through a second line contact hole formed at the insulation layer over the pixel common voltage line CVL.

Each of the plurality of secondary line connection portions SLCP may electrically couple the common electrode CE to each of the plurality of secondary voltage lines SVL between the plurality of pixels P overlapping each of the plurality of secondary voltage lines SVL. With respect to the second direction Y, each of the plurality of secondary line connection portions SLCP according to an embodiment may be electrically coupled to each of the plurality of secondary voltage lines SVL at a portion between the plurality of pixels P or a boundary region between the plurality of pixels P, and may be electrically coupled to a portion of the common electrode CE, and thus, may electrically couple the common electrode CE to each of the plurality of secondary voltage lines SVL. Therefore, the common electrode CE may be additionally coupled to each of the plurality of secondary voltage lines SVL through the secondary line connection portions SLCP. Accordingly, the display apparatus according to an embodiment of the present disclosure may prevent or minimize the degradation in image quality caused by a deviation of the pixel common voltage supplied to each of the pixels P arranged in the display area AA. Also, in the display apparatus according to an embodiment of the present disclosure, although the pixel common voltage pad CVP coupled to each of the plurality of secondary voltage lines SVL is not additionally disposed (or formed), the pixel common voltage may be supplied to each of the plurality of secondary voltage lines SVL through each of the pixel common voltage lines CVL and the plurality of line connection patterns LCP.

Figure 5:
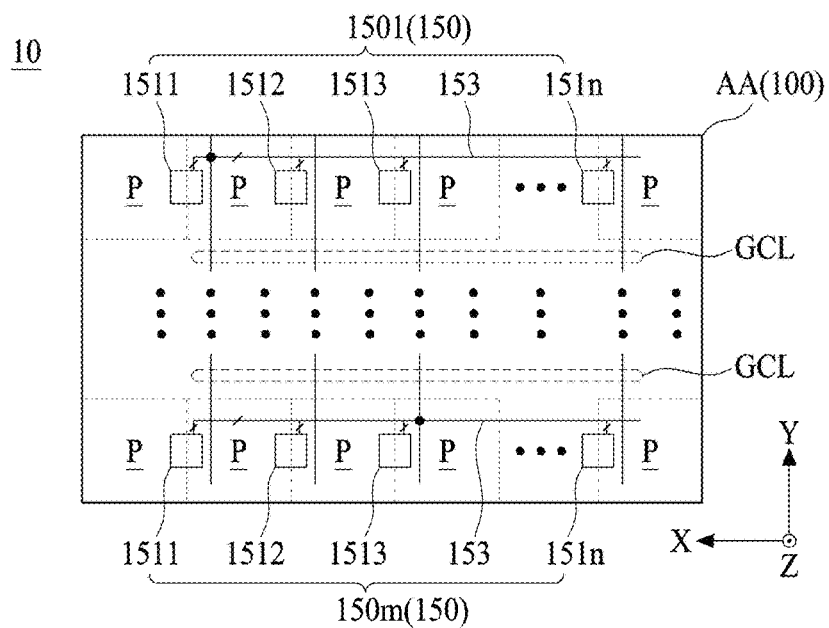
FIG. 5 is a diagram illustrating a gate driving circuit illustrated in FIGS. 1 and 3.

FIG. 5 is a diagram illustrating a gate driving circuit illustrated in FIGS. 1 and 3.

Referring to FIGS. 1, 3, and 5, the gate driving circuit 150 according to another embodiment of the present disclosure may be implemented (or embedded) within the display area AA of the first substrate 100. The gate driving circuit 150 may generate a scan signal based on gate control signals supplied through the first pad part 110 and the gate control lines GCL, and sequentially supply the scan signal to the plurality of gate lines GL.

The gate control lines GCL may include a start signal line, a plurality of shift clock lines, at least one gate driving voltage line, and at least one gate common voltage line. The gate control lines GCL may extend long along a second direction Y and may be disposed spaced apart from one another by a predetermined interval in a display area AA of the first substrate 100 along the first direction X. For example, the gate control lines GCL may be disposed between at least one or more pixels P along the first direction X.

The gate driving circuit 150 according to an embodiment of the present disclosure may be implemented with a shift register including a plurality of stage circuit portions 1501 to 150m, where m is an integer of 2 or more.

Each of the plurality of stage circuit portions 1501 to 150m may be individually disposed in each horizontal line of a first surface of the first substrate 100 along the first direction X and may be dependently coupled to one another along the second direction Y. Each of the plurality of stage circuit portions 1501 to 150m may generate a scan signal in a predetermined order in response to gate control signals supplied through the first pad part 110 and the gate control lines GCL and may supply the scan signal to a corresponding gate line GL.

Each of the plurality of stage circuit portions 1501 to 150m according to an embodiment may include a plurality of branch circuits 1511 to 151n and a branch network 153.

The plurality of branch circuits 1511 to 151n may be selectively coupled to the corresponding gate control lines of the gate control lines GCL through the branch network 153 and may be electrically coupled to one another through the branch network 153. Each of the plurality of branch circuits 1511 to 151n may generate the scan signal based on a gate control signal supplied through the gate control lines GCL and a voltage of the branch network 153, and may supply the scan signal to a corresponding gate line GL.

Each of the plurality of branch circuits 1511 to 151n may include at least one TFT (or branch TFT) of a plurality of TFTs configuring one stage circuit portion of the stage circuit portions 1501 to 150m. Any one branch circuit of the plurality of branch circuits 1511 to 151n may include a pull-up TFT coupled to the gate line GL. The other branch circuit of the plurality of branch circuits 1511 to 151n may include a pull-down TFT coupled to the gate line GL.

Each of the plurality of branch circuits 1511 to 151n according to an embodiment of the present disclosure may be disposed at a circuit area between two adjacent pixels P or at a circuit area between at least two adjacent pixels P, in each horizontal line of the first substrate 100, but embodiments of the present disclosure are not limited thereto. For example, each of the plurality of branch circuits 1511 to 151n may be disposed at a circuit area (or a boundary region) between at least one or more adjacent pixels P according to the number of TFTs configuring each of the stage circuit portions 1501 to 150m and the number of pixels P disposed one horizontal line.

The branch network 153 may be disposed at each horizontal line of the first substrate 100 and may electrically couple the plurality of branch circuits 1511 to 151n to each other. The branch network 153 according to an embodiment of the present disclosure may include a plurality of control node lines and a plurality of network line.

The plurality of control node lines may be disposed at each horizontal line of the first substrate 100 and may be selectively coupled to the plurality of branch circuits 1511 to 151n in one horizontal line. For example, the plurality of control node lines may be disposed at an upper edge region (or a lower edge region) among pixel areas arranged at each horizontal line of the first substrate 100.

The plurality of network line may be selectively coupled to the gate control lines GCL disposed at the first substrate 100 and may be selectively coupled to the plurality of branch circuits 1511 to 151n. For example, the plurality of network line may transfer the gate control signal supplied from the gate control lines GCL to corresponding branch circuits 1511 to 151n and may transfer a signal between the plurality of branch circuits 1511 to 151n.

Each of the plurality of stage circuit portions 1501 to 150m according to an embodiment of the present disclosure may include a first control node, a second control node, a node control circuit, an inverter circuit, and an output buffer circuit. The node control circuit may be configured to control the voltage of each of the first and second control nodes. The inverter circuit may be configured to control the voltage of the second control node based on the voltage of the first control node. The output buffer circuit may be configured to output a scan signal corresponding to the scan clock and a carry signal corresponding to the carry clock based on the voltage of the first control node, and a scan signal and a carry signal corresponding to the gate-off voltage level based on the voltage of the second control node. For example, the node control circuit, the inverter circuit, and the output buffer circuit may respectively include two or more of the plurality of branch circuits 1511 to 151n. For example, the plurality of branch circuits 1511 to 151n may be divided (or classified) into the node control circuit, the inverter circuit, and the output buffer circuit, respectively.

As described above, according to an embodiment of the present embodiment, because the gate driving circuit 150 is disposed within the display area AA of the first substrate 100, a second interval D2 between a center portion of the outermost pixel area PAo and the outer surfaces OS of the first substrate 100 may be equal to or less than half of a first interval (or a pixel pitch) D1 between adjacent pixel areas PA. For example, when the gate driving circuit 150 is not disposed in the display area AA of the first substrate 100 and is disposed at a periphery portion of the first substrate 100, the second interval D2 may not be equal to or less than half of the first interval D1. Accordingly, in the display apparatus according to an embodiment of the present disclosure, the gate driving circuit 150 may be disposed in the display area AA of the first substrate 100, and thus, the second interval D2 may be implemented to be equal to or less than half of the first interval D1, and moreover, the display apparatus may be implemented to have an air bezel structure which has a zero, namely, no bezel or where a bezel area is not provided.

Figure 6:
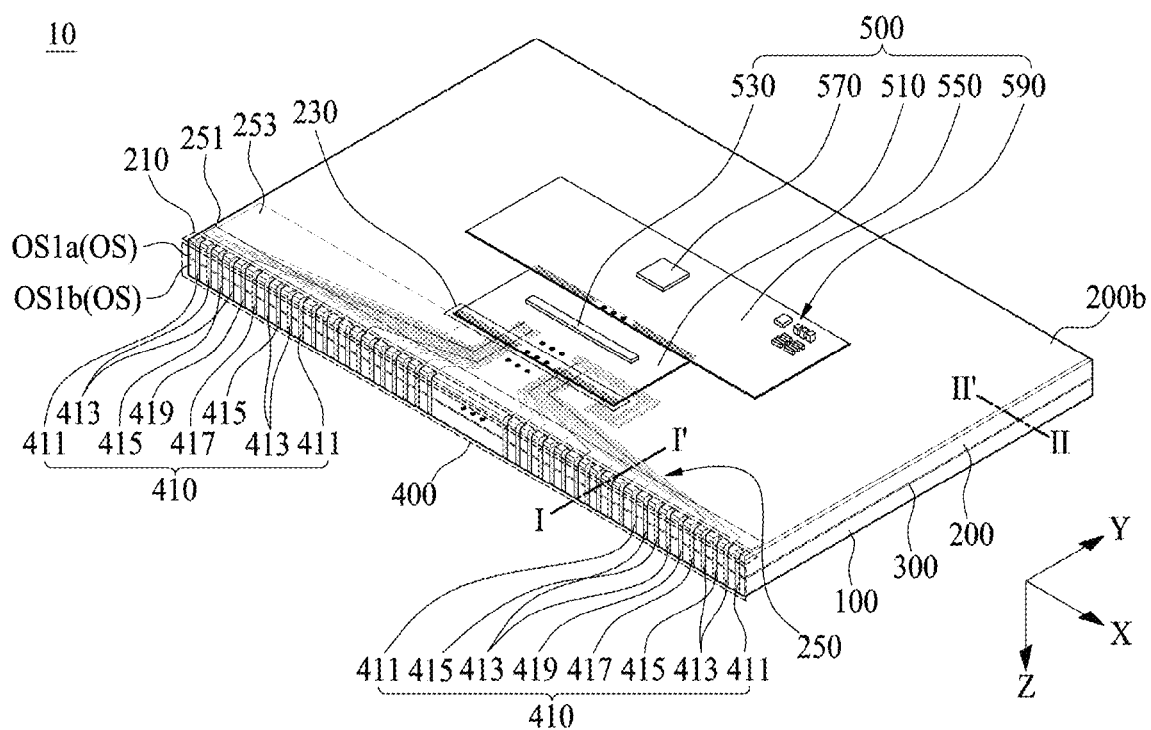
FIG. 6 is a diagram illustrating a rear surface of a display apparatus according to another embodiment of the present disclosure.
Figure 7:
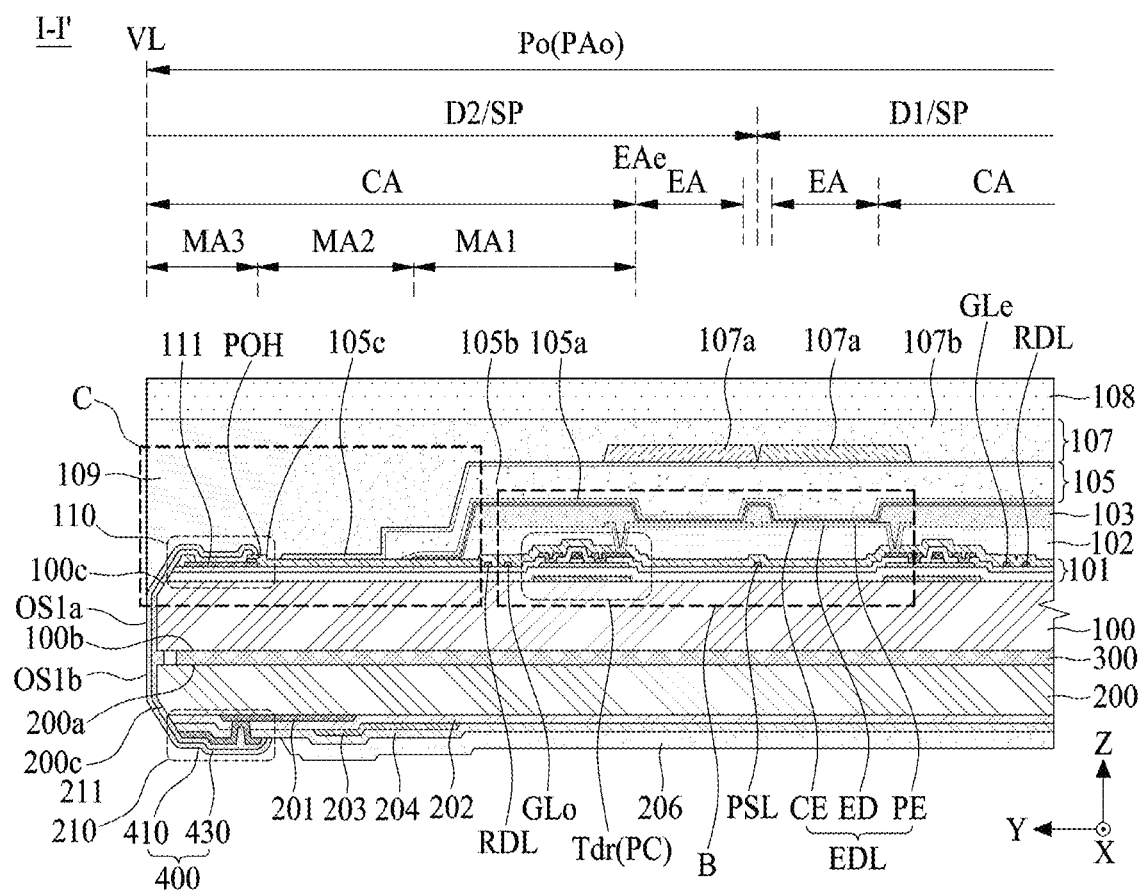
FIG. 7 is a cross-sectional view taken along line I-I' illustrated in FIG. 6.
Figure 8:
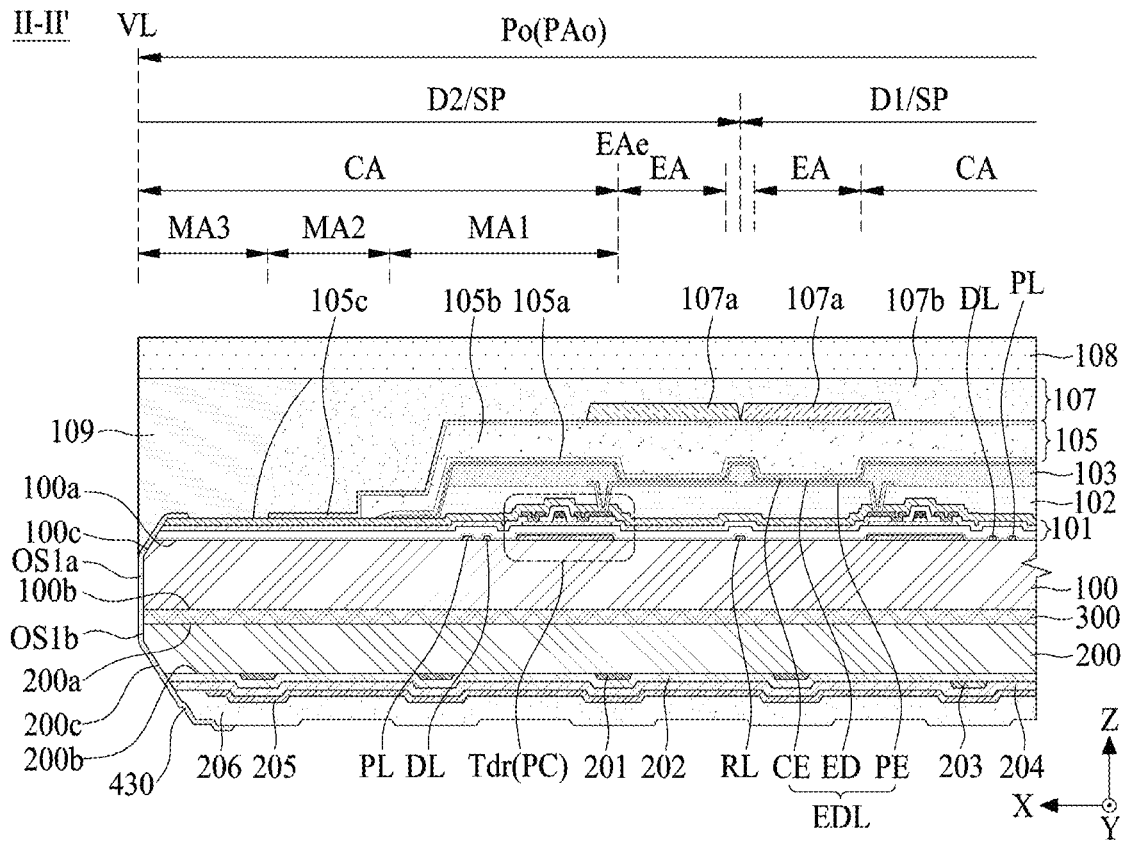
FIG. 8 is a cross-sectional view taken along line II-IP illustrated in FIG. 6.
Figure 9:
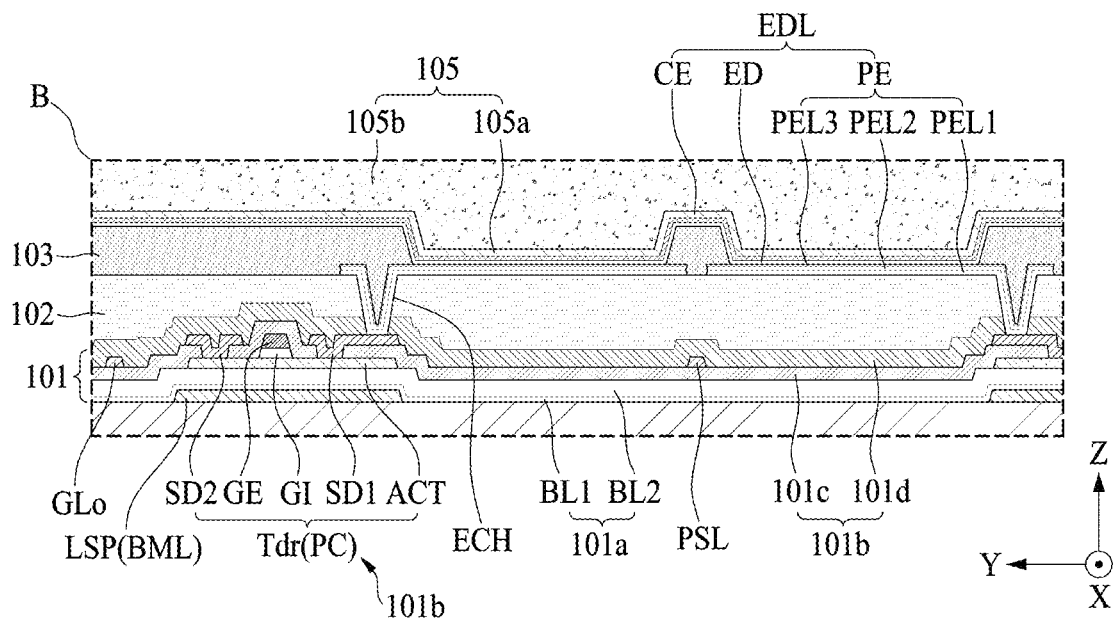
FIG. 9 is an enlarged view of a region 'B' illustrated in FIG. 7.
Figure 10:
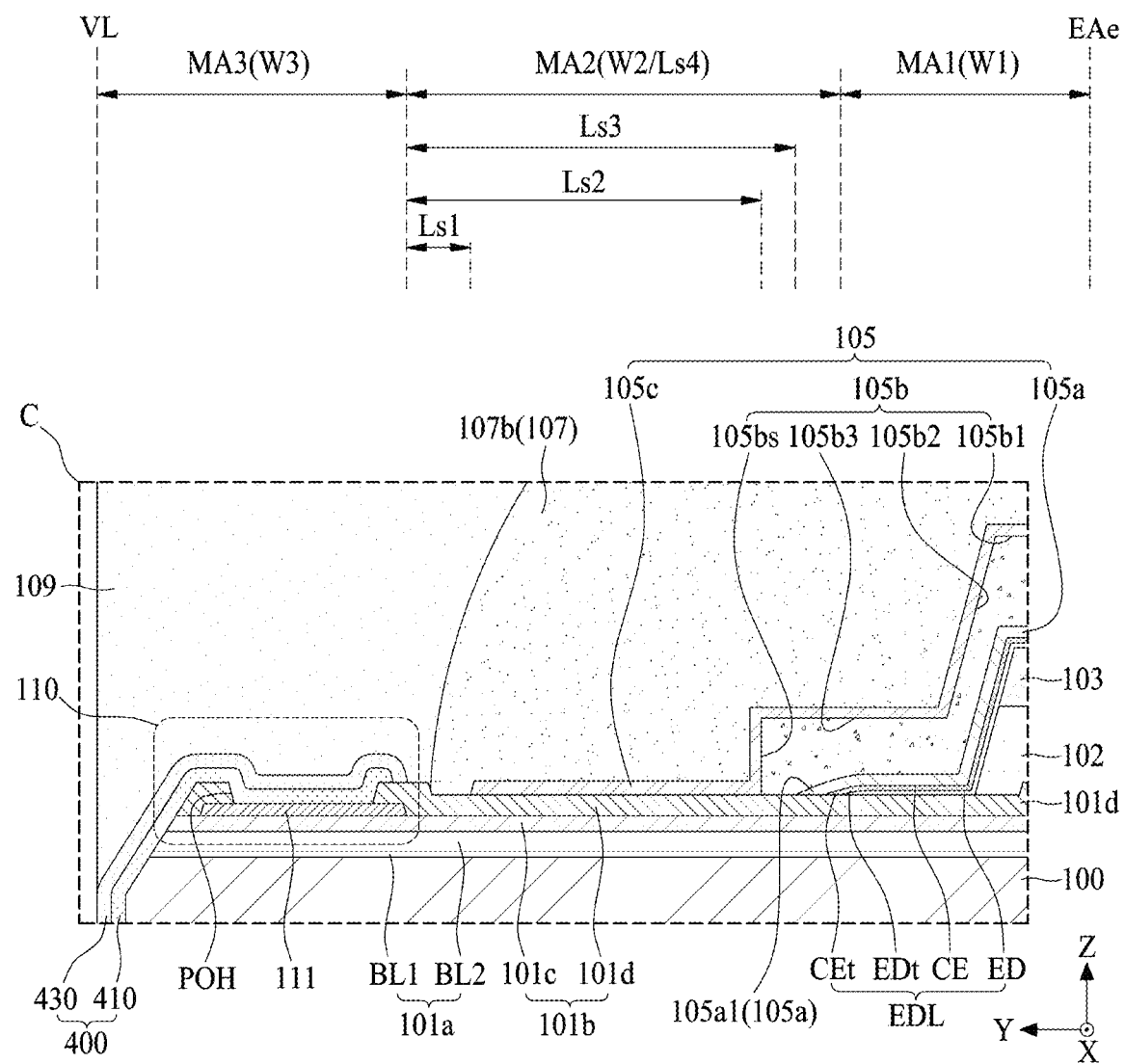
FIG. 10 is an enlarged view of a region 'C' illustrated in FIG. 7.

FIG. 6 is a diagram illustrating a rear surface of a display apparatus according to another embodiment of the present disclosure, FIG. 7 is a cross-sectional view taken along line I-I' illustrated in FIG. 6, FIG. 8 is a cross-sectional view taken along line II-IF illustrated in FIG. 6, FIG. 9 is an enlarged view of a region 'B' illustrated in FIG. 7, and FIG. 10 is an enlarged view of a region 'C' illustrated in FIG. 7.

Referring to FIGS. 3 and 6 to 9, a display apparatus according to an embodiment of the present disclosure may include a first substrate 100, a second substrate 200, a coupling member 300, and a routing portion 400.

The first substrate 100 according to an embodiment of the present disclosure may include a circuit layer 101, a planarization layer 102, a light emitting device layer EDL, a bank 103, a first pad part 110, and an encapsulation layer 105.

The circuit layer 101 may be disposed over the first substrate 100. The circuit layer 101 may be referred to as a pixel array layer or a TFT array layer.

The circuit layer 101 according to an embodiment of the present disclosure may include a buffer layer 101a and a circuit array layer 101b.

The buffer layer 101a may prevent materials, such as hydrogen included in the first substrate 100, from being diffused to the circuit array layer 101b in a high temperature process of a process of manufacturing a TFT. Also, the buffer layer 101a may prevent external water or moisture from penetrating into the light emitting device layer EDL. The buffer layer 101a according to an embodiment may include silicon oxide (SiOx), silicon nitride (SiNx), silicon oxynitride (SiON), or a multilayer thereof, but embodiments of the present disclosure are not limited thereto. For example, the buffer layer 101a may include a first buffer layer BL1 which includes SiNx and is disposed on the first substrate 100 and a second buffer layer BL2 which includes SiOx and is disposed on the first buffer layer BL1.

The circuit array layer 101b may include a pixel circuit PC which includes a driving TFT Tdr and pixel driving lines DL, GL, PL, CVL, RL, and GCL disposed in each of a plurality of pixel areas PA over the buffer layer 101a.

The driving TFT Tdr disposed in a circuit area of the each pixel area PA may include an active layer ACT, a gate insulation layer GI, a gate electrode GE, an interlayer insulation layer 101c, a first source/drain electrode SD1, a second source/drain electrode SD2, and a passivation layer 101d.

The active layer ACT may be disposed on the buffer layer 101a in each pixel area PA. The active layer ACT may include a channel area, overlapping the gate electrode GE, and a first source/drain area and a second source/drain area parallel to each other between adjacent channel areas. The active layer ACT may have conductivity in a conductivity process, and thus, may be used as a bridge line of a jumping structure which directly connects lines in the display area AA or electrically connects lines disposed on different layers.

The gate insulation layer GI may be disposed on the channel area of the active layer ACT. The gate insulation layer GI may insulate the active layer ACT from the gate electrode GE.

The gate electrode GE may be disposed on the gate insulation layer GI and connected to the gate line. The gate electrode GE may overlap the channel area of the active layer ACT with the gate insulation layer GI therebetween.

The interlayer insulation layer 101c may be disposed at the first substrate 100 to cover the gate electrode GE and the active layer ACT. The interlayer insulation layer 101c may electrically insulate (or isolate) the gate electrode GE and the source/drain electrodes SD1 and SD2.

The first source/drain electrode SD1 may be disposed on the interlayer insulation layer 101c overlapping the first source/drain area of the active layer ACT and may be electrically connected to the first source/drain area of the active layer ACT through a first source/drain contact hole disposed in the interlayer insulation layer 101c. For example, the first source/drain electrode SD1 may be a source electrode of the driving TFT Tdr, and the first source/drain area of the active layer ACT may be a source area.

The second source/drain electrode SD2 may be disposed on the interlayer insulation layer 101c overlapping the second source/drain area of the active layer ACT and may be electrically connected to the second source/drain area of the active layer ACT through a second source/drain contact hole disposed in the interlayer insulation layer 101c. For example, the second source/drain electrode SD2 may be a drain electrode of the driving TFT Tdr, and the second source/drain area of the active layer ACT may be a drain area.

The passivation layer 101d may be disposed over the first substrate 100 to cover the pixel circuit PC including the driving TFT Tdr and the pixel driving lines DL, GL, PL, CVL, RL, and GCL.

According to an embodiment, when the interlayer insulation layer 101c is not disposed at the periphery portion of the first substrate 100, the passivation layer 101d disposed at the periphery portion of the first substrate 100 may directly contact the buffer layer 101a. The passivation layer 101d according to an embodiment may include silicon oxide (SiOx), silicon nitride (SiNx), silicon oxynitride (SiON), or a multilayer thereof, but embodiments of the present disclosure are not limited thereto. For example, the passivation layer 101d may be referred to as a protection layer, a circuit protection layer, an insulation layer, a circuit insulation layer, or the like which covers the circuit array layer 101b.

Each of first and second switching TFT Tsw1 and Tsw2 configuring the pixel circuit PC may be formed together with the driving TFT Tdr, and thus, their detailed descriptions are omitted.

The circuit layer 101 according to an embodiment may further include a lower metal layer BML, which is disposed between the first substrate 100 and the buffer layer 101a.

The lower metal layer BML may further include a light blocking pattern (or a light blocking layer) LSP which is disposed under (or below) the active layer ACT of each of the TFTs Tdr, Tsw1, and Tsw2 configuring the pixel circuit PC.

The light blocking pattern LSP may be disposed in an island shape between the first substrate 100 and the active layer ACT. The light blocking pattern LSP may block light which is incident on the active layer ACT through the first substrate 100, thereby preventing or minimizing a threshold voltage variation of each TFT caused by external light. Optionally, the light blocking pattern LSP may be electrically connected to the first source/drain electrode SD1 of a corresponding TFT and thus may act as a lower gate electrode of the corresponding TFT, and in this case, a characteristic variation of each TFT caused by light and a threshold voltage variation of each TFT caused by a bias voltage may be minimized or prevented.

The lower metal layer BML may be used as a line disposed in parallel with each other of the gate line GL, the data line DL, the pixel driving power line PL, the pixel common voltage line CVL, and the reference voltage line RL. For example, the lower metal layer BML may be used as a metal layer (or a line) disposed in parallel to the second direction Y of the pixel driving lines DL, GL, PL, CVL, RL, and GCL disposed at the first substrate 100.

The planarization layer 102 may be disposed over the first substrate 100 and may provide a flat surface over the circuit layer 101. The planarization layer 102 may cover the circuit layer 101 including the driving TFT Tdr disposed at each of the plurality of pixel areas PA. The planarization layer 102 according to an embodiment may be formed of an organic material, but embodiments of the present disclosure are not limited thereto. The planarization layer 102 according to an embodiment may be formed to cover the remaining circuit layer 101 except a periphery portion of the passivation layer 101d disposed at the first substrate 100. For example, the planarization layer 102 may be disposed between the passivation layer 101d and the light emitting device layer EDL or disposed under the light emitting device layer EDL.

The light emitting device layer EDL may be disposed over the planarization layer 102. The light emitting device layer EDL according to an embodiment may include a pixel electrode PE, a self-emitting device ED, and a common electrode CE.

The pixel electrode PE may be referred to as an anode electrode, a reflective electrode, a lower electrode, an anode, or a first electrode of the self-emitting device ED.

The pixel electrode PE may be disposed over the planarization layer 102 overlapping an emission area EA of each of the plurality of subpixel SP in the first substrate 100. The pixel electrode PE may be patterned in an island shape and disposed in each subpixel SP, and may be electrically coupled to the first source/drain electrode SD1 of the driving TFT Tdr of a corresponding pixel circuit PC. For example, one side of the pixel electrode PE may extend onto the first source/drain electrode SD1 of the driving TFT Tdr and may be electrically coupled to the first source/drain electrode SD1 of the driving TFT Tdr through an electrode contact hole ECH provided in the planarization layer 102.

The pixel electrode PE may include a metal material which is low in work function and is good in reflective efficiency.

The pixel electrode PE according to an embodiment may have a two-layer structure including a first pixel electrode layer (or a first metal layer) PEL1 and a second pixel electrode layer (or a second metal layer) PEL2. The first and second pixel electrode layers PEL1 and PEL2 may be sequentially deposited over the planarization layer 102 and then simultaneously patterned, but embodiments of the present disclosure are not limited thereto.

The first pixel electrode layer PEL1 may disposed over the planarization layer 102. The second pixel electrode layer PEL2 may disposed (or stacked) on the first pixel electrode layer PEL1. For example, the first pixel electrode layer PEL1 may act as an adhesive layer corresponding to the planarization layer 102 and may act as a secondary electrode of the self-emitting device ED, and moreover, may include indium tin oxide (ITO) or indium zinc oxide (IZO), but embodiments of the present disclosure are not limited thereto. For example, the second pixel electrode layer PEL2 may act as a reflector and may perform a function of decreasing a resistance of the pixel electrode PE, and moreover, may include one or more material of aluminum (Al), silver (Ag), molybdenum (Mo), titanium (Ti), and a Mo—Ti alloy (MoTi), but embodiments of the present disclosure are not limited thereto. For example, the pixel electrode PE according to an embodiment may be formed in a two-layer structure of ITO/MoTi or IZO/MoTi.

The pixel electrode PE according to another embodiment may have a three-layer structure including a first pixel electrode layer PEL1, a second pixel electrode layer PEL2 on the first pixel electrode layer PEL1, and a third pixel electrode layer (or a third metal layer) PEL3 on the second pixel electrode layer PEL2. For example, the third pixel electrode layer PEL3 may act as an electrode of the self-emitting device ED and may include ITO or IZO. For example, the pixel electrode PE according to another embodiment may be formed in a three-layer structure of IZO/MoTi/ITO or ITO/MoTi/ITO.

The pixel electrode PE according to another embodiment may have a four-layer structure including a first pixel electrode layer PEL1, a second pixel electrode layer PEL2 on the first pixel electrode layer PEL1, a third pixel electrode layer (or a third metal layer) PEL3 on the second pixel electrode layer PEL2, and a fourth pixel electrode layer (or a fourth metal layer) on the third pixel electrode layer PEL3.

In the pixel electrode PE of the four-layer structure, the first pixel electrode layer may act as the adhesive layer corresponding to the planarization layer 102 and may act as the secondary electrode of the self-emitting device ED, and moreover, may include one or more material of ITO, Mo, and MoTi. The second pixel electrode layer may act a function of decreasing a resistance of the pixel electrode PE and may include Cu. The third pixel electrode layer may act as a reflector and may include one or more material of Al, Ag, Mo, Ti, and MoTi. The fourth pixel electrode layer may act as an electrode of the self-emitting device ED and may include ITO or IZO. For example, the pixel electrode PE according to another embodiment may be formed in a four-layer structure of ITO/Cu/MoTi/ITO.

The pixel electrode PE according to another embodiment may have a five-layer structure including a first pixel electrode layer made of ITO, a second pixel electrode layer made of MoTi, a third pixel electrode layer made of ITO, a fourth pixel electrode layer made of Ag, and a fifth pixel electrode layer made of ITO.

The self-emitting device ED may be disposed over the first substrate 100. The self-emitting device ED may be formed over the pixel electrode PE and may directly contact the pixel electrode PE. The pixel electrode PE may be disposed under (or below) the self-emitting device ED. For example, the pixel electrode PE may be disposed between the planarization layer 102 and the self-emitting device ED.

The self-emitting device ED according to an embodiment may be a common layer which is formed in common in each of a plurality of subpixels SP so as not to be distinguished by subpixel SP units. The self-emitting device ED may react on a current flowing between the pixel electrode PE and the common electrode CE to emit white light (or blue light). The self-emitting device ED according to an embodiment may include an organic light emitting device or an inorganic light emitting device, or may include a stacked or a combination structure of an organic light emitting device (or an inorganic light emitting device) and a quantum dot light emitting device. For example, the self-emitting device ED according to another embodiment may include an organic light emitting layer or an inorganic light emitting layer, or may include a stacked or a combination structure of an organic light emitting layer (or an inorganic light emitting layer) and a quantum dot light emitting layer.

The organic light emitting device may include two or more organic light emitting parts for emitting white light. For example, the organic light emitting device may include a first organic light emitting part and a second organic light emitting part for emitting white light based on a combination of first light and second light. For example, the first organic light emitting part may include at least one or more of a blue light emitting layer, a green light emitting layer, a red light emitting layer, a yellow light emitting layer, and a yellow-green light emitting layer. The second organic light emitting part may include at least one or more of a blue light emitting layer, a green light emitting layer, a red light emitting layer, a yellow light emitting layer, and a yellow-green light emitting layer for emitting second light which is combined with first light from the first organic light emitting part to generate white light.

The organic light emitting device according to an embodiment may further include at least one or more function layers for enhancing emission efficiency and/or lifetime. For example, the function layer may be disposed upper and/or under a light emitting layer.

The inorganic light emitting device according to an embodiment may include a semiconductor light emitting diode, a micro light emitting diode, or a quantum dot light emitting diode. For example, when the self-emitting device ED is the inorganic light emitting device, the self-emitting device ED may have a scale of 1 μm or 100 μm, but embodiments of the present disclosure are not limited thereto.

The common electrode CE may be disposed over the display area AA of the first substrate 100 and may be electrically coupled to the self-emitting device ED of each of the plurality of pixels P. For example, the common electrode CE may be disposed over the remaining display area AA of the first substrate 100 except for the first pad part 110 of the first substrate 100.

The common electrode CE may be referred to as a cathode electrode, a transparent electrode, an upper electrode, a cathode, or a second electrode of the self-emitting device ED. The common electrode CE may be formed over the self-emitting device ED and may directly contact the self-emitting device ED or may electrically and directly contact the self-emitting device ED. The common electrode CE can include a transparent conductive material which transmits light emitted from the self-emitting device ED.

The common electrode CE according to an embodiment of the present disclosure may be formed in a single-layer structure or a multi-layer structure, which includes at least one material of graphene and a transparent conductive material which is relatively high in work function. For example, the common electrode CE may include metal oxide such as ITO or IZO, or may include a combination of oxide and metal such as ZnO:Al or SnO2:Sb.

Additionally, the light emitting device layer EDL may further include a capping layer disposed over the common electrode CE. The capping layer may be disposed over the common electrode CE and may improve the emission efficiency of light by adjusting a refractive index of light emitted from the light emitting device layer EDL.

The bank 103 may be disposed over the planarization layer 102 to define the pixel areas PA over the first substrate 100. The bank 103 may be disposed over the planarization layer 102 to cover a periphery portion of the pixel electrode PE. The bank 103 may define the emission area EA (or an opening portion) of each of the plurality of subpixels SP and may electrically isolate the pixel electrodes PE disposed in adjacent subpixels SP. The bank 103 may be formed to cover the electrode contact hole ECH disposed in each of the plurality of pixel areas PA. The bank 103 may be covered by the self-emitting device ED of the light emitting device layer EDL. For example, the self-emitting device ED may be disposed over the bank 103 as well as over the pixel electrode PE of each of the plurality of subpixels SP.

The bank 103 according to an embodiment of present disclosure may be a transparent bank including a transparent material or a black bank (or an opaque bank) including a black pigment.

The first pad part 110 may be disposed at one periphery portion of the first substrate 100 and may be electrically coupled to the pixel driving lines DL, GL, PL, CVL, RL, and GCL in a one-to-one relationship.

The first pad part 110 according to an embodiment may include a plurality of first pads 111.

The plurality of first pads 111 may be divided (or classified) into first data pads DP, first gate pads GP, first pixel driving power pads PPP, first reference voltage pads RVP, and first pixel common voltage pads CVP.

Each of the plurality of first pads 111 may be disposed over the passivation layer 101d and may be electrically coupled to a corresponding line of the pixel driving lines DL, GL, PL, CVL, RL, and GCL through a via hole passing through the interlayer insulation layer 101c and the buffer layer 101a. According to an embodiment, each of the plurality of first pads 111 may include the same material as a source/drain electrode of a TFT and may be formed together along with the source/drain electrode of the TFT. Each of the plurality of first pads 111 according to another embodiment may include the same material as the pixel electrode PE and may be formed together with the pixel electrode PE.

A portion of each of the plurality of first pads 111 may be exposed at the first substrate 100 through a pad open hole POH formed in the passivation layer 101d. For example, the pad open hole POH may be implemented by a pad open process of removing or opening a portion of the passivation layer 101d overlapping a portion of each of the plurality of first pads 111.

Referring to FIGS. 7 to 9, an encapsulation layer 105 according to an embodiment of the present disclosure may be disposed over a portion, other than an outermost periphery portion including a first pad part 110, of a first surface of a first substrate 100 and may be implemented to cover a light emitting device layer EDL. For example, the encapsulation layer 105 may be implemented to surround all of a front surface and lateral surfaces of the light emitting device layer EDL, and thus, may prevent oxygen or water (or moisture) from penetrating into the light emitting device layer EDL, thereby enhancing the reliability of the light emitting device layer EDL against oxygen or water (or moisture).

The encapsulation layer 105 according to an embodiment may include first to third encapsulation layers 105a to 105c.

The first encapsulation layer 105a may be implemented on the first substrate 100 to surround (or to cover) the light emitting device layer EDL. For example, the first encapsulation layer 105a may be implemented over the first substrate 100 to fully cover or otherwise surround on the top surface of the light emitting device layer EDL. For example, the first encapsulation layer 105a may be disposed on the first substrate 100 with a common electrode CE disposed therein and may directly contact an uppermost surface of a circuit layer 101 in an outermost pixel area of the first substrate 100, thereby fully covering the light emitting device layer EDL including the common electrode CE. Accordingly, all of a front surface and lateral surfaces of the light emitting device layer EDL may be surrounded by the first encapsulation layer 105a. The first encapsulation layer 105a may include a material for preventing oxygen or water (or moisture) from penetrating into the light emitting device layer EDL. For example, the first encapsulation layer 105a may include an inorganic material.

The first encapsulation layer 105a may directly contact the uppermost surface of the circuit layer 101 in the outermost pixel area of the first substrate 100, and thus, may cover a boundary portion (or an interface) between the uppermost surface of the circuit layer 101 and an end of the common electrode CE covering an end of a self-emitting device ED. Accordingly, the self-emitting device ED may be fully surrounded or covered by the circuit layer 101 and the first encapsulation layer 105a, and thus, the lateral penetration of water (or moisture) may be prevented.

The second encapsulation layer 105b may be implemented over the first substrate 100 to surround the first encapsulation layer 105a. For example, the second encapsulation layer 105b may be implemented on the first substrate 100 to fully cover or surround on the top surface of the first encapsulation layer 105a. For example, the second encapsulation layer 105b may be disposed on the first substrate 100 with the first encapsulation layer 105a disposed therein and may directly contact the uppermost surface of the circuit layer 101 in the outermost pixel area of the first substrate 100, and thus, may wholly or fully cover or surround on the top surface of the first encapsulation layer 105a.

The second encapsulation layer 105b may directly contact the uppermost surface of the circuit layer 101 in the outermost pixel area of the first substrate 100, and thus, may cover a boundary portion (or an interface) between the uppermost surface of the circuit layer 101 and an end of the first encapsulation layer 105a. Accordingly, the first encapsulation layer 105a may be fully surrounded or covered by the second encapsulation layer 105b.

The second encapsulation layer 105b may be implemented on the first encapsulation layer 105a to have a thickness which is relatively thicker (or greater) than the first encapsulation layer 105a. The second encapsulation layer 105b may have a thickness for sufficiently cover particles (or an undesired material or an undesired structure material) which are or may be on the first encapsulation layer 105a. The second encapsulation layer 105b may be referred to as a particle cover layer. The second encapsulation layer 105b according to an embodiment may include an organic material or a liquid organic material.

The third encapsulation layer 105c may be implemented to surround the second encapsulation layer 105b. For example, the third encapsulation layer 105c may be implemented to fully cover or surround the second encapsulation layer 105b. For example, the third encapsulation layer 105c may be implemented on the uppermost surface of the circuit layer 101 in the outermost pixel area of the first substrate 100. For example, the third encapsulation layer 105c may directly contact the uppermost surface of the circuit layer 101 in the outermost pixel area of the first substrate 100, and thus, may cover a boundary portion (or an interface) between the uppermost surface of the circuit layer 101 and an end of the second encapsulation layer 105b. Accordingly, the second encapsulation layer 105b may be fully surrounded or covered by the third encapsulation layer 105c.

The third encapsulation layer 105c may include a material for primarily prevent oxygen or water (or moisture) from penetrating into the light emitting device layer EDL. For example, the third encapsulation layer 105c may include an inorganic material which is the same as or different from the first encapsulation layer 105a. For example, the third encapsulation layer 105c may have a thickness which is the same as or different from the first encapsulation layer 105a.

According to an embodiment of the present disclosure, the encapsulation layer 105 may directly contact the uppermost surface of the circuit layer 101 disposed in the first substrate 100 in the outermost pixel area or a periphery portion of the first substrate 100, and thus, may seal (or encapsulate) or triply surround the light emitting device layer EDL, thereby preventing or maximally delaying a reduction in reliability of the light emitting device layer EDL caused by the lateral penetration of water (or moisture). For example, as the first to third encapsulation layers 105a to 105c of the encapsulation layer 105 directly contact the uppermost surface of the circuit layer 101, the light emitting device layer EDL may have a triple seal structure based on the first to third encapsulation layers 105a to 105c. For example, the light emitting device layer EDL may be primarily sealed by the first encapsulation layer 105a directly contacting the uppermost surface of the circuit layer 101, secondarily sealed by the second encapsulation layer 105b which surrounds the first encapsulation layer 105a and directly contacts the uppermost surface of the circuit layer 101, and tertiarily sealed by the third encapsulation layer 105c which surrounds the second encapsulation layer 105b and directly contacts the uppermost surface of the circuit layer 101. Furthermore, the self-emitting device ED of the light emitting device layer EDL may be surrounded by the common electrode CE, and thus, may have a quadruple seal structure based on the first to third encapsulation layers 105a to 105c and the common electrode CE.

Referring again to FIGS. 7 and 8, the display apparatus or the first substrate 100 according to an embodiment of the present disclosure may further include a wavelength conversion layer 107 disposed over the encapsulation layer 105.

The wavelength conversion layer 107 may convert a wavelength of light which is incident thereon from an emission area of each pixel area PA. For example, the wavelength conversion layer 107 may convert white light (or blue light), which is incident thereon from the emission area, into color light corresponding to the subpixel SP or may transmit only color light corresponding to the subpixel SP. For example, the wavelength conversion layer 107 may include at least one of a wavelength conversion member and a color filter layer.

The wavelength conversion layer 107 according to an embodiment may include a plurality of wavelength conversion members 107a and a protection layer 107b.

The plurality of wavelength conversion members 107a may be disposed over the encapsulation layer 105 disposed at the emission area EA of each of the plurality of subpixel areas. For example, each of the plurality of wavelength conversion members 107a may be implemented to have the same size as or wider than the emission area EA of each subpixel area.

The plurality of wavelength conversion members 107a according to an embodiment may be divided (or classified) into a red light filter which converts white light into red light, a green light filter which converts white light into green light, and a blue light filter which converts white light into blue light. For example, the red light filter (or a first light filter) may be disposed over the encapsulation layer 105 in the emission area EA of the red subpixel SP, the green light filter (or a second light filter) may be disposed over the encapsulation layer 105 in the emission area EA of the green subpixel SP, and the blue light filter (or a third light filter) may be disposed over the encapsulation layer 105 in the emission area EA of the blue subpixel SP.

The plurality of wavelength conversion members 107a according to another embodiment may be disposed over the encapsulation layer 105 of each subpixel area. For example, each of the plurality of wavelength conversion members 107a may be disposed over the encapsulation layer 105 to overlap the entire corresponding subpixel area.

The plurality of wavelength conversion members 107a according to another embodiment may be implemented to overlap each other at the encapsulation layer 105 overlapped with the circuit area CA (or the non-emission area) except for the emission area EA of each subpixel areas. For example, two or more wavelength conversion members 107a having different colors are disposed at the encapsulation layer 105 overlapping the circuit area CA (or non-emission area) except for the emission area EA of each subpixel areas. The two or more wavelength conversion members 107a disposed at the encapsulation layer 105 overlapping the circuit area CA (or non-emission area) may act as a function of a light blocking pattern which prevents color mixture between adjacent subpixels SP or between adjacent pixels P.

The protection layer 107b may be implemented to cover the wavelength conversion members 107a and to provide a flat surface over the wavelength conversion members 107a. The protection layer 107b may be disposed to cover the wavelength conversion members 107a and the encapsulation layer 105 where the wavelength conversion members 107a are not disposed. The protection layer 107b according to an embodiment may include an organic material. Alternatively, the protection layer 107b may further include a getter material for adsorbing water and/or oxygen.

Optionally, the wavelength conversion layer 107 according to another embodiment may include two or more layers wavelength conversion members 107a disposed over the encapsulation layer 105 overlapping the circuit area CA (or non-emission area) except for the emission area EA in each subpixel areas. The two or more layers wavelength conversion members 107a may act as a function of the light blocking pattern.

Alternatively, the wavelength conversion layer 107 may be changed to a wavelength conversion sheet having a sheet form and may be disposed over the encapsulation layer 105. In this case, the wavelength conversion sheet (or a quantum dot sheet) may include the wavelength conversion members 107a disposed between a pair of films. For example, when the wavelength conversion layer 107 includes a quantum dot which re-emits colored light set in a subpixel, the light emitting device layer EDL of a subpixel may be implemented to emit white light or blue light.

Referring to FIGS. 7 and 8, the display apparatus or the first substrate 100 according to an embodiment of the present disclosure may further include a functional film 108 disposed over the first substrate 100.

The functional film 108 may be disposed over the wavelength conversion layer 107. For example, the functional film 108 may be coupled to the wavelength conversion layer 107 by a transparent adhesive member. The functional film 108 according to an embodiment may include at least one of an anti-reflection layer (or an anti-reflection film), a barrier layer (or a barrier film), a touch sensing layer, and a light path control layer (or a light path control film).

The anti-reflection layer may include a circular polarization layer (or a circular polarization film) which prevents external light, reflected by TFTs and/or the pixel driving lines disposed at the substrate 100, from traveling to the outside.

The barrier layer may include a material (for example, a polymer material) which is low in water transmission rate, and may primarily prevent the penetration of water or oxygen.

The touch sensing layer may include a touch electrode layer based on a mutual capacitance method or a self-capacitance method, and may output touch data corresponding to a user's touch through the touch electrode layer.

The light path control layer may include a stacked structure where a high refraction layer and a low refraction layer are alternately stacked and may change a path of light incident from each pixel P to minimize a color shift based on a viewing angle.

Referring to FIGS. 7 and 8, the display apparatus or the first substrate 100 according to an embodiment of the present disclosure may further include a side sealing member 109.

The side sealing member 109 may be formed between the first substrate 100 and the functional film 108 and may cover all of side surfaces of the circuit layer 101 and the wavelength conversion layer 107. For example, the side sealing member 109 may cover all of side surfaces of each of the circuit layer 101 and the wavelength conversion layer 107 exposed at the outside of the display apparatus, between the functional film 108 and the first substrate 100. Also, the side sealing member 109 may cover a portion of the routing portion 400 coupled to the first pad part 110 of the first substrate 100. The side sealing member 109 may prevent lateral light leakage by light, traveling from an inner portion of the wavelength conversion layer 107 to an outer surface thereof, of light emitted from the self-emitting device ED of each subpixel SP. Particularly, the side sealing member 109 overlapping the first pad part 110 of the first substrate 100 may prevent or minimize the reflection of external light caused by the pads 111 disposed in the first pad part 110.

Optionally, the side sealing member 109 may further include a getter material for adsorbing water and/or oxygen.

The display apparatus or the first substrate 100 according to an embodiment of the present disclosure may further include a first chamfer 100c which is provided at a corner portion between the first surface 100a and the outer surface OS. The first chamfer 100c may reduce or minimize the damage of the corner portion of the first substrate 100 caused by a physical impact applied from the outside and may prevent a disconnection of the routing portion 400 caused by the corner portion of the first substrate 100. For example, the first chamfer 100c may have a 45-degree angle, but embodiments of the present disclosure are not limited thereto. The first chamfer 100c may be implemented by a chamfer process using a cutting wheel, a polishing wheel, a laser, or the like. Accordingly, each of outer surfaces of the pad electrodes 111 of the first pad part 110 disposed to contact the first chamfer 100c may include an inclined surface which is inclined by an angle corresponding to an angle of the first chamfer 100c by removing or polishing a corresponding portion thereof along with the corner portion of the first substrate 100 through the chamfer process. For example, when the first chamfer 100c is formed at an angle of 45 degrees between the outer surface OS and the first surface 100a of the first substrate 100, the outer surfaces (or one ends) of the pad electrodes 111 of the first pad part 110 may be formed at an angle of 45 degrees.

Referring to FIGS. 6 and 7, the second substrate 200 according to an embodiment of the present disclosure may be referred to as a wiring substrate, a line substrate, a link substrate, a lower substrate, a rear substrate, or link glass.

The second substrate 200 may be a glass substrate, or may be a thin glass substrate or a plastic substrate, which is bendable or flexible. For example, the second substrate 200 may include the same material as the first substrate 100. A size of the second substrate 200 may be the same as or substantially the same as the first substrate 100, but embodiments of the present disclosure are not limited thereto, the size of the second substrate 200 may be less than that of the first substrate 100. For example, the second substrate 200 may be configured to have the same size as the first substrate 100 in order to maintain or secure the stiffness of the first substrate 100.

The second substrate 200 according to an embodiment of the present disclosure may include a second pad part 210.

The second pad part 210 may be disposed at one periphery portion (or a first rear edge portion) of a rear surface 200b of the second substrate 200 overlapping the first pad part 110 disposed at a front surface of the first substrate 100. The second pad part 210 may include a plurality of second pads (or routing pads) which are arranged at a certain interval along the first direction X to respectively overlap the pads of the first pad part 110.

The plurality of second pads may be divided (or classified) into second pixel driving power pads overlapping each of the first pixel driving power pads PPP, second data pads overlapping each of the first data pads DP, second reference voltage pads overlapping each of the first reference voltage pads RVP, second gate pads overlapping each of the first gate pads GP, and second pixel common voltage pads overlapping each of the first pixel common voltage pads CVP.

Each of the plurality of second pads may have a length which is longer than the first pad 111 of the first pad part 110, with respect to a lengthwise direction thereof or the second direction Y. For example, each of the plurality of second pads may be disposed at rear surface (or a second surface) 200b of the second substrate 200, and thus, a space in the lengthwise direction is not limited compared to the first pad part 110, whereby each of the plurality of second pads may have a length which is relatively longer than the first pads 111 of the first pad part 110, with respect to the lengthwise direction thereof or the second direction Y.

The second substrate 200 according to an embodiment of the present disclosure may further include at least one third pad part 230 and a link line part 250.

The at least one third pad part 230 (or an input pad part) may be disposed at the rear surface 200b of the second substrate 200. For example, the at least one third pad part 230 may be disposed at a middle portion adjacent to the first periphery portion of the rear surface 200b of the second substrate 200. The at least one third pad part 230 according to an embodiment may include a plurality of third pads (or input pads) which are spaced apart from one another by a certain interval. For example, the at least one third pad part 230 may include third pixel driving power pads, third data pads, third reference voltage pads, third gate pads, and third pixel common voltage pads.

The link line part 250 may be disposed between the second pad part 210 and the at least one third pad part 230 of the rear surface 200b of the second substrate 200. For example, the link line part 250 may include a plurality of link lines disposed between the second pad part 210 and the at least one third pad part 230.

The link line part 250 according to an embodiment of the present disclosure may include a plurality of pixel driving power link lines which individually (or a one-to-one relationship) couple the second pixel driving power pads to the third pixel driving power pads, a plurality of data link lines which individually (or a one-to-one relationship) couple the second data pads to the third data pads, a plurality of reference voltage link lines which individually (or a one-to-one relationship) couple the second reference voltage pads to the third reference voltage pads, a plurality of gate link lines which individually (or a one-to-one relationship) couple the second gate pads to the third gate pads, and a plurality of pixel common voltage link lines which individually (or a one-to-one relationship) couple the second pixel common voltage pads to the third pixel common voltage pads.

Each of the plurality of pixel common voltage link lines may include a first common link line 251 and a second common link line 253. The first common link line 251 may be disposed between the second pad part 210 and the at least one third pad part 230 and commonly coupled to the plurality of second pixel common voltage pads. The second common link line 253 may be commonly coupled to the plurality of third pixel common voltage pads and electrically coupled to the first common link line 251. The second common link line 253 may be disposed on a different layer from the first common link line 251 and may be electrically connected to the first common link line 251 through a via hole. A size of the second common link line 253 may progressively increase in a direction from the third pad part 230 to the periphery portion of the second substrate 200 in order to minimize (or reduce) the voltage drop of the pixel common voltage.

Referring to FIGS. 7 and 8, the second substrate 200 according to an embodiment of present disclosure may include a metal pattern layer and an insulation layer which insulates the metal pattern layer.

The metal pattern layer (or a conductive pattern layer) may include a plurality of metal layers. The metal pattern layer according to an embodiment may include a first metal layer 201, a second metal layer 203, and a third metal layer 205. The insulation layer may include a plurality of insulation layers. For example, the insulation layer may include a first insulation layer 202, a second insulation layer 204, and a third insulation layer 206. The insulation layer may be referred to as a rear insulation layer or a pattern insulation layer.

The first metal layer 201 may be implemented over a rear surface 200b of a second substrate 200. The first metal layer 201 according to an embodiment may include a first metal pattern. For example, the first metal layer 201 may be referred to as a first link layer or a link line layer.

The first metal pattern according to an embodiment may have a two-layer structure (Cu/MoTi) of Cu and MoTi. The first metal pattern may be used as a link line of the link line part 250, and thus, their repetitive descriptions are omitted.

The first insulation layer 202 may be implemented over the rear surface 200b of the second substrate 200 to cover the first metal layer 201. The first insulation layer 202 according to an embodiment may include an inorganic material.

The second metal layer 203 may be implemented over the first insulation layer 202. The second metal layer 203 according to an embodiment may include a second metal pattern. For example, the second metal layer 203 may be referred to as a second link layer, a jumping line layer, or a bridge line layer.

The second metal pattern according to an embodiment may have a two-layer structure (Cu/MoTi) of Cu and MoTi. The second metal pattern may be used as a plurality of gate link lines of a plurality of link lines in the link line part 250, but embodiments of the present disclosure are not limited thereto. For example, the second metal layer 203 may be used as a jumping line (or a bridge line) for electrically connecting the link lines which are formed of different metal materials on different layers in the link line part 250.

Optionally, a link line (for example, a plurality of first link lines) disposed at the second metal layer 203 may be modified to be disposed at the first metal layer 201, and a link line (for example, a plurality of second link lines) disposed at the first metal layer 201 may be modified to be disposed at the second metal layer 203.

The second insulation layer 204 may be implemented over the rear surface 200b of the second substrate 200 to cover the second metal layer 203. The second insulation layer 204 according to an embodiment may include an inorganic material.

The third metal layer 205 may be implemented over the second insulation layer 204. The third metal layer 205 according to an embodiment may include a third metal pattern. For example, the third metal layer 205 may be referred to as a third link layer or a pad electrode layer.

The third metal pattern according to an embodiment may have a stacked structure of at least two materials of ITO (or IZO), Mo, Ti, and MoTi. For example, the third metal pattern may have a three-layer structure of any one of ITO/Mo/ITO, ITO/MoTi/ITO, IZO/Mo/ITO, or IZO/MoTi/ITO. The third metal pattern may be used as pads 211 of the second pad part 210. For example, the pads 211 of the second pad part 210 formed of the third metal layer 205 may be electrically coupled to the first metal layer 201 through the pad contact holes formed at the first and second insulation layers 202 and 204.

The third insulation layer 206 may be implemented over the rear surface 200b of the second substrate 200 to cover the third metal layer 205. The third insulation layer 206 according to an embodiment may include an organic insulating material. For example, the third insulation layer 206 may include an insulating material such as photo acrylic or the like. The third insulation layer 206 may cover the third metal layer 205 to prevent the third metal layer 205 from being exposed at the outside. The third insulation layer 206 may be referred to as an organic insulation layer, a protection layer, a rear protection layer, an organic protection layer, a rear coating layer, or a rear cover layer.

Each of the plurality of second pads 211 disposed at the second pad part 210 may be electrically coupled to a link line of a link line part 250 made of the first metal layer 201 or the second metal layer 203 disposed at the rear surface 200b of the second substrate 200, through a second pad contact hole disposed at the first and second insulation layers 202 and 204. For example, the second data pad may be electrically coupled to one end of a data link line through the second pad contact hole disposed at the first and second insulation layers 202 and 204.

Referring to FIGS. 6 to 8, the coupling member 300 according to an embodiment of present disclosure may be disposed between the first substrate 100 and the second substrate 200. The first substrate 100 and the second substrate 200 may be opposite-bonded to each other by the coupling member 300. The coupling member 300 according to an embodiment may be a transparent adhesive member or a double-sided tape including an optically clear adhesive (OCA), an optically clear resin (OCR), or a pressure sensitive adhesive (PSA). The coupling member 300 according to another embodiment may include a glass fiber.

The coupling member 300 according to an embodiment may be disposed in a whole space between the first substrate 100 and the second substrate 200. For example, all of the second surface 100b of the first substrate 100 may be coupled to all of one surface of the coupling member 300, and all of a front surface 200a of the second substrate 200 may be coupled to all of the other surface of the coupling member 300.

The coupling member 300 according to another embodiment may be disposed in a pattern structure between the first substrate 100 and the second substrate 200. For example, the coupling member 300 may have a line pattern structure or a mesh pattern structure. The mesh pattern structure may further include a bent portion which discharges an air bubble, occurring between the first substrate 100 and the second substrate 200 in a process of bonding the first substrate 100 to the second substrate 200, to the outside.

Optionally, the coupling member 300 may further include a heat transfer element. In this case, the coupling member 300 may transfer heat, occurring in the first substrate 100, to the second substrate 200 through the heat transfer element to prevent or minimize an increase in temperature of the first substrate 100. The second substrate 200 may act as a temperature lowering member which prevents or minimizes an increase in temperature of the first substrate 100. For example, the heat transfer element may include a plurality of heat transfer particles or a heat transfer layer including a metal material. When the heat transfer element includes a heat transfer layer including a metal material, the heat transfer layer may be electrically grounded or floated, and thus, may act as a noise blocking layer which prevents frequency noise or static electricity, occurring in a driving circuit disposed at the rear surface 200b of the second substrate 200, from flowing into the pixels, the pixel driving lines, and the gate driving circuit 150, which are disposed at the first substrate 100.

Referring to FIGS. 6 to 8, the routing portion 400 according to an embodiment of present disclosure may be disposed to surround an outer surface OS of the first substrate 100 and an outer surface OS of the second substrate 200. For example, the routing portion 400 may be disposed at each of a first outer surface (or one surface) OS1a of the outer surface OS of the first substrate 100 and a first outer surface (or one surface) OS1b of the outer surface OS of the second substrate 200. For example, the routing portion 400 may be referred to as a side line portion, a side routing portion, an edge routing portion, an wiring portion, or the like.

The routing portion 400 according to an embodiment of present disclosure may include a plurality of routing lines 410 which are disposed at each of the first outer surface (or one surface) OS1a of the outer surface OS of the first substrate 100 and the first outer surface (or one surface) OS1b of the outer surface OS of the second substrate 200.

Each of the plurality of routing lines 410 may be formed to surround each of the first pad part 110, the first outer surface OS1a of the first substrate 100, the first outer surface OS1b of the second substrate 200, and the second pad part 210, and may be electrically coupled to the first pad part 110 and the second pad part 210 in a one-to-one relationship. According to an embodiment, each of the plurality of routing lines 410 may be formed by a printing process using a conductive paste. According to another embodiment, each of the plurality of routing lines 410 may be formed by a transfer process that transfers the conductive paste pattern to a transfer pad made of a flexible material and transfers the conductive paste pattern transferred to the transfer pad to the routing portion 400. For example, the conductive paste may be an Ag paste, but embodiments of the present disclosure are not limited thereto.

Each of the plurality of routing lines 410 may be electrically coupled to each of the pads 111 of the first pad part 110 and each of the second pads 211 of the second pad part 210. For example, each of the plurality of routing lines 410 may be spaced apart from each other along the first direction X.

According to another embodiment, in each of the plurality of routing lines 410, one end portion thereof may surround a first chamfer 100c and the first pads 111 of the first pad part 110 disposed at a first periphery portion of the first substrate 100, the other end portion thereof may surround a second chamfer 200c and the second pad 211 of the second pad part 210 disposed at a first periphery portion of the second substrate 200, and a center portion thereof between the one end portion and the other end portion may surround each of the first outer surface OS1a of the first substrate 100 and the first outer surface OS1b of the second substrate 200. For example, in a data routing line 410, one end portion thereof may be implemented to surround the first chamfer 100c and a first data pad of the first pad part 110 disposed at the first periphery portion of the first substrate 100, the other end portion thereof may be implemented to surround the second chamfer 200c and a second data pad of the second pad part 210 disposed at a first periphery portion of the second substrate 200, and a center portion thereof between the one end portion and the other end portion may be implemented to surround each of the first outer surface OS1a of the first substrate 100 and the first outer surface OS1b of the second substrate 200.

The plurality of routing lines 410 according to an embodiment of the present disclosure may be divided (classified) into a plurality of pixel power routing lines 411, a plurality of data routing lines 413, a plurality of reference voltage routing lines 415, a plurality of gate routing lines 417, and a plurality of pixel common voltage routing lines 419.

The plurality of pixel power routing lines 411 may be electrically coupled to the plurality of first pixel driving power pads of the first pad part 110 and the plurality of second pixel driving power pads of the second pad part 210 in a one-to-one relationship.

The plurality of data routing lines 413 may be electrically coupled to the plurality of first data pads of the first pad part 110 and the plurality of second data pads of the second pad part 210 in a one-to-one relationship.

The plurality of reference voltage routing lines 415 may be electrically coupled to the plurality of first reference voltage pads of the first pad part 110 and the plurality of second reference voltage pads of the second pad part 210 in a one-to-one relationship.

The plurality of gate routing lines 417 may be electrically coupled to the plurality of first gate pads of the first pad part 110 and the plurality of second gate pads of the second pad part 210 in a one-to-one relationship.

The plurality of pixel common voltage routing lines 419 may be electrically coupled to the plurality of first pixel common voltage pads of the first pad part 110 and the plurality of second pixel common voltage pads of the second pad part 210 in a one-to-one relationship.

The display apparatus or the routing portion 400 according to an embodiment of present disclosure may further include an edge coating layer 430.

The edge coating layer 430 may be implemented to cover the routing portion 400. The edge coating layer 430 may be implemented to cover the plurality of routing lines 410. For example, the edge coating layer 430 may be an edge protection layer or an edge insulating layer.

The edge coating layer 430 according to an embodiment may be implemented to cover all of the first periphery portion and the first outer surface OS1a of the first substrate 100 and the first periphery portion and the first outer surface OS1b of the second substrate 200 as well as the plurality of routing lines 410. The edge coating layer 430 may prevent the corrosion of each of the plurality of routing lines 410 including a metal material or electrical short circuit between the plurality of routing lines 410. Also, the edge coating layer 430 may prevent or minimize the reflection of external light caused by the plurality of routing lines 410 and the secondary pads 113 of the first pad part 110. As an embodiment, the edge coating layer 430 may include a light blocking material including black ink. As another embodiment, the edge coating layer 430 may implement (or configure) the outermost surface (or sidewall) of the display apparatus (or the display panel), and thus, may include an impact absorbing material (or substance) or a ductile material so as to prevent the damage of an outer surface OS of each of the first and second substrates 100 and 200. As another embodiment, the edge coating layer 430 may include a mixed material of a light blocking material and an impact absorbing material.

According to an embodiment, the edge coating layer 430 may be formed to surround one outer surface OS of each of the first and second substrates 100 and 200 on which the routing portion 400 is disposed.

According to another embodiment, as illustrated in FIGS. 6 to 8, the edge coating layer 430 may be formed to surround all of the other outer surfaces OS as well as the one outer surface OS of each of the first and second substrates 100 and 200 on which the routing portion 400 is disposed. For example, the edge coating layer 430 may be formed to surround all outer surfaces OS of each of the first and second substrates 100 and 200. In this case, the one outer surface OS (or a first outer surface) of each of the first and second substrates 100 and 200 may be surrounded by the plurality of routing lines 410 and the edge coating layer 430. The other outer surfaces OS (or second to fourth outer surfaces), except the one outer surface OS, of each of the first and second substrates 100 and 200 may be surrounded by only the edge coating layer 430. For example, the first outer surface of each of the first and second substrates 100 and 200 may include the plurality of routing lines 410 and the edge coating layer 430, and the second to fourth outer surfaces, except the first outer surface, of each of the first and second substrates 100 and 200 may include only the edge coating layer 430.

According to an embodiment, when the plurality of routing lines 410 and the edge coating layer 430 disposed at the first outer surface are referred to as a first sidewall structure, and the edge coating layer 430 disposed at the second to fourth outer surfaces are referred to as a second sidewall structure, the first sidewall structure and the second sidewall structure may have different thicknesses (or widths). For example, a thickness (or a width) of the second sidewall structure may be thinner or narrower than a thickness (or a width) of the first sidewall structure by a thickness of the plurality of routing lines 410.

Referring to FIG. 6, the display apparatus according to an embodiment of the present disclosure may further include a driving circuit part 500.

The driving circuit part 500 may drive (or emit light) the pixels P disposed on the first substrate 100 based on digital video data and a timing synchronization signal supplied from a display driving system to allow the display area AA to display an image corresponding to image data. The driving circuit part 500 may be coupled to the at least one third pad part 230 disposed at the rear surface 200b of the second substrate 200 and may output, to the at least one third pad part 230, a data signal, a gate control signal, and a driving power for driving (or emitting light) the pixels P disposed at the first substrate 100.

The driving circuit part 500 according to an embodiment may include a flexible circuit film 510, a driving integrated circuit (IC) 530, a printed circuit board (PCB) 550, a timing controller 570, and a power circuit 590.

The flexible circuit film 510 may be connected to the at least one third pad part 230 disposed at the rear surface 200b of the second substrate 200.

The driving IC 530 may be mounted on the flexible circuit film 510. The driving IC 530 may receive subpixel data and a data control signal provided from the timing controller 570, and convert the subpixel data into an analog data signal based on the data control signal to supply the analog data signal to a corresponding data line DL. The data signal may be supplied to a corresponding third data pads in the at least one third pad part 230 through the flexible circuit film 510.

The driving IC 530 may sense a characteristic value of a driving TFT disposed in the subpixel SP through the plurality of reference voltage lines (or pixel sensing line) RL disposed at the first substrate 100, generate sensing raw data corresponding to a sensing value for each subpixel, and provide the sensing raw data for each subpixel to the timing controller 570.

The PCB 550 may be coupled to the other side periphery portion of the flexible circuit film 510. The PCB 550 may transfer a signal and power between elements of the driving circuit part 500.

The timing controller 570 may be mounted on the PCB 550 and may receive the digital video data and the timing synchronization signal provided from the display driving system through a user connector disposed on the PCB 550. Alternatively, the timing controller 570 may not be mounted on the PCB 550 and may be implemented in the display driving system or may be mounted on a separate control board connected between the PCB 550 and the display driving system.

The timing controller 570 may align the digital video data based on the timing synchronization signal to generate pixel data matching a pixel arrangement structure disposed in the display area AA and may provide the generated pixel data to the driving IC 530.

The timing controller 570 may generate each of the data control signal and the gate control signal based on the timing synchronization signal, control a driving timing of the driving IC 530 based on the data control signal, and control a driving timing of the gate driving circuit 150 based on the gate control signal. For example, the timing synchronization signal may include a vertical synchronization signal, a horizontal synchronization signal, a data enable signal, and a main clock (or a dot clock).

The data control signal according to an embodiment of the present disclosure may include a source start pulse, a source shift clock, and a source output signal, or the like. The data control signal may be supplied to the driving IC 530 through the flexible circuit film 510.

The gate control signal according to an embodiment may include a start signal (or a gate start pulse), and a plurality of shift clocks, or the like. In this case, the plurality of shift clocks may include a plurality of scan clocks where phases thereof are sequentially shifted and a plurality of carry clocks where phases thereof are sequentially shifted. The gate control signal may be supplied to the gate driving circuit 150 through the at least one third pad part 230, the link line part 250, the second pad part 210, the routing portion 400, the first pad part 110, and gate control limes GCL.

The timing controller 570 may drive each of the driving IC 530 and the gate driving circuit 150 based on an external sensing mode during a predetermined external sensing period, generate compensation data of each subpixel for compensating for a characteristic variation of the driving TFT of each subpixel based on the sensing raw data provided from the driving IC 530, and modulate pixel data of each subpixel based on the generated compensation data of each subpixel. For example, the timing controller 570 may drive each of the driving IC 530 and the gate driving circuit 150 based on the external sensing mode for each external sensing period corresponding to a blank period (or a vertical blank period) of the vertical synchronization signal. For example, the external sensing mode may be performed in a process of powering on the display apparatus, a process of powering off the display apparatus, a process of powering off the display apparatus after being driven for a long time, or a blank period of a frame which is set in real time or periodically.

The timing controller 570 according to an embodiment may store the sensing raw data of each subpixel, provided from the driving IC 530, in a storage circuit based on the external sensing mode. Also, in a display mode, the timing controller 570 may correct pixel data which is to be supplied to each subpixel, based on the sensing raw data stored in the storage circuit and may provide corrected pixel data to the driving IC 530. Here, sensing raw data of each subpixel may include sequential variation information about each of a driving TFT and a self-emitting device, which are disposed in a corresponding subpixel. Therefore, in the external sensing mode, the timing controller 570 may sense a characteristic value (for example, a threshold voltage or mobility) of a driving TFT disposed in each subpixel and based thereon, may correct pixel data which is to be supplied to each subpixel, thereby minimizing or preventing the degradation in image quality caused by a characteristic value deviation of driving TFTs of a plurality of subpixels. The external sensing mode of a display apparatus may be technology known to those skilled in the art, and thus, its detailed description is omitted. For example, the display apparatus according to an embodiment of the present disclosure may sense a characteristic value of the driving TFT disposed in each subpixel based on a sensing mode disclosed in Korean Patent Publication No. 10-2016-0093179, 10-2017-0054654, or 10-2018-0002099.

The power circuit 590 may be mounted on the PCB 550 and may generate various source voltages used for displaying an image on the pixels P by using an input power supplied from the outside to provide the generated source voltage to a corresponding circuit. For example, the power circuit 590 may generate and output a logic source voltage used for driving of each of the timing controller 570 and the driving IC 530, the plurality of reference gamma voltages provided to the driving IC 530, and at least one gate driving power and at least one gate common power used for driving of the gate driving circuit 150. Also, the power circuit 590 may generate and output the pixel driving power and the pixel common voltage, but embodiments of the present disclosure are not limited thereto. For example, the driving IC 530 may generate and output the pixel driving power and the pixel common voltage based on the plurality of reference gamma voltages.

Referring to FIGS. 7, 8, and 10, a display apparatus or a first substrate 100 according to an embodiment of the present disclosure may include a first margin area MA1, a second margin area MA2, and a third margin area MA3 which are defined along periphery portions of outermost pixels Po. Each of the first margin area MA1, the second margin area MA2, and the third margin area MA3 may be a reliability securing area.

The first margin area MA1 may be defined as an area between an emission area EA of an outermost pixel P and an end portion EDt of a self-emitting device ED. The first margin area MA1 may have a first width between an end EAe of the emission area EA of the outermost pixel P and the end portion EDt of the self-emitting device ED, based on a reliability margin of the light emitting device layer EDL caused by the lateral penetration of water (or moisture). Also, the first margin area MA1 may have a first width W1 between an end EAe of the emission area EA of an outermost pixel Po and the end portion EDt of the self-emitting device ED, based on a reliability margin, for securing of reliability, of the light emitting device layer EDL caused by the lateral penetration of water (or moisture) and based on a shadow margin, for securing a shadow region of a self-emitting device material, based on a mask in a deposition process performed on the self-emitting device ED.

The first margin area MA1 according to an embodiment may have a first width W1 of 80 µm to 150 µm, but embodiments of the present disclosure are not limited thereto. For example, when a shortest distance between a center portion of the outermost pixel P and an outermost surface of the first substrate 100 is 300 µm to 310 µm, the first margin area MA1 may have the first width W1 of 80 µm to 100 µm, but embodiments of the present disclosure are not limited thereto.

The second margin area MA2 may be defined as an area corresponding to a region between the first margin area MA1 and a first pad part 110. The second margin area MA2 may have a second width between the first margin area MA1 and the first pad part 110, based on a reliability margin of the light emitting device layer EDL caused by the lateral penetration of water (or moisture). For example, the second margin area MA2 may be a water (or moisture) transmission prevention area, a water (or moisture) penetration prevention area, an inorganic material bonding area, or a liftoff process area.

The second margin area MA2 according to an embodiment may be greater than each of the first margin area MA1 and the third margin area MA3. For example, the second margin area MA2 may have a second width W2 of 100 µm to 130 µm, but embodiments of the present disclosure are not limited thereto. For example, when the shortest distance between the center portion of the outermost pixel Po and the outermost surface of the first substrate 100 is 300 µm to 310 µm, the second margin area MA2 may have the second width W2 of 100 µm to 130 µm, but embodiments of the present disclosure are not limited thereto.

The third margin area MA3 may be defined as an outermost periphery portion of the first substrate 100 with the first pad part 110 disposed therein. The third margin area MA3 may have a third width W3 between the second margin area MA2 and the outermost surface of the first substrate 100. The third width W3 of the third margin area MA3 may correspond to a width of the first pad part 110. For example, the third width W3 of the third margin area MA3 may correspond to a shortest distance between the outermost surface of the first substrate 100 and an end of the first pad part 110 closest to the second margin area MA2.

The third margin area MA3 according to an embodiment may be greater than the first margin area MA1 and less than the second margin area MA2. For example, the third margin area MA3 may have the third width W3 of 100 µm, but embodiments of the present disclosure are not limited thereto. For example, when the shortest distance between the center portion of the outermost pixel Po and the outermost surface of the first substrate 100 is 300 µm to 310 µm, the third margin area MA3 may have the third width W3 of 100 µm, but embodiments of the present disclosure are not limited thereto.

With respect to a first direction X or a second direction Y, a width of each of the first to third margin areas MA1 to MA3 may be set so that the shortest distance between the center portion of the outermost pixel Po and the outermost surface of the first substrate 100 is less than or equal to half of a pixel pitch.

According to an embodiment, a periphery portion of the self-emitting device ED of the light emitting device layer EDL may cover lateral surfaces of each of the planarization layer 102 and the bank 103 and may directly contact an uppermost surface of the circuit layer 101 in the first margin area MA1. For example, a periphery portion of the self-emitting device ED may directly contact a top surface (or a surface) of the passivation layer 101d in the first margin area MA1.

According to an embodiment, a periphery portion of a common electrode CE of the light emitting device layer EDL may wholly cover the self-emitting device ED and may directly contact the uppermost surface of the circuit layer 101 in a boundary region between the first margin area MA1 and the second margin area MA2. For example, the periphery portion of the common electrode CE may directly contact the top surface (or the surface) of the passivation layer 101d in the boundary region between the first margin area MA1 and the second margin area MA2. Accordingly, an end portion (or a tail portion) CEt of the common electrode CE may seal (or encapsulate) an interface (or a boundary portion) between an end portion (or a tail portion) EDt of the self-emitting device ED and the top surface (or the surface) of the passivation layer 101d.

According to an embodiment, the encapsulation layer 105 may wholly cover the light emitting device layer EDL and may directly contact the uppermost surface of the circuit layer 101 in the second margin area MA2. For example, a periphery portion of the encapsulation layer 105 may directly contact the top surface (or the surface) of the passivation layer 101d in the second margin area MA2, and thus, may seal (or encapsulate) an interface (or a boundary portion) between an end of the light emitting device layer EDL and the top surface (or the surface) of the passivation layer 101d.

According to an embodiment, a first encapsulation layer 105a of the encapsulation layer 105 may wholly cover the light emitting device layer EDL and may directly contact the uppermost surface of the circuit layer 101 in the second margin area MA2. For example, the first encapsulation layer 105a may fully cover or surround on the top surface the common electrode CE and may directly contact the top surface (or the surface) of the passivation layer 101d in the second margin area MA2. For example, a periphery portion (or a tail portion) 105at of the first encapsulation layer 105a may directly contact the top surface (or the surface) of the passivation layer 101d in the second margin area MA2, and thus, may seal (or encapsulate) an interface (or a boundary portion) between the end portion CEt of the common electrode CE and the top surface (or the surface) of the passivation layer 101d.

According to an embodiment, with respect to the first direction X or the second direction Y, a width of a direct contact portion between the first encapsulation layer 105a and the circuit layer 101 may be greater than a thickness of the common electrode CE so as to seal (or encapsulate) an interface (or a boundary portion) between the common electrode CE and the passivation layer 101d, and for example, may be 2 µm to 7 µm, but embodiments of the present disclosure are not limited thereto.

According to an embodiment, the first encapsulation layer 105a may have a shape based on a surface shape of the light emitting device layer EDL. For example, the first encapsulation layer 105a may include an uneven portion (or a concave-convex portion or a curved portion) corresponding to an uneven shape of the light emitting device layer EDL. For example, the first encapsulation layer 105a may include a 1-1$^{th}$ encapsulation region (or an uneven portion) which covers internal pixels and a partial region of an outermost pixel adjacent to the internal pixels, a 1-2$^{th}$ encapsulation region (or a first inclined portion) which is inclined from the uneven portion to the circuit layer 101 in the first margin area MA1, and a 1-3$^{th}$ encapsulation region (or a first edge portion) which extends from the 1-2$^{th}$ encapsulation region in the first margin area MA1 and directly contacts the top surface (or the surface) of the passivation layer 101d.

According to an embodiment, a second encapsulation layer 105b of the encapsulation layer 105 may wholly cover the first encapsulation layer 105a and may directly contact the uppermost surface of the circuit layer 101 in the second margin area MA2. For example, the second encapsulation layer 105b may fully cover or surround the first encapsulation layer 105a and may directly contact the top surface (or the surface) of the passivation layer 101d in the second margin area MA2. For example, a periphery portion (or a tail portion) 105b3 of the second encapsulation layer 105b may directly contact the top surface (or the surface) of the passivation layer 101d in the second margin area MA2, and thus, may seal (or encapsulate) an interface (or a boundary portion) between the end portion 105at of the first encapsulation layer 105a and the top surface (or the surface) of the passivation layer 101d.

According to an embodiment, with respect to the first direction X or the second direction Y, a width of a direct contact portion between the second encapsulation layer 105b and the circuit layer 101 may be greater than a thickness of the first encapsulation layer 105a so as to seal (or encapsulate) an interface (or a boundary portion) between the first encapsulation layer 105a and the passivation layer 101d, and for example, may be 3 µm to 7 µm, but embodiments of the present disclosure are not limited thereto.

The second encapsulation layer 105b according to an embodiment of the present disclosure may include a 2-1$^{th}$ encapsulation region 105b1 which covers the 1-1$^{th}$ encapsulation region of the first encapsulation layer 105a, a 2-2$^{th}$ encapsulation region 105b2 which covers the 1-2$^{th}$ encapsulation region of the first encapsulation layer 105a, and a 2-3$^{th}$ encapsulation region 105b3 which covers the 1-3$^{th}$ encapsulation region of the first encapsulation layer 105a.

The 2-1$^{th}$ encapsulation region 105b1 may provide a flat surface over the 1-1$^{th}$ encapsulation region of the first encapsulation layer 105a. For example, the 2-1$^{th}$ encapsulation region 105b1 may have a thickness which is four to ten times a thickness of the first encapsulation layer 105a. For example, the first encapsulation layer 105a may totally (or wholly) have a thickness of 1.0 µm or less, and the 2-1th encapsulation region 105b1 may have a thickness of 4.0 µm to 10 µm, but embodiments of the present disclosure are not limited thereto. For example, when the first encapsulation layer 105a has a thickness of 0.5 µm to 1.0 µm, the 2-1$^{th}$ encapsulation region 105b1 may have a thickness of 2.0 µm to 10 µm. For example, the 2-1$^{th}$ encapsulation region 105b1 may be a first flat encapsulation region or a first flat portion.

The 2-2$^{th}$ encapsulation region 105b2 may be inclined in the first margin area MA1 to cover the 1-2$^{th}$ encapsulation region of the first encapsulation layer 105a. The 2-2$^{th}$ encapsulation region 105b2 may have a thickness which is thinner (or smaller) than the 2-1$^{th}$ encapsulation region 105b1. For example, the 2-2$^{th}$ encapsulation region 105b2 may have a thickness which is two to four times a thickness of the first encapsulation layer 105a. For example, the first encapsulation layer 105a may totally (or wholly) have a thickness of 1.0 µm or less, and the 2-2$^{th}$ encapsulation region 105b2 may have a thickness of 2.0 µm to 4 µm, but embodiments of the present disclosure are not limited thereto. For example, when the first encapsulation layer 105a has a thickness of 0.5 µm to 1.0 µm, the 2-2$^{th}$ encapsulation region 105b2 may have a thickness of 1.0 µm to 5 µm. For example, the 2-2$^{th}$ encapsulation region 105b2 may be an inclined encapsulation region or a second inclined portion.

The 2-3$^{th}$ encapsulation region 105b3 may be formed flatly at a periphery portion of the first margin area MA1 and one side of the second margin area MA2 adjacent thereto to cover the 1-3$^{th}$ encapsulation region of the first encapsulation layer 105a. The 2-3$^{th}$ encapsulation region 105b3 may provide a flat surface over the 1-3$^{th}$ encapsulation region of the first encapsulation layer 105a. A periphery portion of the 2-3$^{th}$ encapsulation region 105b3 may directly contact the top surface (or the surface) of the passivation layer 101d in the second margin area MA2, and thus, may seal (or encapsulate) an interface (or a boundary portion) between the end portion 105at of the first encapsulation layer 105a and the top surface (or the surface) of the passivation layer 101d.

An end portion 105*bs* of the 2-3$^{th}$ encapsulation region 105*b*3 may be implemented as a vertical surface parallel to a thickness direction Z of the first substrate 100. For example, the 2-3$^{th}$ encapsulation region 105*b*3 may include a flat surface (or an uppermost surface) parallel to the first direction X or the second direction Y and a vertical sidewall parallel to the thickness direction Z of the first substrate 100.

A thickness (or a minimum thickness) of the 2-3$^{th}$ encapsulation region 105*b*3 may be between a minimum thickness of the 2-1$^{th}$ encapsulation region 105*b*1 and a minimum thickness of the 2-2$^{th}$ encapsulation region 105*b*2. For example, the minimum thickness of the 2-3$^{th}$ encapsulation region 105*b*3 may be between the minimum thickness of the 2-1$^{th}$ encapsulation region 105*b*1 and the minimum thickness of the 2-2$^{th}$ encapsulation region 105*b*2. The 2-3$^{th}$ encapsulation region 105*b*3 may have a thickness which is three to seven times a minimum thickness of the first encapsulation layer 105*a*. For example, the first encapsulation layer 105*a* may totally (or wholly) have a thickness of 1.0 μm or less, and the 2-3$^{th}$ encapsulation region 105*b*3 may have a thickness of 3 μm to 7 μm, but embodiments of the present disclosure are not limited thereto. For example, when the first encapsulation layer 105*a* has a thickness of 0.5 μm to 1.0 μm, the 2-3$^{th}$ encapsulation region 105*b*3 may have a thickness of 1.5 μm to 7 μm. For example, the 2-3$^{th}$ encapsulation region 105*b*3 may be a second flat encapsulation region or a second edge portion.

According to an embodiment, a third encapsulation layer 105*c* of the encapsulation layer 105 may wholly cover the second encapsulation layer 105*b* and may directly contact the uppermost surface of the circuit layer 101 in the second margin area MA2. For example, the third encapsulation layer 105*c* may fully cover the second encapsulation layer 105*b* and may directly contact the top surface (or the surface) of the passivation layer 101*d* in the second margin area MA2. For example, a periphery portion of the third encapsulation layer 105*c* may directly contact the top surface (or the surface) of the passivation layer 101*d* in the second margin area MA2, and thus, may seal (or encapsulate) an interface (or a boundary portion) between an end portion (or a vertical sidewall) of the second encapsulation layer 105*b* and the top surface (or the surface) of the passivation layer 101*d*.

According to an embodiment, with respect to the first direction X or the second direction Y, the third encapsulation layer 105*c* may directly contact a top surface (or a surface) of the circuit layer 101*a*, and a width of a direct contact portion between the third encapsulation layer 105*c* and the circuit layer 101 may be relatively wider than each of the first encapsulation layer 105*a* and the second encapsulation layer 105*b*, so as to sufficiently secure the reliability of the light emitting device layer EDL against the penetration of water (or moisture) and to fully seal (or encapsulate) an interface (or a boundary portion) between the second encapsulation layer 105*b* and the passivation layer 101*d*. For example, with respect to the first direction X or the second direction Y, a width of a direct contact portion between the third encapsulation layer 105*c* (or a third edge portion of the third encapsulation layer 105*c* described below) and the uppermost surface of the circuit layer 101 may be several tens times greater (or wider) than a width of a direct contact portion between the uppermost surface of the circuit layer 101 and each of the first encapsulation layer 105*a* and the second encapsulation layer 105*b*. For example, a width of a direct contact portion between the third encapsulation layer 105*c* and the circuit layer 101 may be 40 to 60 times a width of a direct contact portion between the circuit layer 101 and each of the first encapsulation layer 105*a* and the second encapsulation layer 105*b*. For example, when a shortest distance between the center portion (or the central portion) of the outermost pixel Po and the outermost surface of the first substrate 100 is 300 μm to 310 μm, a width of a direct contact portion between the third encapsulation layer 105*c* and the circuit layer 101 may have a width of 90 μm to 120 μm, but embodiments of the present disclosure are not limited thereto.

According to an embodiment, the third encapsulation layer 105*c* may have a shape based on a surface shape of the second encapsulation layer 105*b*. For example, the third encapsulation layer 105*c* may include a 3-1$^{th}$ encapsulation region (or a second flat portion) which covers the 2-1$^{th}$ encapsulation region of the second encapsulation layer 105*b*, a 3-2$^{th}$ encapsulation region (or a third inclined portion) which covers the 2-2$^{th}$ encapsulation region of the second encapsulation layer 105*b*, a 3-3$^{th}$ encapsulation region (or a step portion or a staircase portion) which covers the 2-3$^{th}$ encapsulation region of the second encapsulation layer 105*b*, and a 3-4$^{th}$ encapsulation region (or a third edge portion) which extends from the step portion and directly contacts the top surface (or the surface) of the circuit layer 101 in the second margin area MA2.

The 3-4$^{th}$ encapsulation region may directly contact the top surface (or the surface) of the passivation layer 101*d* in the second margin area MA2, and thus, may seal (or encapsulate) an interface (or a boundary portion) between the end portion (or the vertical sidewall) of the second encapsulation layer 105*b* and the top surface (or the surface) of the passivation layer 101*d*.

According to an embodiment, when a shortest distance between the center portion (or the central portion) of the outermost pixel P and the outermost surface of the first substrate 100 is 300 μm to 310 μm, a shortest distance from the first pad part 110 to each of the first to third encapsulation layers 105*a* to 105*c* and the self-emitting device ED may be set as follows within a process error range of a manufacturing process, so that the shortest distance between the center portion of the outermost pixel Po and the outermost surface of the first substrate 100 is implemented to be less than or equal to half of the pixel pitch while sufficiently securing the reliability of the light emitting device layer EDL against the penetration of water (or moisture).

A shortest distance Ls1 between the first pad part 110 and an end of the third encapsulation layer 105*c* may be set to at least 10 μm. A shortest distance Ls2 between the first pad part 110 and an end portion (or a vertical sidewall) 105*bs* of the second encapsulation layer 105*b* may be set to 100 μm to 110 μm. A shortest distance Ls3 between the first pad part 110 and the end portion 105*at* of the first encapsulation layer 105*a* may be set to 100 μm to 115 μm. A shortest distance Ls4 between the first pad part 110 and the end portion EDt of the self-emitting device ED may be set to 100 μm to 120 μm.

The encapsulation layer 105 may be surrounded by a protection layer 107*b* of a wavelength conversion layer 107.

The protection layer 107*b* may be implemented to directly contact the third encapsulation layer 105*c* and to surround the third encapsulation layer 105*c*. For example, a periphery portion of the protection layer 107*b* may be disposed in the second margin area MA2 close to the third margin area MA3 to directly contact the passivation layer 101*d* disposed in the second margin area MA2, and thus, may surround the end of the third encapsulation layer 105*c*.

As described above, in the display apparatus 10 according to an embodiment of the present disclosure, the self-emitting device ED may be surrounded or sealed by a quadruple seal structure based on the common electrode CE and the first to third encapsulation layers 105a to 105c of the encapsulation layer 105, and thus, a reduction in reliability of the self-emitting device ED caused by the lateral penetration of water (or moisture) may be prevented and a width of the first margin area MA1 may be greatly reduced, whereby the shortest distance between the center portion of the outermost pixel Po and the outermost surface of the first substrate 100 is implemented to be less than or equal to half of the pixel pitch. Accordingly, the display apparatus 10 according to an embodiment of the present disclosure may have an air bezel structure which prevents a reduction in reliability of the self-emitting device ED and has a zero bezel or where a bezel area is not provided.

Figure 11:
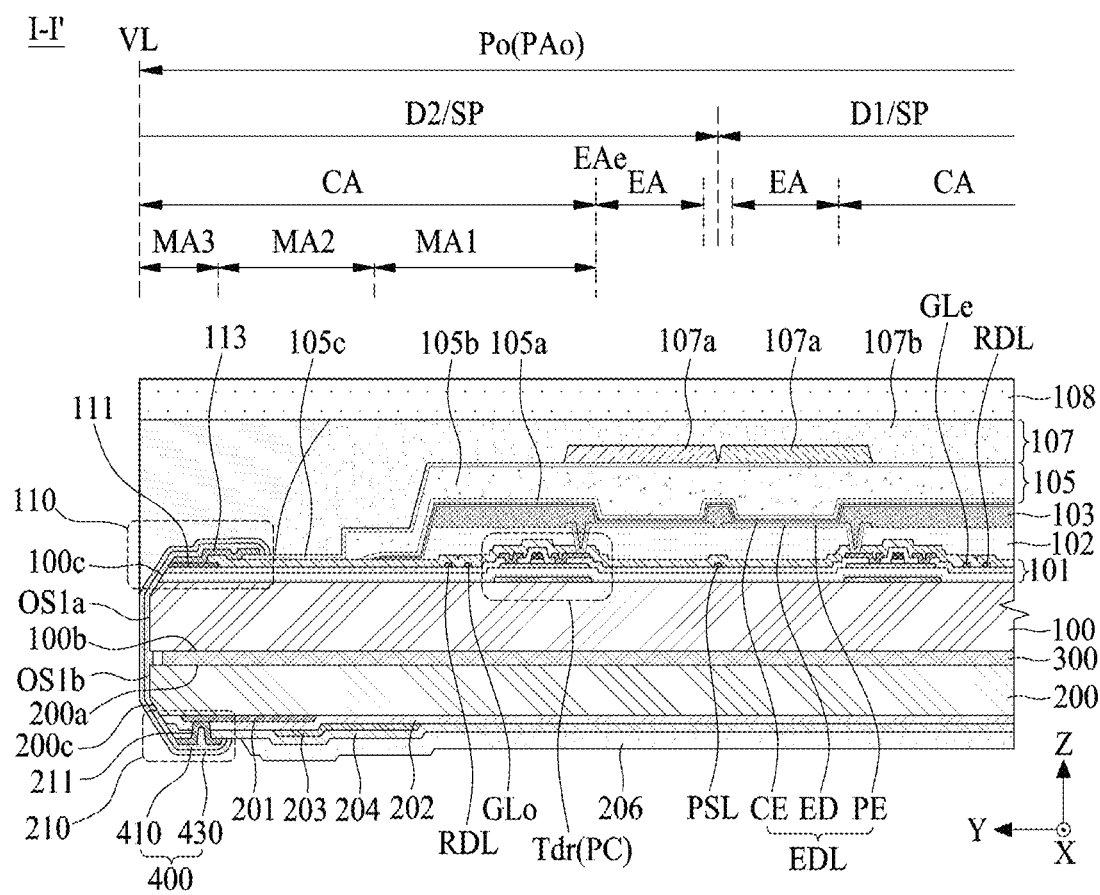
FIG. 11 is another cross-sectional view taken along line I-I' illustrated in FIG. 6 according to an alternative embodiment.

FIG. 11 is another cross-sectional view taken along line I-I' illustrated in FIG. 6 and illustrates an embodiment where a secondary pad is additionally provided to the display apparatus illustrated in FIGS. 1 to 10. In the following description, repeated descriptions of elements other than a secondary pad and elements relevant thereto are omitted or will be briefly given.

Referring again to FIGS. 6 and 11, the display apparatus 10 or the first pad part 110 according to an embodiment of the present disclosure may further include a plurality of secondary pads 113. For example, the first pad part 110 according to another embodiment may further include a plurality of secondary pads 113.

Each of the plurality of secondary pads 113 may be disposed at the first pad part 110 so as to be electrically coupled to each of the plurality of first pads 111 in a one-to-one relationship. Each of the plurality of secondary pads 113 may be disposed over the circuit layer 101 of the first pad part 110 to cover each of the plurality of first pads 111. For example, each of the plurality of secondary pads 113 may be disposed over the passivation layer 101d of the first pad part 110 to cover each of the plurality of first pads 111.

Each of the plurality of secondary pads 113 may be disposed over a corresponding first pad 111 of the plurality of first pads 111 and the passivation layer 101d and may have a length which is longer than the first pad 111. One side of each of the plurality of secondary pads 113 may be electrically and directly coupled to a corresponding first pad 111. Each of the plurality of secondary pads 113 according to an embodiment may include a single-layer structure including at least one of molybdenum (Mo), titanium (Ti), MoTi, copper (Cu), and silver (Ag).

The plurality of secondary pads 113 may be divided (or classified) into data secondary pads, gate secondary pads, pixel driving power secondary pads, reference voltage secondary pads, and pixel common voltage secondary pads.

Each of the plurality of secondary pads 113 according to an embodiment may have a line shape where the plurality of secondary pads 113 extend long along the second direction Y and are disposed spaced apart from one another along the first direction X or electrically separated from one another. For example, each of the plurality of secondary pads 113 may extend toward an inner portion of the display area AA from the outer surface OS of the first substrate 100 in the second direction Y, thereby extending a substantial length (or a size) of each of the first pads 111. Further, each of the plurality of secondary pads 113 may increase a contact area between the first pad 111 and the routing portion 400. Therefore, the secondary pad 113 may be referred to as a secondary pad electrode, an extension pad, a connection pad, a pad extension electrode, a pad extension line, a pad connection electrode, a pad connection line, an additional pad, or an auxiliary pad, or the like.

According to an embodiment, a portion of each of a plurality of first pads 111 disposed at a first pad part 110 and a portion of each of a plurality of second pads 211 disposed at a second pad part 210 may be removed or polished by a substrate polishing process and a substrate chamfering process performed after a bonding process (or a laminating process) of bonding a first substrate 100 to a second substrate 200 by using a coupling member 300.

A substrate polishing process according to an embodiment may simultaneously polish an outer surface OS1a of the first substrate 100, an outer surface OS1b of the second substrate 200, one side of each of the first pads 111, and one side of each of the second pads 211. For example, the first pads 111 may have a first width (or length) of 5 μm to 50 μm with respect to a lengthwise direction thereof or a second direction Y, but embodiments of the present disclosure are not limited thereto. For example, when a third margin area MA3 of the first substrate 100 has a width of 100 μm, each of the outer surface OS1a of the first substrate 100, the outer surface OS1b of the second substrate 200, the one side of each of the first pads 111, and the one side of each of the second pads 211 may be polished by 50 μm to 95 μm.

A substrate chamfering process according to an embodiment may form a first chamfer 100c at a corner portion between a first surface (or a front surface) and the outer surface OS1a of the first substrate 100 and may form a second chamfer 200c at a corner portion between a second surface (or a rear surface) and the outer surface OS1b of the second substrate 200, by using a cutting wheel, a polishing wheel, or a laser. For example, the first chamfer 100c may be formed at an angle of 45 degrees between the first surface and the outer surface OS1a of the first substrate 100, and thus, one end of each of the first pads 111 may be formed to be inclined by an angle of 45 degrees, but embodiments of the present disclosure are not limited thereto. Likewise, the second chamfer 200c may be formed to be inclined by an angle of 45 degrees between the second surface and the outer surface OS1b of the second substrate 200, and thus, one end of each of the second pads 211 may be formed to be inclined by an angle of 45 degrees, but embodiments of the present disclosure are not limited thereto.

After the substrate chamfering process, each of a plurality of secondary pads 113 may be disposed over a passivation layer 101d of the first pad part 110 to cover each of the plurality of first pads 111.

Each of the plurality of secondary pads 113 according to an embodiment may be implemented by a metal patterning process which does not use a photo process and an etching process. For example, each of the plurality of secondary pads 113 may be implemented by a printing process using a conductive paste, a transfer process of transferring a conductive paste pattern to a transfer pad including a ductile material to transfer a conductive paste pattern, a metal deposition process using a mask, a metal deposition process using a masking member, or a metal deposition process using a mask and a laser scribing process, but is not limited thereto.

According to an embodiment, in a metal deposition process using a mask, the plurality of secondary pads 113 may be formed through a metal deposition process using a mask including a plurality of opening portions respectively overlapping only the plurality of first pads 111.

According to an embodiment, in a metal deposition process using a masking member, a masking member including a plurality of opening portions respectively overlapping only the plurality of first pads 111 may be attached on the first pad part 110 of the first substrate 100, the plurality of secondary pads 113 may be formed through a metal deposition process using the masking member, and the plurality of secondary pads 113 may be formed through a process of removing (or stripping) the masking member.

According to an embodiment, in a metal deposition process using a mask and a laser scribing process, a region, other than the first pad part 110, of the first substrate 100 may be covered by a mask, a metal pad layer may be formed on the first pad part 110 of the first substrate 100 through the metal deposition process subsequently, and then, the plurality of secondary pads 113 may be formed by patterning the metal pad layer through the laser scribing process.

Each of the plurality of secondary pads 113 according to an embodiment may have a second length (or a second width) which is relatively longer than a first length (or a first width) of a corresponding first pad 111. Each of the plurality of secondary pads 113 may have a length of tens µm with respect to a lengthwise direction thereof or the second direction Y. For example, with respect to the lengthwise direction or the second direction Y, when each of the plurality of first pads 111 has a length of 50 µm or less, each of the plurality of secondary pads 113 may have a length of 50 µm to 150 µm, but embodiments of the present disclosure are not limited thereto. For example, each of the plurality of secondary pads 113 may have a length which is greater than or equal to at least 1.5 times of a corresponding first pad 111.

Additionally, the first pad part 110 according to an embodiment may further include a pad cover layer (or a clad layer) disposed between each of the plurality of first pads 111 and a corresponding secondary pad 113 of the plurality of secondary pads 113. The pad cover layer may perform a function of preventing the corrosion of the first pad 111. For example, the pad cover layer may include the same material as an uppermost metal layer of the pixel electrode PE. For example, the uppermost metal layer of the pixel electrode PE may be used as the pad cover layer.

Each of the plurality of secondary pads 113 may be electrically coupled to each of the plurality of routing lines 410 of the routing portion 400 in one-to-one relationship.

Each of the plurality of routing lines 410 may be electrically coupled to each of the secondary pads 113 of the first pad part 110 and each of the second pads 211 of the second pad part 210 in one-to-one relationship. For example, each of the plurality of routing lines 410 may be formed by a printing process using a conductive paste or a transfer process of transferring the conductive paste pattern by transferring the conductive paste pattern to a transfer pad of a flexible material. For example, the conductive paste may be an Ag paste, but embodiments of the present disclosure are not limited thereto.

According to another embodiment, in each of the plurality of routing lines 410, one end portion thereof may surround a first chamfer 100c and the secondary pads 113 of the first pad part 110 disposed at a first periphery portion of the first substrate 100, the other end portion thereof may surround a second chamfer 200c and the second pad 211 of the second pad part 210 disposed at a first periphery portion of the second substrate 200, and a center portion thereof between the one end portion and the other end portion may surround each of the first outer surface OS1a of the first substrate 100 and the first outer surface OS1b of the second substrate 200. For example, the one end portion of each of the plurality of routing lines 410 may directly contact with both the uppermost surface and the side surface of the secondary pads 113. The other end portion of each of the plurality of routing lines 410 may directly contact with both the rearmost surface and the side surface of the second pads 211. For example, in a data routing line 410, one end portion thereof may be implemented to surround the first chamfer 100c and a data secondary pad of the first pad part 110 disposed at the first periphery portion of the first substrate 100, the other end portion thereof may be implemented to surround the second chamfer 200c and a second data pad of the second pad part 210 disposed at a first periphery portion of the second substrate 200, and a center portion thereof between the one end portion and the other end portion may be implemented to surround each of the first outer surface OS1a of the first substrate 100 and the first outer surface OS1b of the second substrate 200.

As described above, each of the plurality of secondary pads 113 may be electrically and directly connected (or coupled) to a corresponding first pad 111, and thus, may extend a length of the corresponding first pad 111 to a length of tens µm and/or may increase a contact area between the first pad 111 and the routing portion 400.

The routing portion 400 may be covered by the edge coating layer 430, and thus, their repetitive descriptions are omitted.

As described above, according to another embodiments of the present disclosure, because the display apparatus further includes a secondary pad 113 electrically coupled to a first pad, a substantial length (or a size) of each of first pads may extend through the secondary pad 113, and thus, a contact area between the first pad 111 and a routing line 410 may increase in the air bezel structure, thereby preventing a contact defect between the first pad 111 and the routing line 410.

Figure 12A:
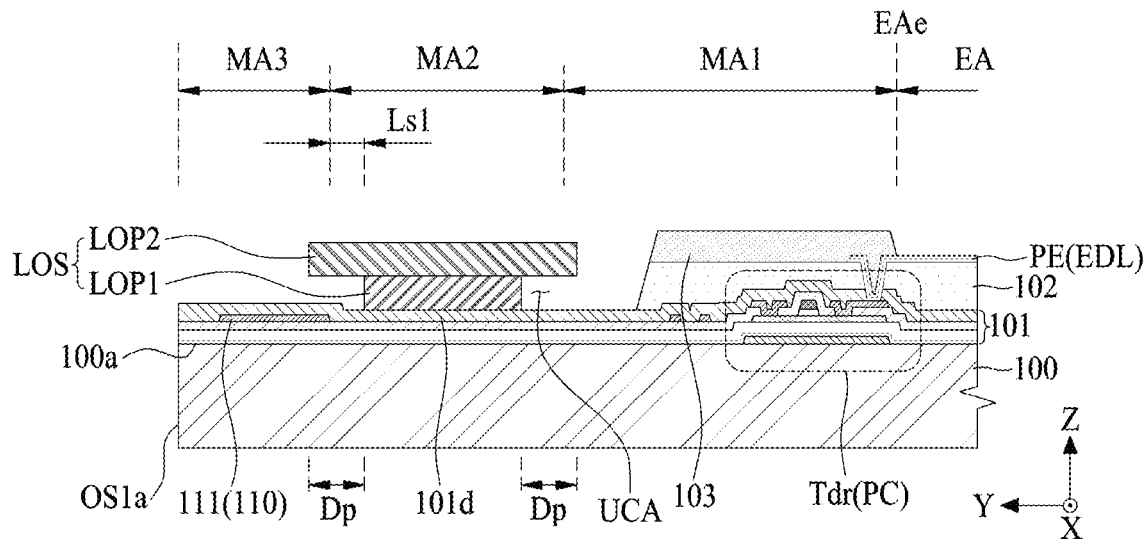
FIGS. 12A to 12H are diagrams illustrating a method of manufacturing the common electrode, the encapsulation layer, and the self-emitting device illustrated in FIGS. 7 to 10.
Figure 12B:
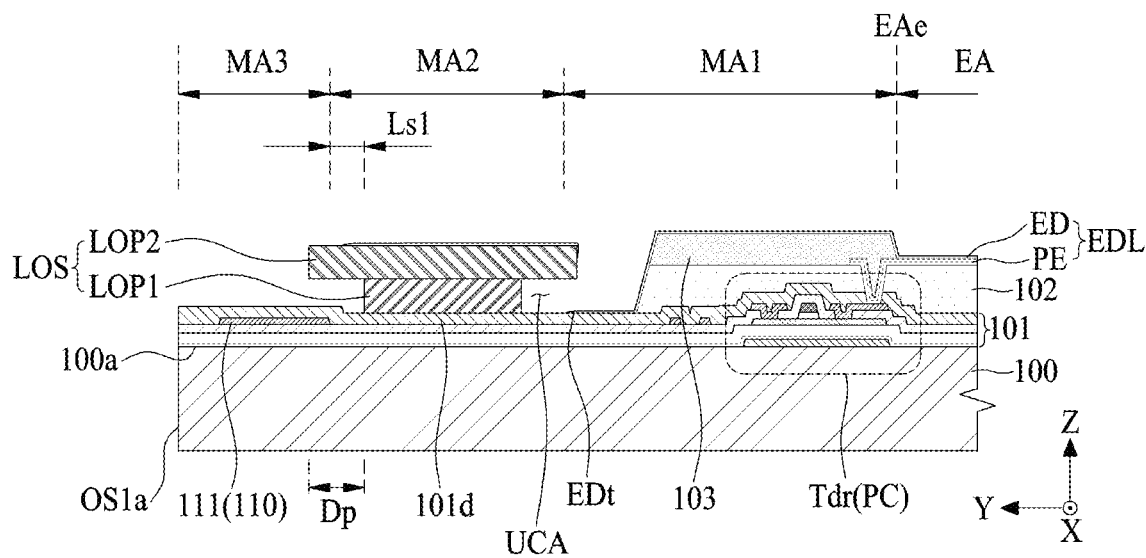
Figure 12C:
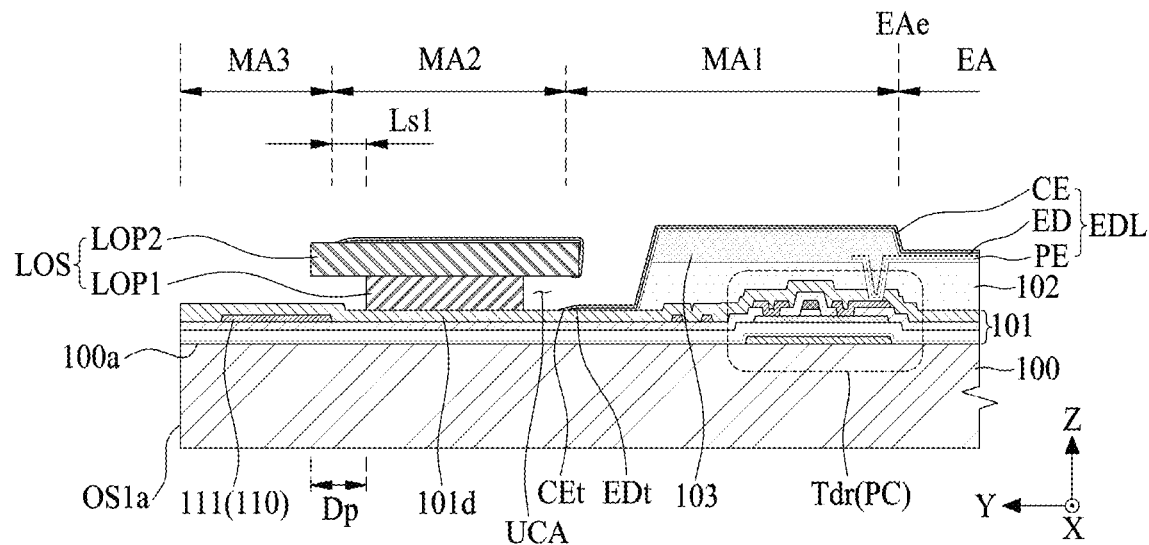
Figure 12D:
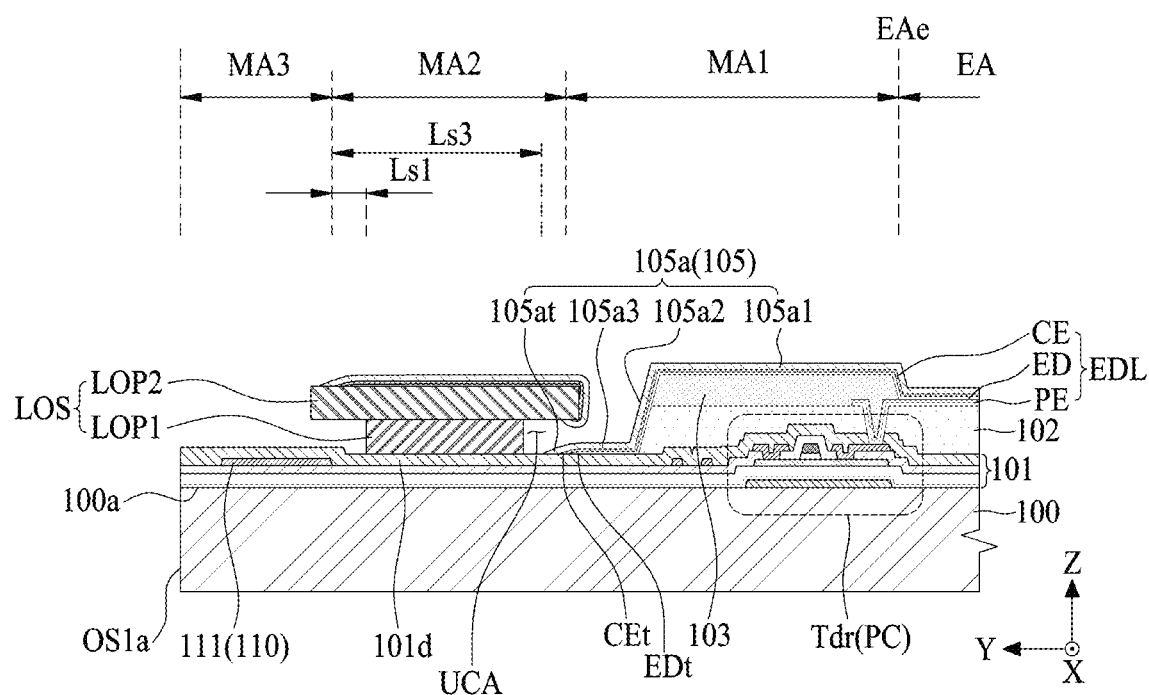
Figure 12E:
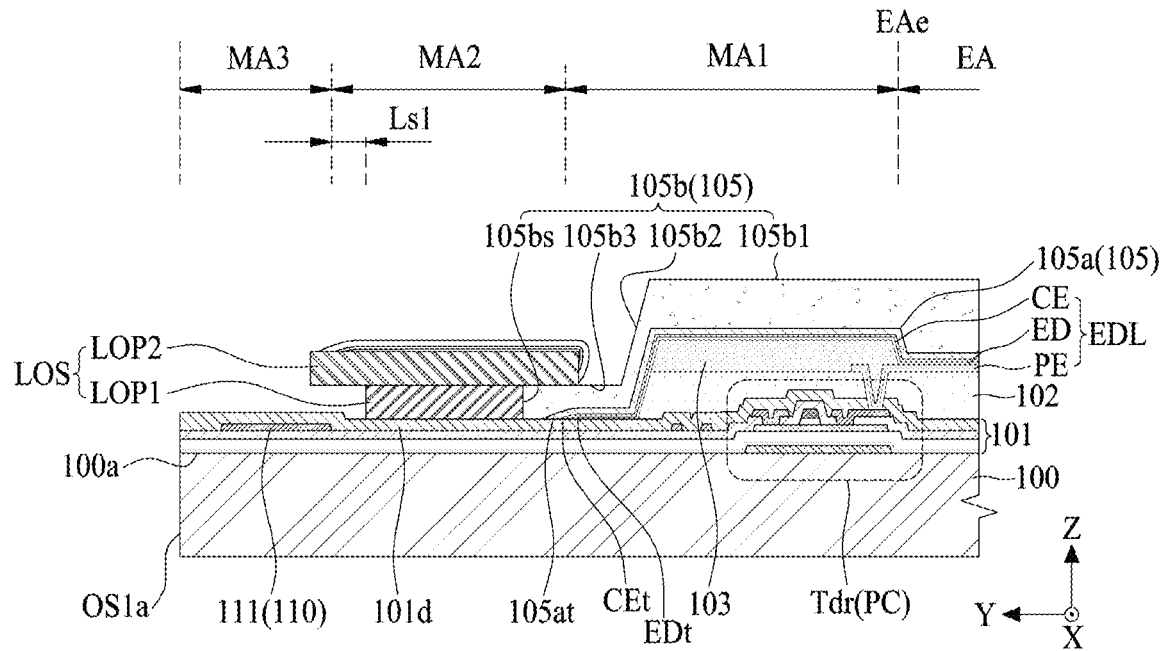
Figure 12F:
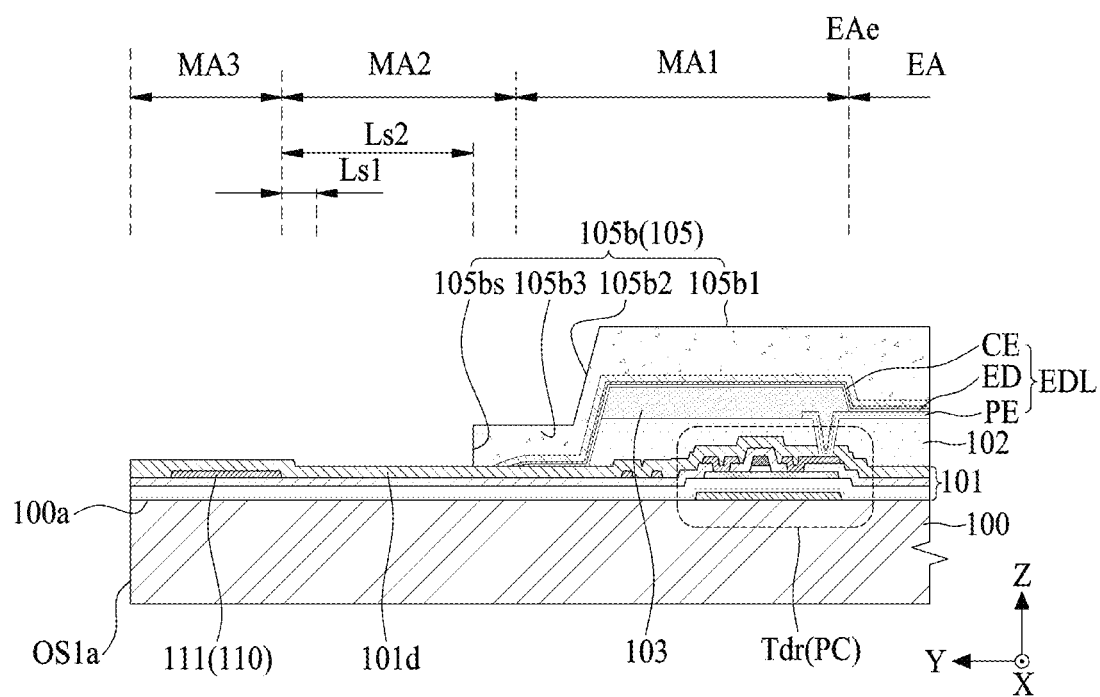
Figure 12G:
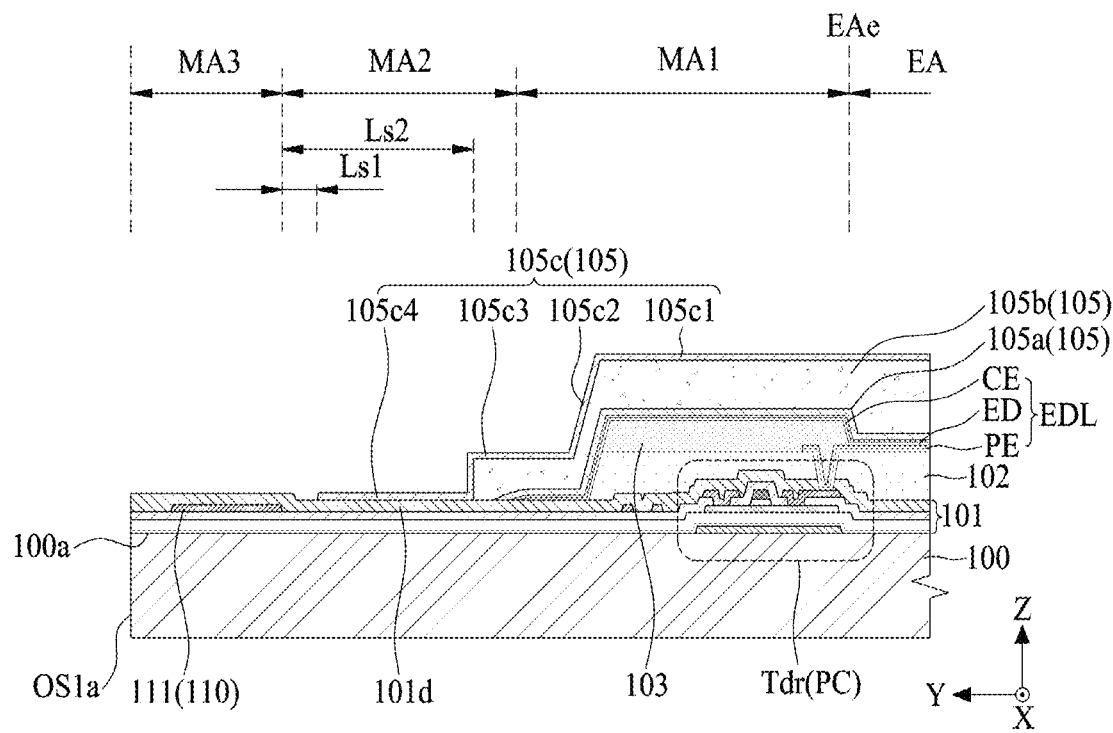
Figure 12H:
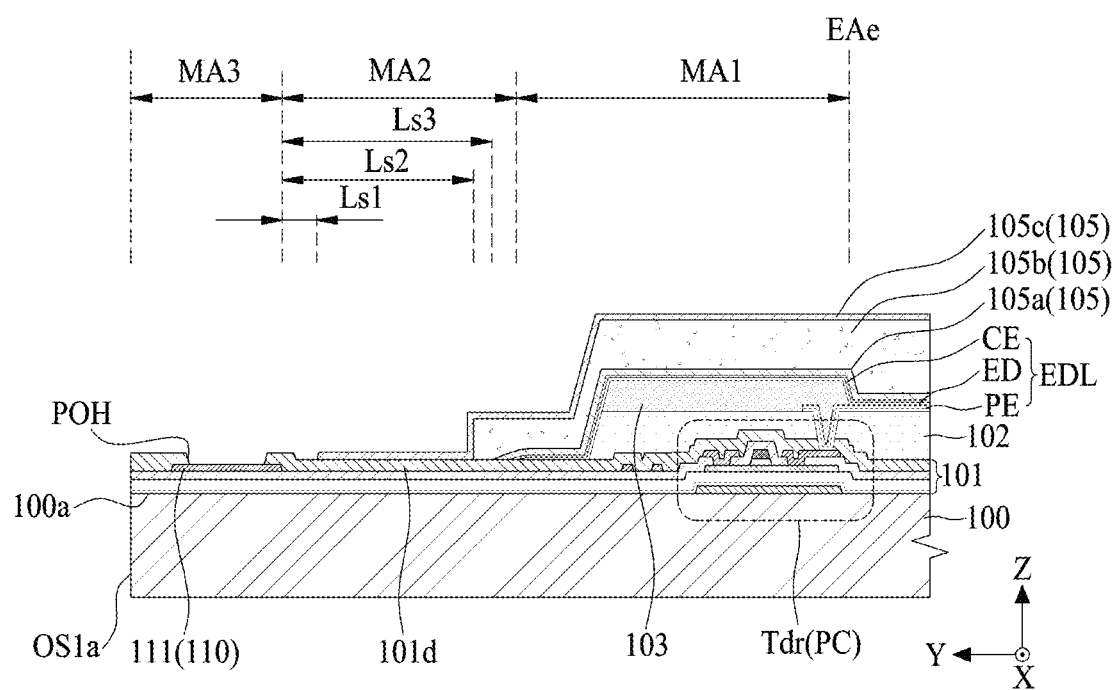
Figure 13:
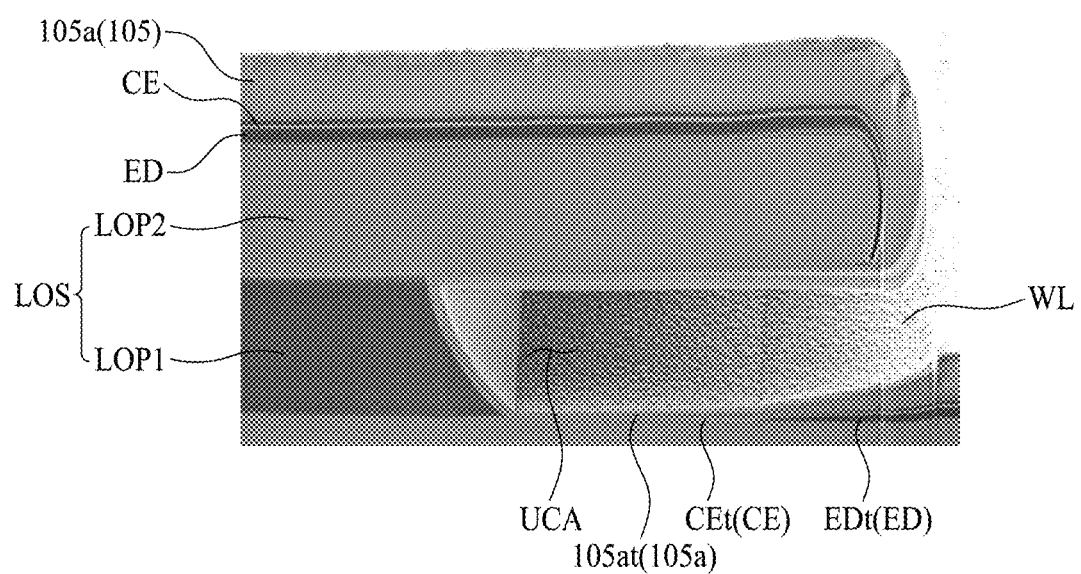
FIG. 13 is a photomicrograph associated with FIG. 12D.

FIGS. 12A to 12H are diagrams illustrating a method of manufacturing the common electrode, the encapsulation layer, and the self-emitting device illustrated in FIGS. 7 to 10, and FIG. 13 is a photomicrograph associated with FIG. 12D. In FIG. 13, a white layer WL may be a coating layer which is experimentally coated to recognize a cross-sectional structure of each of a liftoff pattern and a deposition material, and thus, may not correspond to an element of a display apparatus according to an embodiment of the present disclosure.

Referring to FIGS. 12A to 12H and 13, a method (or a liftoff process) of manufacturing a common electrode, an encapsulation layer, and a self-emitting device according to an embodiment of the present disclosure will be described below.

As illustrated in FIG. 12A, a liftoff structure LOS including a first liftoff pattern LOP1 and a second liftoff pattern LOP2 having an eaves structure with respect to the liftoff pattern LOP1 may be formed at a periphery portion of a first surface 100a of a first substrate 100.

The liftoff structure LOS may be formed at the periphery portion of the first surface 100a of the first substrate 100 where a bank 103 and a pixel electrode PE of a light emitting device layer EDL are disposed.

In a liftoff structure LOS according to an embodiment, a first liftoff pattern LOP1 and a second liftoff pattern LOP2 may be implemented by a process of sequentially forming (or coating) a first liftoff material and a second liftoff material on the first surface 100a of the first substrate 100, a process of exposing the second liftoff material, a process of sequentially patterning (or removing) the second liftoff material and the first liftoff material, and a process of baking the patterned first liftoff material and second liftoff material.

The second liftoff material according to an embodiment may include a photosensitive resist. For example, the second liftoff material may include a positive photoresist or a negative photoresist.

The first liftoff material according to an embodiment may include a material which is not denaturalized by an exposure process performed on the second liftoff material. For example, the first liftoff material may be polydimethylglutarimide (PMGI) or polymethylmethacrylate (PMMA). The first liftoff material may be referred to as an etch leading layer, a sacrificial layer, a liftoff resist layer, or a non-photosensitive layer.

A develop rate of the first liftoff material to a developer may be higher than a develop rate of the second liftoff material to a developer. For example, the second liftoff material may include an exposure portion exposed by an exposure process and a non-exposure portion, and the second liftoff pattern LOP2 may be implemented as the non-exposure portion of the second liftoff material. In this case, a patterning portion of the first liftoff material overlapping the exposure portion of the second liftoff material may be exposed to a developer as the exposure portion of the second liftoff material is removed by the developer, and the patterning portion of the first liftoff material exposed to the developer may be more quickly removed than the exposure portion of the second liftoff material. Accordingly, the first liftoff material may have a develop rate which is relatively higher than the second liftoff material, and thus, the first liftoff material may have an undercut structure with respect to the second liftoff material.

A lateral surface of the first liftoff pattern LOP1 according to an embodiment may have an undercut area (or a forward tapered structure) UCA with respect to the second liftoff pattern LOP2. For example, a boundary portion between the first liftoff pattern LOP1 and the second liftoff pattern LOP2 or an upper lateral surface of the first liftoff pattern LOP1 may be undercut by the second liftoff pattern LOP2. The second liftoff pattern LOP2 may protrude with respect to the lateral surface of the first liftoff pattern LOP1 based on the undercut area UCA of the first liftoff pattern LOP1, and thus, may cover the lateral surface of the first liftoff pattern LOP1. Accordingly, the second liftoff pattern LOP2 may have an eaves structure with respect to the first liftoff pattern LOP.

In the liftoff structure according to an embodiment, the first liftoff pattern LOP1 may be disposed in a second margin area MA2 defined over the first surface 100a of the first substrate 100. According to an embodiment, one lateral surface of the first liftoff pattern LOP1 may be spaced apart from a third margin area MA3 by a predetermined distance Ls1. For example, a separation distance (or a shortest distance) Ls1 between the one lateral surface of the first liftoff pattern LOP1 and the first pads 111 of the first pad part 110 disposed in the third margin area MA3 may be set to at least 10 μm, but embodiments of present disclosure are not limited thereto.

According to an embodiment, both lateral surfaces (or both sidewalls) of the second liftoff pattern LOP2 may protrude by a predetermined length Dp from both lateral surfaces (or both sidewalls) of the first liftoff pattern LOP1. A periphery portion of one side of the second liftoff pattern LOP2 may pass through a boundary portion between the second margin area MA2 and the third margin area MA3 and may overlap one side of the third margin area MA3. A distance Dp between one lateral surface (or the other lateral surface) of the second liftoff pattern LOP2 and one lateral surface (or the other lateral surface) of the first liftoff pattern LOP1 may be longer or greater than the separation distance (or the shortest distance) Ls1 between the one lateral surface of the first liftoff pattern LOP1 and the first pads 111. For example, the distance Dp between the one lateral surface (or the other lateral surface) of the second liftoff pattern LOP2 and the one lateral surface (or the other lateral surface) of the first liftoff pattern LOP1 may be set to at least 15 μm, but embodiments of present disclosure are not limited thereto.

According to another embodiment, each of the first liftoff pattern LOP1 and the second liftoff pattern LOP2 may be disposed in the second margin area MA2 and the third margin area MA3 defined in the first surface 100a of the first substrate 100. According to an embodiment, one periphery portion of each of the first liftoff pattern LOP1 and the second liftoff pattern LOP2 may be disposed to cover at least a portion of the third margin area MA3. The other lateral surface (or the other sidewall) of the second liftoff pattern LOP2 may protrude by the predetermined length Dp from the other lateral surface (or the other sidewall) of the first liftoff pattern LOP1. Accordingly, the second liftoff pattern LOP2 may have an eaves structure with respect to the other lateral surface (or the other sidewall) of the first liftoff pattern LOP1.

Subsequently, as illustrated in FIG. 12B, a self-emitting device ED of a light emitting device layer EDL may be formed (or deposited) over the first surface 100a of the first substrate 100 where a liftoff structure LOS is formed.

The self-emitting device ED may be disposed on the bank 103 and the pixel electrode PE exposed at the emission area EA of each pixel, and moreover, may be disposed over the second liftoff pattern LOP2 of the liftoff structure LOS and in the first margin area MA1 over the first surface 100a of the first substrate 100. In this case, an end portion (or a tail portion) EDt of the self-emitting device ED may be inserted into a partial region of the undercut area UCA of the first liftoff pattern LOP1 covered by the second liftoff pattern LOP2 and may directly contact a passivation layer 101d exposed at the undercut area UCA of the first liftoff pattern LOP1. Accordingly, a portion, disposed over the second liftoff pattern LOP2, of the self-emitting device ED may be physically separated (or spaced apart) from a portion, directly contacting the passivation layer 101d, of the self-emitting device ED, in the second margin area MA2 of the first substrate 100.

In a deposition process performed on the self-emitting device ED, a position of an end portion EDt of a self-emitting device material should be set based on a shadow region of a light emitting device material inevitably generated based on a distance between a deposition mask and the first substrate 100. However, a shadow region of the self-emitting device ED according to an embodiment of the present disclosure may overlap the second liftoff pattern LOP2 and may be controlled or set based on a protrusion length of the second liftoff pattern LOP2. Therefore, in the display apparatus according to an embodiment of the present disclosure, the shadow region of the light emitting device material may not be reflected in the deposition process performed on the self-emitting device ED, and thus, a width of the first margin area MA1 based on the shadow region of the light emitting device material may be considerably reduced. Accordingly, a shortest distance between a center portion of each of outermost pixels and an outer surface OS1a of the first substrate 100 may be implemented to be less than or equal to half of the pixel pitch.

Subsequently, as illustrated in FIG. 12C, a common electrode CE of the light emitting device layer EDL may be formed (or deposited) over the first surface 100a of the first substrate 100 where the self-emitting device ED of the light emitting device layer EDL is formed.

The common electrode CE may be formed to cover the self-emitting device ED of the light emitting device layer EDL. Particularly, an end portion (or a second tail portion) CEt of the common electrode CE may be inserted into the undercut area UCA of the first liftoff pattern LOP1 and may directly contact the passivation layer 101d exposed at the undercut area UCA of the first liftoff pattern LOP1, thereby surrounding the end portion EDt of the self-emitting device ED. A portion, disposed over the second liftoff pattern LOP2, of the common electrode CE may be physically separated (or spaced apart) from a portion, directly contacting the passivation layer 101d, of the common electrode CE, in the second margin area MA2 of the first substrate 100. The end portion CEt of the common electrode CE may cover a boundary portion (or an interface) between the end portion EDt of the self-emitting device ED and the uppermost surface of the passivation layer 101d. Therefore, the end portion EDt of the self-emitting device ED may be fully surrounded or covered by the passivation layer 101d and the common electrode CE, and thus, the lateral penetration of water (or moisture) may be prevented.

Subsequently, as illustrated in FIG. 12D, a first encapsulation layer 105a of an encapsulation layer 105 may be formed (or deposited) over the first surface 100a of the first substrate 100 where the light emitting device layer EDL is formed.

The first encapsulation layer 105a may be formed to wholly cover the light emitting device layer EDL. The first encapsulation layer 105a according to an embodiment may include a 1-1$^{th}$ encapsulation region (or an uneven portion) 105a1 which covers internal pixels and a partial region of an outermost pixel adjacent to the internal pixels, a 1-2$^{th}$ encapsulation region (or an inclined portion) 105a2 which is inclined from the uneven portion 105a1 in the first margin area MA1, and a 1-3$^{th}$ encapsulation region (or a periphery portion) 105a3 which extends from the 1-2$^{th}$ encapsulation region 105a2 in the first margin area MA1 and directly contacts the top surface (or the surface) of the passivation layer 101d.

The 1-3$^{th}$ encapsulation region 105a3 of the first encapsulation layer 105a or an end portion (or a third tail portion) 105at of the first encapsulation layer 105a may be inserted into the undercut area UCA of the first liftoff pattern LOP1 and may directly contact the passivation layer 101d exposed at the undercut area UCA of the first liftoff pattern LOP1, thereby surrounding the end portion CEt of the common electrode CE. Therefore, in the second margin area MA2 of the first substrate 100, a portion, disposed over the second liftoff pattern LOP2, of the first encapsulation layer 105a may be physically separated (or spaced apart) from a portion, directly contacting the passivation layer 101d, of the first encapsulation layer 105a. An end portion 105at of the first encapsulation layer 105a may cover a boundary portion (or an interface) between the end portion CEt of the common electrode CE and the uppermost surface of the passivation layer 101d. Accordingly, the light emitting device layer EDL may be fully surrounded or covered by the passivation layer 101d and the first encapsulation layer 105a, and thus, the lateral penetration of water (or moisture) may be prevented. For example, a shortest distance Ls3 between the first pad part 110 and the end portion 105at of the first encapsulation layer 105a may be set to 100 μm to 115 μm.

Subsequently, as illustrated in FIGS. 12D and 12E, a second encapsulation layer 105b of the encapsulation layer 105 may be formed (or coated) over the first surface 100a of the first substrate 100 where the first encapsulation layer 105a of the encapsulation layer 105 is formed.

The second encapsulation layer 105b may be formed to wholly cover the first encapsulation layer 105a. The second encapsulation layer 105b according to an embodiment of the present disclosure may include a 2-1$^{th}$ encapsulation region 105b1 which covers the 1-1$^{th}$ encapsulation region 105a1 of the first encapsulation layer 105a, a 2-2$^{th}$ encapsulation region 105b2 which covers the 1-2$^{th}$ encapsulation region 105a2 of the first encapsulation layer 105a, and a 2-3$^{th}$ encapsulation region 105b3 which covers the 1-3$^{th}$ encapsulation region 105a3 of the first encapsulation layer 105a.

According to an embodiment of the present disclosure, the 2-1$^{th}$ encapsulation region 105b1 may have a thickness which is four to ten times a thickness of the first encapsulation layer 105a. The 2-2$^{th}$ encapsulation region 105b2 may have a thickness which is two to four times a thickness of the first encapsulation layer 105a. The 2-3$^{th}$ encapsulation region 105b3 may have a thickness which is thinner (or smaller) than the 2-1$^{th}$ encapsulation region 105b1 and thicker (or greater) than the 2-2$^{th}$ encapsulation region 105b2. The 2-3th encapsulation region 105b3 according to an embodiment of the present disclosure may have a thickness which is three to seven times a thickness of the first encapsulation layer 105a. At least one of a viscosity, a coating amount per unit area, and a coating amount of a periphery portion of the second encapsulation layer 105b may be implemented or set so that each of the 2-2$^{th}$ encapsulation region 105b2 and the 2-3$^{th}$ encapsulation region 105b3 has a thickness which is thinner (or smaller) than the 2-1$^{th}$ encapsulation region 105b1.

The 2-3$^{th}$ encapsulation region 105b3 of the second encapsulation layer 105b or an end portion of the second encapsulation layer 105b may be inserted into the undercut area UCA of the first liftoff pattern LOP1 and may directly contact the passivation layer 101d disposed in the first margin area MA1, thereby covering the end portion 105at of the first encapsulation layer 105a. Also, the end portion of the second encapsulation layer 105b may directly contact an inner surface of the first liftoff pattern LOP1, and thus, may include an outermost vertical sidewall 105bs which is vertical to a top surface of the passivation layer 101d. According to an embodiment of the present disclosure, the outermost vertical sidewall 105bs of the second encapsulation layer 105b may be spaced apart from the end portion EDt of the self-emitting device ED by 10 μm to 15 μm. The outermost vertical sidewall 105bs of the second encapsulation layer 105b may be spaced apart from the end portion 105at of the first encapsulation layer 105a by 5 μm to 10 μm.

Subsequently, as illustrated in FIG. 12F, the liftoff structure LOS including the first liftoff pattern LOP1 and the second liftoff pattern LOP2 disposed over the first surface 100a of the first substrate 100 where the first encapsulation layer 105a of the encapsulation layer 105 is formed may be removed through a liftoff process. Accordingly, a shortest distance Ls2 between the outermost vertical sidewall 105bs of the second encapsulation layer 105b and the first pad part 110 may be set to 100 μm to 110 μm.

Optionally, a heated solvent may be used for decreasing a time taken in performing a liftoff process on the first liftoff pattern LOP1 and the second liftoff pattern LOP2, or an ultrasonic cleaning process may be applied.

Subsequently, as illustrated in FIGS. 12F and 12G, a third encapsulation layer 105c may be formed (or deposited) over the second encapsulation layer 105b of the encapsulation layer 105 over the first surface 100a of the first substrate 100 from which the liftoff structure LOS has been removed.

The third encapsulation layer 105c may be formed to wholly surround a top surface, lateral surfaces, and an end portion of the second encapsulation layer 105b and may directly contact an uppermost surface of the passivation layer 101d in the second margin area MA2.

According to an embodiment, the third encapsulation layer 105c may have a shape based on a surface shape of the second encapsulation layer 105b. For example, the third encapsulation layer 105c may include a 3-1$^{th}$ encapsulation region (or a first flat portion) 105c1 which covers the 2-1$^{th}$ encapsulation region 105b1 of the second encapsulation layer 105b, a 3-2$^{th}$ encapsulation region (or an inclined portion) 105c2 which covers the 2-2$^{th}$ encapsulation region 105b2 of the second encapsulation layer 105b, a 3-3$^{th}$ encapsulation region (or a step portion or a staircase portion) 105c3 which covers the 2-3$^{th}$ encapsulation region 105b3 of the second encapsulation layer 105b, and a 3-4$^{th}$ encapsulation region (or a second flat portion) 105c4 which directly contacts a top surface (or a surface) of the circuit layer 101 in the second margin area MA2.

The 3-4$^{th}$ encapsulation region 105c4 of the third encapsulation layer 105c or a periphery portion of the third encapsulation layer 105c may directly contact the top surface (or the surface) of the passivation layer 101d in the second margin area MA2, and thus, may seal (or encapsulate) an interface (or a boundary portion) between an end portion (or a vertical sidewall) of the second encapsulation layer 105b and the top surface (or the surface) of the passivation layer 101d. For example, a width of a direct contact portion between the third encapsulation layer 105c and the circuit layer 101 may be 40 to 60 times a width of a direct contact portion between the circuit layer 101 and each of the first encapsulation layer 105a and the second encapsulation layer 105b. For example, when a shortest distance between the center portion of the outermost pixel Po and the outermost surface of the first substrate 100 is 300 μm to 310 μm, a width of a direct contact portion between the third encapsulation layer 105c and the circuit layer 101 may have a width of 90 μm to 120 μm, but is not limited thereto.

Subsequently, as illustrated in FIG. 12H, through a pad open process performed on the first substrate 100 where the encapsulation layer 105 is formed, a pad open hole POH exposing the first pad 111 of the first pad part 110 may be formed by selectively removing the passivation layer 101d over the first pad part 110.

Additionally, the display apparatus according to an embodiment of the present disclosure may further include a secondary pad 113 illustrated in FIG. 11. In this case, after the pad open process, the secondary pad 113 may be implemented or configured to be electrically and directly connected to the first pad 111 of the first pad part 110 through the pad open hole POH. For example, after a pad open process, a substrate polishing process, and a substrate chamfering process, the secondary pad 113 may be implemented by a metal pattern forming process which does not use a photo process and an etching process and may be formed by a metal pattern forming process described above with reference to FIG. 11, and thus, their repeated description are omitted.

Figure 14:
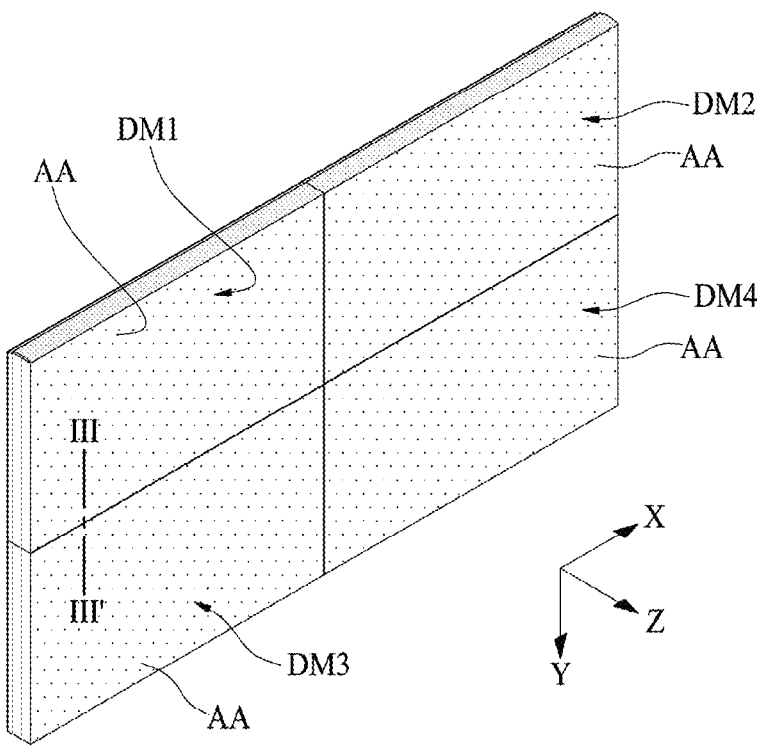
FIG. 14 is a diagram illustrating a multi-screen display apparatus according to an embodiment of the present disclosure.
Figure 15:
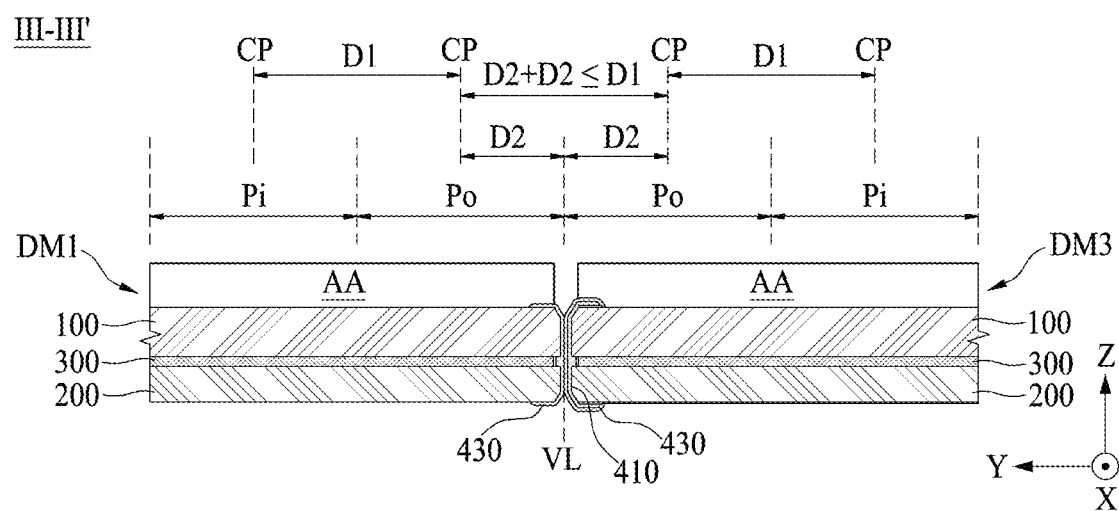
FIG. 15 is a cross-sectional view taken along line illustrated in FIG. 14.

FIG. 14 is a diagram illustrating a multi-screen display apparatus according to an embodiment of the present disclosure, and FIG. 15 is a cross-sectional view taken along line illustrated in FIG. 14. FIGS. 14 and 15 illustrate a multi-screen display apparatus implemented by tiling the display apparatus according to another embodiment of the present disclosure illustrated in FIGS. 1 to 11.

Referring to FIGS. 14 and 15, the multi-screen display apparatus (or a tiling display apparatus) according to an embodiment of the present disclosure may include a plurality of display devices DM1 to DM4.

The plurality of display devices DM1 to DM4 may each display an individual image or may divisionally display one image. Each of the plurality of display devices DM1 to DM4 may include the display apparatus according to an embodiment of the present disclosure illustrated in FIGS. 1 to 11, and thus, their repetitive descriptions are omitted or will be briefly given.

The plurality of display devices DM1 to DM4 may be tiled on a separate tiling frame to contact each other at a lateral surface thereof. For example, the plurality of display devices DM1 to DM4 may be tiled to have an N×M form, thereby implementing a multi-screen display apparatus having a large screen. For example, N is a positive integer of 1 or more and M is a positive integer of 2 or more, but embodiments of the present disclosure are not limited thereto, for example, N is a positive integer of 2 or more and M is a positive integer of 1 or more.

Each of the plurality of display devices DM1 to DM4 may not include a bezel area (or a non-display portion) surrounding all of a display area AA where an image is displayed, and may have an air-bezel structure where the display area AA is surrounded by air. For example, in each of the plurality of display devices DM1 to DM4, all of a first surface of a first substrate 100 may be implemented as the display area AA.

According to the present embodiment, in each of the plurality of display devices DM1 to DM4, a second interval D2 between a center portion CP of an outermost pixel Po and an outermost outer surface OS of the first substrate 100 may be implemented to be half or less of a first interval D1 (or a pixel pitch) between adjacent pixels. Accordingly, in two adjacent display devices DM1 to DM4 coupled to (or contacting) each other at lateral surfaces thereof along the first direction X and the second direction Y based on a lateral coupling manner, an interval "D2+D2" between adjacent outermost pixel areas PAo may be equal to or less than the first interval D1 between two adjacent pixels. Referring to FIG. 15, in first and third display devices DM1 and DM3 coupled to (or contacting) each other at lateral surfaces thereof along the second direction Y, the interval "D2+D2" between a center portion CP of an outermost pixel Po of the first display device DM1 and a center portion CP of an outermost pixel Po of the third display device DM3 may be equal to or less than the first interval D1 (or a pixel pitch) between two adjacent pixels disposed in each of the first and third display devices DM1 and DM3.

Therefore, the interval "D2+D2" between center portions CP of outermost pixels Po of two adjacent display devices DM1 to DM4 coupled to (or contacting) each other at lateral surfaces thereof along the first direction X and the second direction Y may be equal to or less than the first interval D1 between two adjacent pixels disposed in each of the display devices DM1 to DM4, and thus, there may be no seam or boundary portion between two adjacent display devices DM1 to DM4, whereby there may be no dark area caused by a boundary portion provided between the display devices DM1 to DM4. As a result, each of the plurality of display devices DM1, DM2, DM3, and DM4 may have an air bezel structure which has a zero bezel or where a bezel area is not provided as illustrated in FIGS. 1 to 11, and thus, the image displayed on the multi-screen display apparatus in which the plurality of display devices DM1, DM2, DM3, and DM4 are tiled in an N×M form may be displayed continuously without a sense of disconnection (or discontinuity) at boundary portion between the plurality of display devices DM1, DM2, DM3, and DM4.

In FIGS. 14 and 15, it is illustrated that the plurality of display devices DM1 to DM4 are tiled in a 2×2 form, but embodiments of the present disclosure are not limited thereto, and the plurality of display devices DM1 to DM4 may be tiled in an x×1 form, a 1×y form, or an x×y form. For example, x and y may be two or more natural numbers equal to or different from each other. For example, x may be two or more natural numbers or equal to y. y may be two or more natural numbers or greater or less than x.

As described above, when display area AA of each of the plurality of display devices DM1 to DM4 is one screen and displays one image, a multi-screen display apparatus according to an embodiment of the present disclosure may display an image which is not disconnected and is continuous at a boundary portion between the plurality of display devices DM1 to DM4, and thus, the immersion of a viewer watching an image displayed by the multi-screen display apparatus may be enhanced.

A display apparatus and multi-screen display apparatus including the same according to an embodiment of the present disclosure will be described below.

A display apparatus according to an embodiment of the present disclosure may comprise a display area including a plurality of pixels arranged over a first substrate along a first direction and a second direction crossing the first direction, a circuit layer disposed in the display area and configured to include a plurality of pixel driving lines coupled to the plurality of pixels, a planarization layer covering the circuit layer, a light emitting device layer disposed over the planarization layer, a first encapsulation layer wholly covering the light emitting device layer and directly contacting an uppermost surface of the circuit layer, a second encapsulation layer wholly covering the first encapsulation layer and directly contacting the uppermost surface of the circuit layer, and a third encapsulation layer wholly covering the second encapsulation layer and directly contacting the uppermost surface of the circuit layer.

According to some embodiments of the present disclosure, the circuit layer may comprise a circuit array layer including the plurality of pixel driving lines, and a passivation layer covering the circuit array layer, and an end of each of the first encapsulation layer, the second encapsulation layer, and the third encapsulation layer may directly contact an uppermost surface of the passivation layer.

According to some embodiments of the present disclosure, the first encapsulation layer may seal an interface between an end portion of the light emitting device layer and the uppermost surface of the circuit layer, the second encapsulation layer may seal an interface between an end portion of the first encapsulation layer and the uppermost surface of the circuit layer, and the third encapsulation layer may seal an interface between an end portion of the second encapsulation layer and the uppermost surface of the circuit layer.

According to some embodiments of the present disclosure, a width of a direct contact portion between the third encapsulation layer and an uppermost surface of the circuit layer may be several tens times greater than a width of a direct contact portion between the first encapsulation layer and the uppermost surface of the circuit layer.

According to some embodiments of the present disclosure, a periphery portion of the second encapsulation layer may comprise a flat surface parallel to the first direction or the second direction, and a vertical sidewall parallel to a thickness direction of the first substrate.

According to some embodiments of the present disclosure, the first encapsulation layer may comprise an uneven portion corresponding to an uneven shape on the light emitting device layer, a first inclined portion inclined from the uneven portion to the circuit layer, and a first edge portion extending from the first inclined portion and directly contacting the uppermost surface of the circuit layer, and the second encapsulation layer may comprise a first flat portion covering the uneven portion of the first encapsulation layer, a second inclined portion covering the first inclined portion of the first encapsulation layer, and a second edge portion covering the first edge portion of the first encapsulation layer and directly contacting the uppermost surface of the circuit layer.

According to some embodiments of the present disclosure, a minimum thickness of the second edge portion may be thinner than a minimum thickness of the first flat portion and may be thicker than a minimum thickness of the first inclined portion.

According to some embodiments of the present disclosure, the third encapsulation layer may comprise a second flat portion covering the first flat portion of the second encapsulation layer, a third inclined portion covering the second inclined portion of the second encapsulation layer, a step portion covering the second edge portion of the second encapsulation layer, and a third edge portion extending from the step portion and directly contacting the uppermost surface of the circuit layer.

According to some embodiments of the present disclosure, a width of a direct contact portion between the third edge portion and the uppermost surface of the circuit layer may be several tens times greater than a width of a direct contact portion between the first encapsulation layer and the uppermost surface of the circuit layer.

According to some embodiments of the present disclosure, the display apparatus may further comprise a first pad part disposed at a periphery portion of the first substrate and electrically coupled to the plurality of pixel driving lines, a second substrate coupled to the first substrate by a coupling member and including a second pad part to overlap the first pad part, and a routing portion covering an outer surface of the first substrate and an outer surface of the second substrate and including a plurality of routing lines electrically coupled to the first pad part and the second pad part in a one-to-one relationship.

According to some embodiments of the present disclosure, a shortest distance between a center portion of an outermost pixel of the plurality of pixels and an outermost surface of the first substrate may be 300 μm to 310 μm, a shortest distance between the first pad part and an end of the third encapsulation layer may at least 10 μm, and a shortest distance between the first pad part and an end portion of the second encapsulation layer may be 100 μm to 110 μm.

According to some embodiments of the present disclosure, the display apparatus may further comprise an edge coating layer covering the outer surface of the first substrate, the outer surface of the second substrate, and the plurality of routing lines.

According to some embodiments of the present disclosure, a first outer surface of each of the first and second substrates may comprise the plurality of routing lines and the edge coating layer, and second to fourth outer surfaces, other than the first outer surface, of each of the first and second substrates may comprise only the edge coating layer.

According to some embodiments of the present disclosure, the display apparatus may further comprise a first pad part disposed at a periphery portion of the first substrate and electrically coupled to the plurality of pixel driving lines, the first pad part may comprise a plurality of first pads disposed in the circuit layer and electrically coupled to each of the plurality of pixel driving lines, and a plurality of secondary pads disposed over the circuit layer and covering each of the plurality of first pads.

According to some embodiments of the present disclosure, the display apparatus may further comprise a second substrate coupled to the first substrate by a coupling member and configured to include a second pad part having a plurality of second pads overlapping each of the plurality of first pads, and a routing portion covering an outer surface of the first substrate and an outer surface of the second substrate and including a plurality of routing lines electrically coupled to each of the plurality of secondary pads and the plurality of second pads in a one-to-one relationship.

According to some embodiments of the present disclosure, each of the plurality of secondary pads may be directly coupled to a corresponding first pad and has a length which is longer than the corresponding first pad along the second direction.

According to some embodiments of the present disclosure, the first pad part may be configured to disposed within an outmost pixel of the plurality of pixels.

According to some embodiments of the present disclosure, a size of the display area may be the same as a size of the first substrate.

A multi-screen display apparatus according to an embodiments of the present disclosure may comprise a plurality of display devices disposed along at least one direction of a first direction and a second direction crossing the first direction, each of the plurality of display devices comprises the display apparatus, the display apparatus may comprise a display area including a plurality of pixels arranged over a first substrate along the first direction and the second direction crossing the first direction, a circuit layer disposed in the display area and configured to include a plurality of pixel driving lines coupled to the plurality of pixels, a planarization layer covering the circuit layer, a light emitting device layer disposed over the planarization layer, a first encapsulation layer wholly or fully covering the light emitting device layer and directly contacting an uppermost surface of the circuit layer, a second encapsulation layer wholly or fully covering the first encapsulation layer and directly contacting the uppermost surface of the circuit layer, and a third encapsulation layer wholly or fully covering the second encapsulation layer and directly contacting the uppermost surface of the circuit layer.

According to some embodiments of the present disclosure, in a first display device and a second display device adjacent along the first direction and the second direction, a distance between a center portion of an outermost pixel of the first display device and a center portion of an outermost pixel of the second display device may be less than or equal to a pixel pitch, and the pixel pitch may be a distance between center portions of pixels adjacent along the first direction and the second direction.

The display apparatus according to an embodiment of the present disclosure may be applied to all electronic devices including a display panel. For example, the display apparatus according to an embodiment of the present disclosure may be applied to mobile apparatuses, video phones, smart watches, watch phones, wearable apparatuses, foldable apparatuses, rollable apparatuses, bendable apparatuses, flexible apparatuses, curved apparatuses, electronic organizers, electronic books, portable multimedia players (PMPs), personal digital assistants (PDAs), MP3 players, mobile medical apparatuses, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, home appliances, etc.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A display apparatus comprising:
a display area including a plurality of pixels arranged over a first substrate along a first direction and a second direction different from the first direction;
a circuit layer disposed in the display area and configured to include a plurality of pixel driving lines coupled to the plurality of pixels;
a planarization layer covering the circuit layer;
a light emitting device layer disposed over the planarization layer;
a first encapsulation layer fully covering the light emitting device layer and directly contacting an uppermost surface of the circuit layer;
a second encapsulation layer fully covering the first encapsulation layer and directly contacting the uppermost surface of the circuit layer; and
a third encapsulation layer fully covering the second encapsulation layer and directly contacting the uppermost surface of the circuit layer,
wherein the third encapsulation layer seals an interface between an end portion of the second encapsulation layer and the uppermost surface of the circuit layer.
2. The display apparatus of claim 1,
wherein the circuit layer comprises:
a circuit array layer including the plurality of pixel driving lines; and
a passivation layer covering the circuit array layer, and
wherein an end of each of the first encapsulation layer, the second encapsulation layer, and the third encapsulation layer directly contacts an uppermost surface of the passivation layer.

3. The display apparatus of claim 1,
wherein the first encapsulation layer seals an interface between an end portion of the light emitting device layer and the uppermost surface of the circuit layer,
wherein the second encapsulation layer seals an interface between an end portion of the first encapsulation layer and the uppermost surface of the circuit layer,
wherein the first encapsulation layer and the third encapsulation layer comprise an inorganic material, and
wherein the second encapsulation layer comprises an organic material.

4. The display apparatus of claim 1, wherein a width of a direct contact portion between the third encapsulation layer and the uppermost surface of the circuit layer is several tens times greater than a width of a direct contact portion between the first encapsulation layer and the uppermost surface of the circuit layer.

5. The display apparatus of claim 1, wherein a periphery portion of the second encapsulation layer comprises:
a flat surface parallel to the first direction or the second direction, and
a vertical sidewall parallel to a thickness direction of the first substrate.

6. The display apparatus of claim 1,
wherein the first encapsulation layer comprises an uneven portion corresponding to an uneven shape on the light emitting device layer, a first inclined portion inclined from the uneven portion to the circuit layer, and a first edge portion extending from the first inclined portion and directly contacting an uppermost surface of the circuit layer, and
wherein the second encapsulation layer comprises a first flat portion covering the uneven portion of the first encapsulation layer, a second inclined portion covering the first inclined portion of the first encapsulation layer, and a second edge portion covering the first edge portion of the first encapsulation layer and directly contacting the uppermost surface of the circuit layer.

7. The display apparatus of claim 6, wherein a minimum thickness of the second edge portion is thinner than a minimum thickness of the first flat portion and is thicker than a minimum thickness of the first inclined portion.

8. The display apparatus of claim 6, wherein the third encapsulation layer comprises:
a second flat portion covering the first flat portion of the second encapsulation layer,
a third inclined portion covering the second inclined portion of the second encapsulation layer,
a step portion covering the second edge portion of the second encapsulation layer, and
a third edge portion extending from the step portion and directly contacting the uppermost surface of the circuit layer.

9. The display apparatus of claim 8, wherein a width of a direct contact portion between the third edge portion and the uppermost surface of the circuit layer is several tens times greater than a width of a direct contact portion between the first encapsulation layer and the uppermost surface of the circuit layer.

10. The display apparatus of claim 1, further comprising:
a first pad part disposed at a periphery portion of the first substrate and electrically coupled to the plurality of pixel driving lines;
a second substrate coupled to the first substrate by a coupling member and including a second pad part to overlap the first pad part; and
a routing portion covering an outer surface of the first substrate and an outer surface of the second substrate and including a plurality of routing lines electrically coupled to the first pad part and the second pad part in a one-to-one relationship.

11. The display apparatus of claim 10,
wherein a shortest distance between a center portion of an outermost pixel of the plurality of pixels and an outermost surface of the first substrate is 300 μm to 310 μm,
wherein a shortest distance between the first pad part and an end of the third encapsulation layer is at least 10 μm, and
wherein a shortest distance between the first pad part and an end portion of the second encapsulation layer is 100 μm to 110 μm.

12. The display apparatus of claim 10, further comprising an edge coating layer covering the outer surface of the first substrate, the outer surface of the second substrate, and the plurality of routing lines.

13. The display apparatus of claim 12,
wherein a first outer surface of each of the first and second substrates comprises the plurality of routing lines and the edge coating layer, and
wherein second to fourth outer surfaces, other than the first outer surface, of each of the first and second substrates comprise only the edge coating layer.

14. The display apparatus of claim 1, further comprising a first pad part disposed at a periphery portion of the first substrate and electrically coupled to the plurality of pixel driving lines,
wherein the first pad part comprises:
a plurality of first pads disposed in the circuit layer and electrically coupled to each of the plurality of pixel driving lines; and
a plurality of secondary pads disposed over the circuit layer and covering each of the plurality of first pads.

15. The display apparatus of claim 14, further comprising:
a second substrate coupled to the first substrate by a coupling member and configured to include a second pad part having a plurality of second pads overlapping each of the plurality of first pads; and
a routing portion covering an outer surface of the first substrate and an outer surface of the second substrate and including a plurality of routing lines electrically coupled to each of the plurality of secondary pads and the plurality of second pads in a one-to-one relationship.

16. The display apparatus of claim 14, wherein each of the plurality of secondary pads is directly coupled to a corresponding first pad and has a length which is longer than the corresponding first pad along the second direction.

17. The display apparatus of claim 10, wherein the first pad part is configured to disposed within an outmost pixel of the plurality of pixels.

18. The display apparatus of claim 1, wherein a size of the display area is the same as a size of the first substrate.

19. A multi-screen display apparatus comprising:
a plurality of display devices disposed along at least one direction of a first direction and a second direction crossing the first direction,
wherein each of the plurality of display devices comprises the display apparatus of claim 1.

20. The multi-screen display apparatus of claim 19,
wherein in a first display device and a second display device adjacent along the first direction and the second direction, a distance between a center portion of an outermost pixel of the first display device and a center portion of an outermost pixel of the second display device is less than or equal to a pixel pitch, and wherein the pixel pitch is a distance between center portions of pixels adjacent along each of the first direction and the second direction.

\* \* \* \* \*